US012642073B2

(12) United States Patent
Lee et al.

(10) Patent No.: US 12,642,073 B2
(45) Date of Patent: May 26, 2026

(54) SEMICONDUCTOR DEVICE

(71) Applicant: SAMSUNG ELECTRONICS CO., LTD., Suwon-si (KR)

(72) Inventors: Jongjin Lee, Suwon-si (KR); Eun-Ji Jung, Suwon-si (KR); Hobin Jung, Suwon-si (KR); Hyun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 611 days.

(21) Appl. No.: 18/086,340

(22) Filed: Dec. 21, 2022

(65) Prior Publication Data

US 2023/0326848 A1      Oct. 12, 2023

(30) Foreign Application Priority Data

Apr. 8, 2022    (KR) ........................ 10-2022-0043979

(51) Int. Cl.
| | |
|---|---|
| *H01L 23/522* | (2006.01) |
| *H01L 21/768* | (2006.01) |
(Continued)

(52) U.S. Cl.
CPC .... *H01L 23/5226* (2013.01); *H01L 21/76846* (2013.01); *H01L 21/76849* (2013.01);
(Continued)

(58) Field of Classification Search
CPC ............. H01L 23/5226; H01L 23/5283; H01L 23/53238; H01L 23/53252;
(Continued)

(56) References Cited

U.S. PATENT DOCUMENTS

| | | | |
|---|---|---|---|
| 6,265,779 | B1 | 7/2001 | Grill et al. |
| 9,677,172 | B2 | 6/2017 | Ha et al. |

(Continued)

FOREIGN PATENT DOCUMENTS

| | | |
|---|---|---|
| KR | 10-2016-0131751 A | 11/2016 |
| KR | 10-2016-0148153 A | 12/2016 |

(Continued)

*Primary Examiner* — Dao H Nguyen
(74) *Attorney, Agent, or Firm* — Sughrue Mion, PLLC

(57) ABSTRACT

Provided is a semiconductor device including a substrate including an active region, transistors on the substrate, a first interlayer insulating layer and a second interlayer insulating layer on the transistors, a first interconnection line in an upper portion of the first interlayer insulating layer, and a second interconnection line in the second interlayer insulating layer, wherein the first interconnection line includes a first barrier pattern, a first liner, and a first conductive pattern, wherein the second interconnection line includes a second barrier pattern, a second liner, and a second conductive pattern, wherein first height between an uppermost portion of a top surface of the first conductive pattern and a lowermost portion of a top surface of the first liner is greater than a second height between an uppermost portion of a top surface of the second conductive pattern and a lowermost portion of a top surface of the second liner.

20 Claims, 44 Drawing Sheets

(51) Int. Cl.

| | |
|---|---|
| *H01L 23/528* | (2006.01) |
| *H01L 23/532* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2026.01) |
| *H10D 84/03* | (2025.01) |
| *H10D 84/85* | (2025.01) |

(52) U.S. Cl.
CPC .... *H01L 21/76877* (2013.01); *H01L 23/5283* (2013.01); *H01L 23/53238* (2013.01); *H10D 30/014* (2025.01); *H10D 30/43* (2025.01); *H10D 30/6735* (2025.01); *H10D 62/121* (2025.01); *H10D 84/0167* (2025.01); *H10D 84/0186* (2025.01); *H10D 84/038* (2025.01); *H10D 84/85* (2025.01)

(58) Field of Classification Search
CPC ......... H01L 23/53266; H01L 23/53261; H01L 21/76846; H01L 21/76849; H01L 21/76877; H01L 21/7682; H01L 21/76834; H01L 21/76858; H10D 30/014; H10D 30/43; H10D 30/6735; H10D 30/6757; H10D 30/787; H10D 84/0167; H10D 84/0186; H10D 84/038; H10D 84/85; H10D 84/0184
See application file for complete search history.

(56) References Cited

U.S. PATENT DOCUMENTS

| | | | | |
|---|---|---|---|---|
| 10,115,670 | B2 | 10/2018 | Edelstein et al. | |
| 11,037,872 | B2 * | 6/2021 | Han | H01L 21/76829 |
| 11,164,778 | B2 | 11/2021 | Wang et al. | |
| 2002/0005583 | A1 * | 1/2002 | Harada | H01L 24/05 257/E21.576 |
| 2016/0329242 | A1 * | 11/2016 | Oszinda | H01L 21/76831 |
| 2018/0261546 | A1 * | 9/2018 | Bark | H01L 21/76856 |
| 2019/0051600 | A1 * | 2/2019 | Oh | H01L 21/76832 |
| 2020/0105664 | A1 * | 4/2020 | Han | H01L 23/5226 |
| 2021/0202310 | A1 * | 7/2021 | Hsieh | H01L 21/76846 |
| 2022/0367265 | A1 * | 11/2022 | Hsieh | H01L 21/76882 |

FOREIGN PATENT DOCUMENTS

| | | |
|---|---|---|
| KR | 10-2016-0148453 A | 12/2016 |
| KR | 10-2021-0047405 A | 4/2021 |
| KR | 10-2022-0007984 A | 1/2022 |
| KR | 10-2022-0026627 A | 3/2022 |

* cited by examiner

SEMICONDUCTOR DEVICE

CROSS-REFERENCE TO RELATED APPLICATION

This U.S. non-provisional patent application claims priority to Korean Patent Application No. 10-2022-0043979, filed on Apr. 8, 2022, in the Korean Intellectual Property Office, the entirety of which is hereby incorporated by reference.

BACKGROUND

Embodiments of the present disclosure relate to a semiconductor device and, more particularly, to a semiconductor device including a field effect transistor.

Semiconductor devices may include integrated circuits including metal-oxide-semiconductor field effect transistors (MOSFETs). As sizes and design rules of semiconductor devices have been reduced, MOSFETs have been scaled down. Operating characteristics of semiconductor devices may be deteriorated by reduction in size of MOSFETs. Accordingly, various methods for forming semiconductor devices having excellent performance while overcoming limitations caused by high integration have been studied.

SUMMARY

One or more embodiments may provide a semiconductor device with improved electrical characteristics.

According to an aspect of an embodiment, there is provided a semiconductor device including a substrate including an active region, transistors on the substrate, a first interlayer insulating layer and a second interlayer insulating layer sequentially on the transistors, a first interconnection line in an upper portion of the first interlayer insulating layer, and a second interconnection line in the second interlayer insulating layer and electrically connected to the first interconnection line, wherein the first interconnection line includes a first barrier pattern, a first liner on the first barrier pattern, and a first conductive pattern on the first liner, wherein the second interconnection line includes a second barrier pattern, a second liner on the second barrier pattern, and a second conductive pattern on the second liner, wherein the first liner includes a ruthenium cobalt (RuCo) compound, and the second liner includes cobalt (Co), wherein a first height between an uppermost portion of a top surface of the first conductive pattern and a lowermost portion of a top surface of the first liner is greater than a second height between an uppermost portion of a top surface of the second conductive pattern and a lowermost portion of a top surface of the second liner.

According to an aspect of an embodiment, there is provided a semiconductor device including a substrate, transistors on the substrate, a first interlayer insulating layer on the transistors, and a first metal layer in the first interlayer insulating layer, wherein the first metal layer includes a first interconnection line in an upper portion of the first interlayer insulating layer, wherein the first interconnection line includes a first barrier pattern, a first liner on an inner surface of the first barrier pattern, a first conductive pattern on the first liner, and a first capping pattern on a top surface of the first conductive pattern and on a top surface of the first liner, wherein the first liner includes a ruthenium cobalt (RuCo) compound, wherein the top surface of the first liner is at a lower level than a top surface of the first barrier pattern, wherein a ratio of a first height between an uppermost portion of the top surface of the first conductive pattern and a lowermost portion of the top surface of the first liner to a height of the first interconnection line ranges from 1% to 5%.

According to another aspect of an embodiment, there is provided a semiconductor device including a substrate including an active region, a device isolation layer forming an active pattern on the active region, a source pattern and a drain pattern on the active pattern, a channel pattern connected to the source pattern and the drain pattern on the active pattern, the channel pattern including a first semiconductor pattern, a second semiconductor pattern and a third semiconductor pattern sequentially stacked and spaced apart from each other, a gate electrode intersecting the channel pattern and extending in a first direction, a gate insulating layer between the channel pattern and the gate electrode, a gate spacer on a sidewall of the gate electrode, a gate capping pattern on a top surface of the gate electrode, a first interlayer insulating layer on the gate capping pattern, an active contact penetrating the first interlayer insulating layer and connected to the source pattern and the drain pattern, a gate contact penetrating the first interlayer insulating layer and the gate capping pattern and connected to the gate electrode, a second interlayer insulating layer on the first interlayer insulating layer, a first metal layer provided in the second interlayer insulating layer, the first metal layer including a first interconnection line electrically connected to at least one of the active contact or the gate contact, a third interlayer insulating layer on the second interlayer insulating layer, and a second metal layer in the third interlayer insulating layer, wherein the second metal layer includes a second interconnection line electrically connected to the first metal layer, wherein the first interconnection line includes a first barrier pattern, a first liner on the first barrier pattern, and a first conductive pattern on the first liner, wherein the second interconnection line includes a second barrier pattern, a second liner on the second barrier pattern, and a second conductive pattern on the second liner, wherein the first liner includes a ruthenium cobalt (RuCo) compound, and the second liner includes cobalt (Co), and wherein a first height between an uppermost portion of a top surface of the first conductive pattern and a lowermost portion of a top surface of the first liner is a first height is less than a second height between an uppermost portion of a top surface of the second conductive pattern and a lowermost portion of a top surface of the second liner.

BRIEF DESCRIPTION OF THE DRAWINGS

The above and other objects and features of the present disclosure will become apparent by describing in detail embodiments thereof with reference to the accompanying drawings, in which.

DETAILED DESCRIPTION

Figure 1:
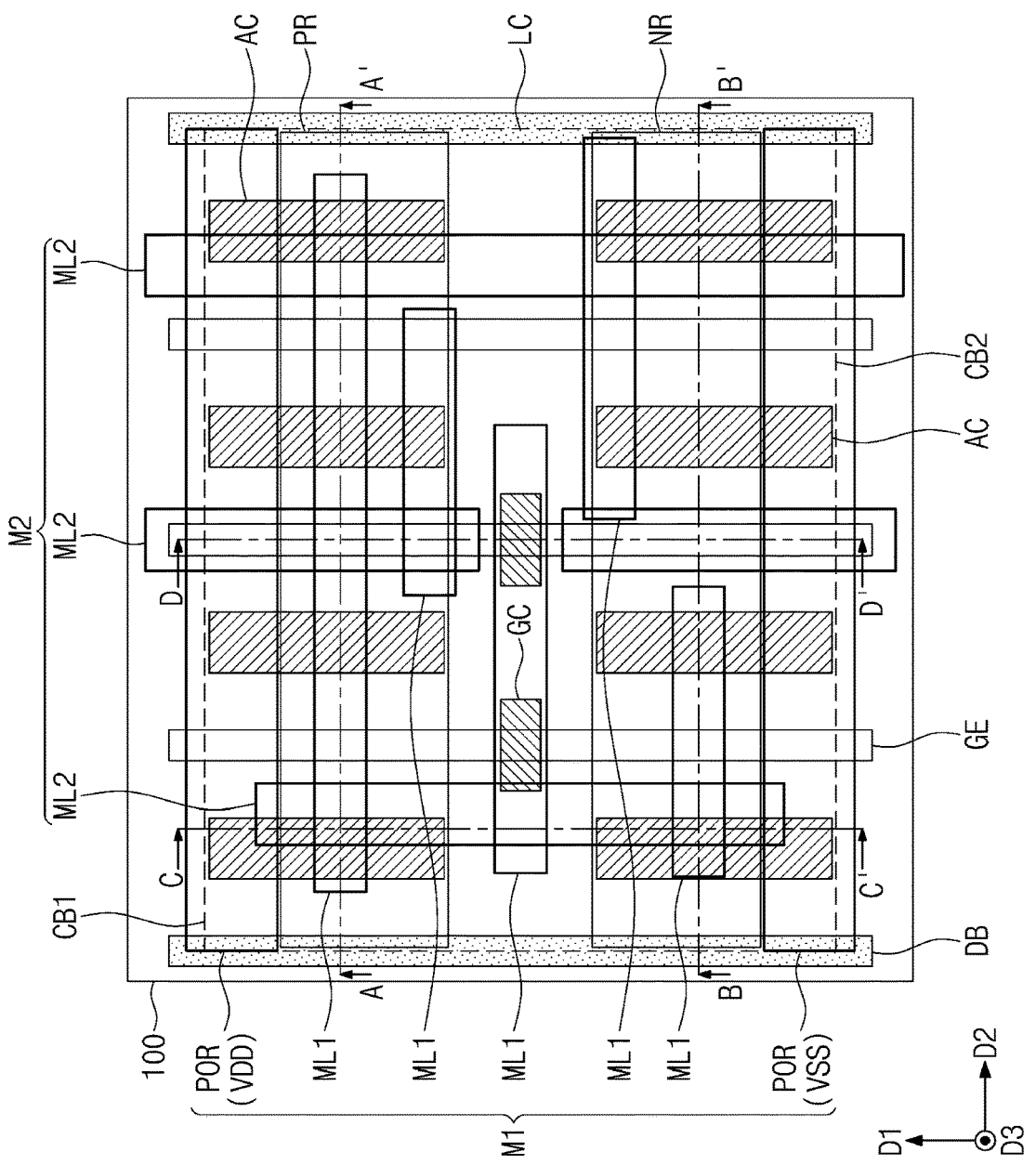
FIG. 1 is a plan view illustrating a semiconductor device according to some embodiments.
Figure 2A:
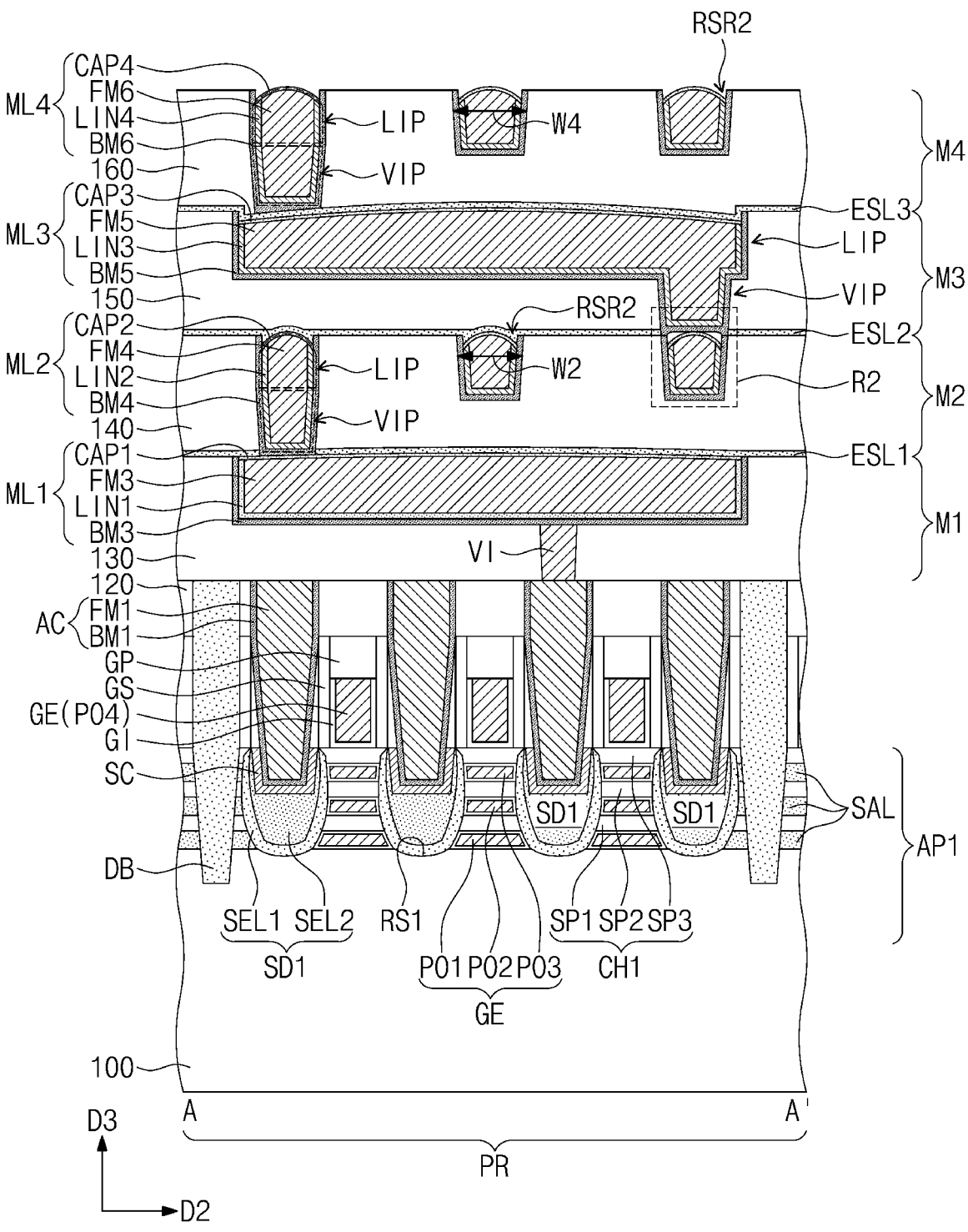
FIGS. 2A, 2B, 2C and 2D are cross-sectional views taken along lines A-A', B-B', C-C' and D-D' of FIG. 1, respectively.
Figure 2B:
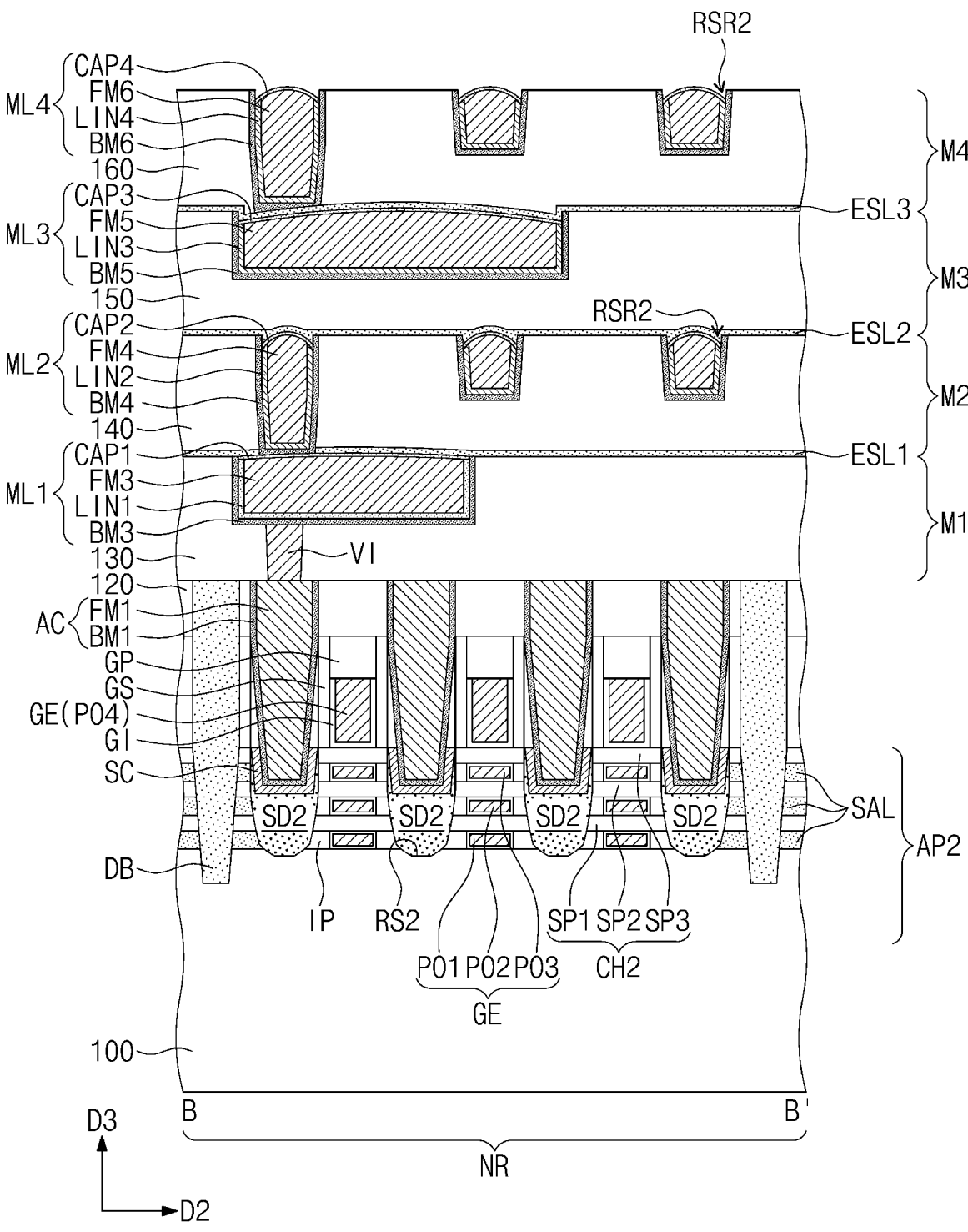
Figure 2C:
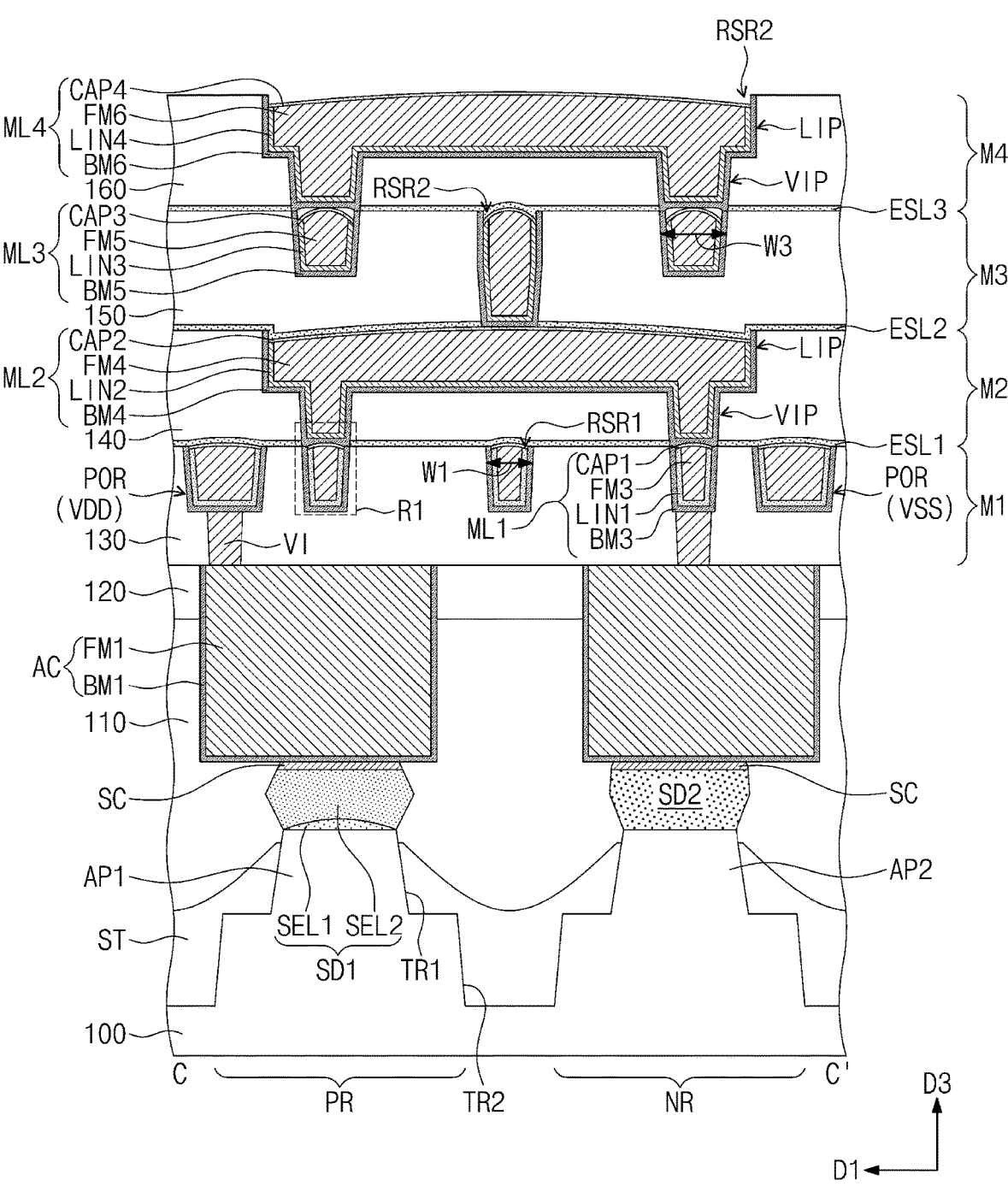
Figure 2D:
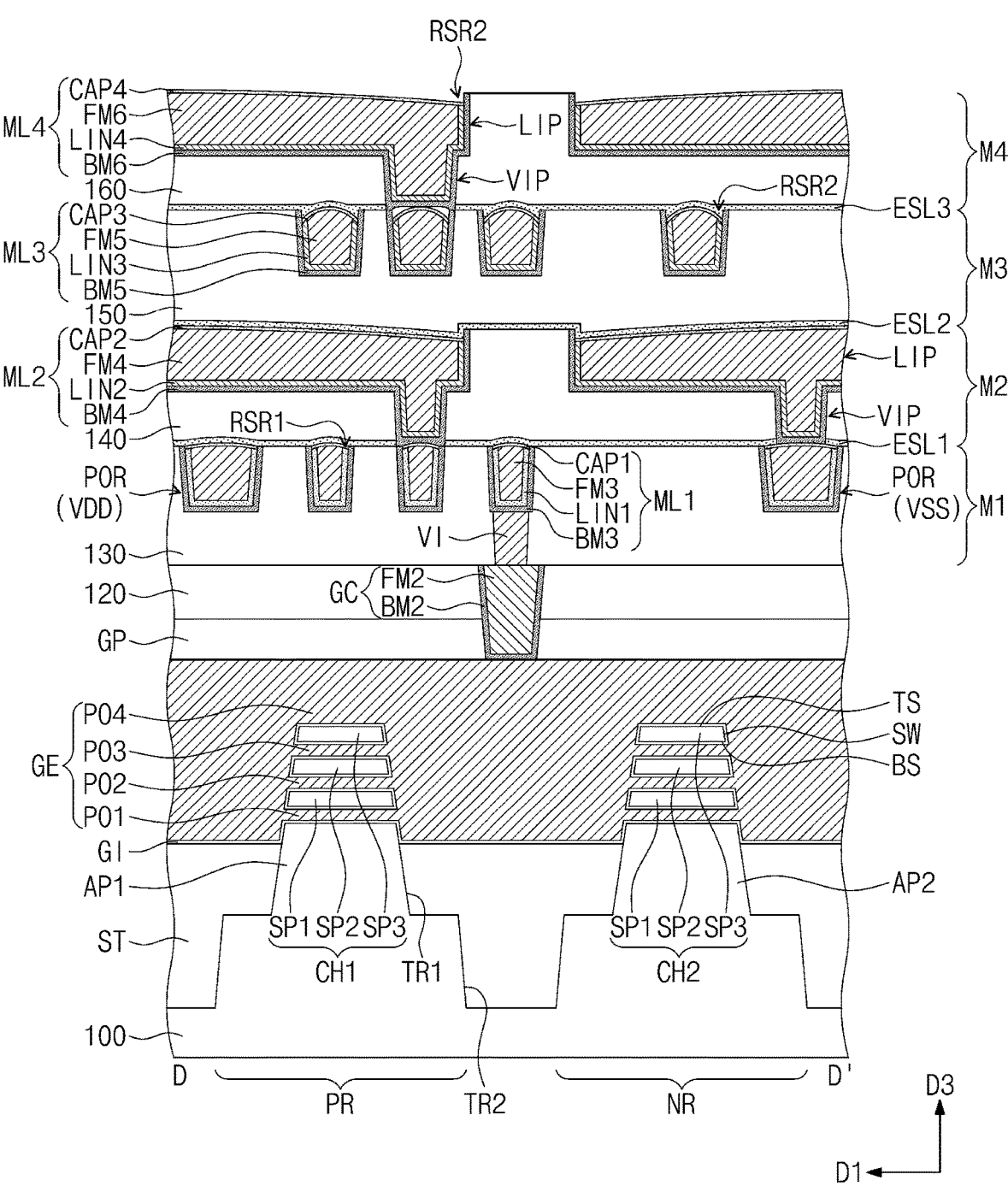

The following will now describe some embodiments of the present inventive concepts with reference to the accompanying drawings. Like reference numerals may indicate like components throughout the description. Embodiments described herein are example embodiments, and thus, the disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 3A:
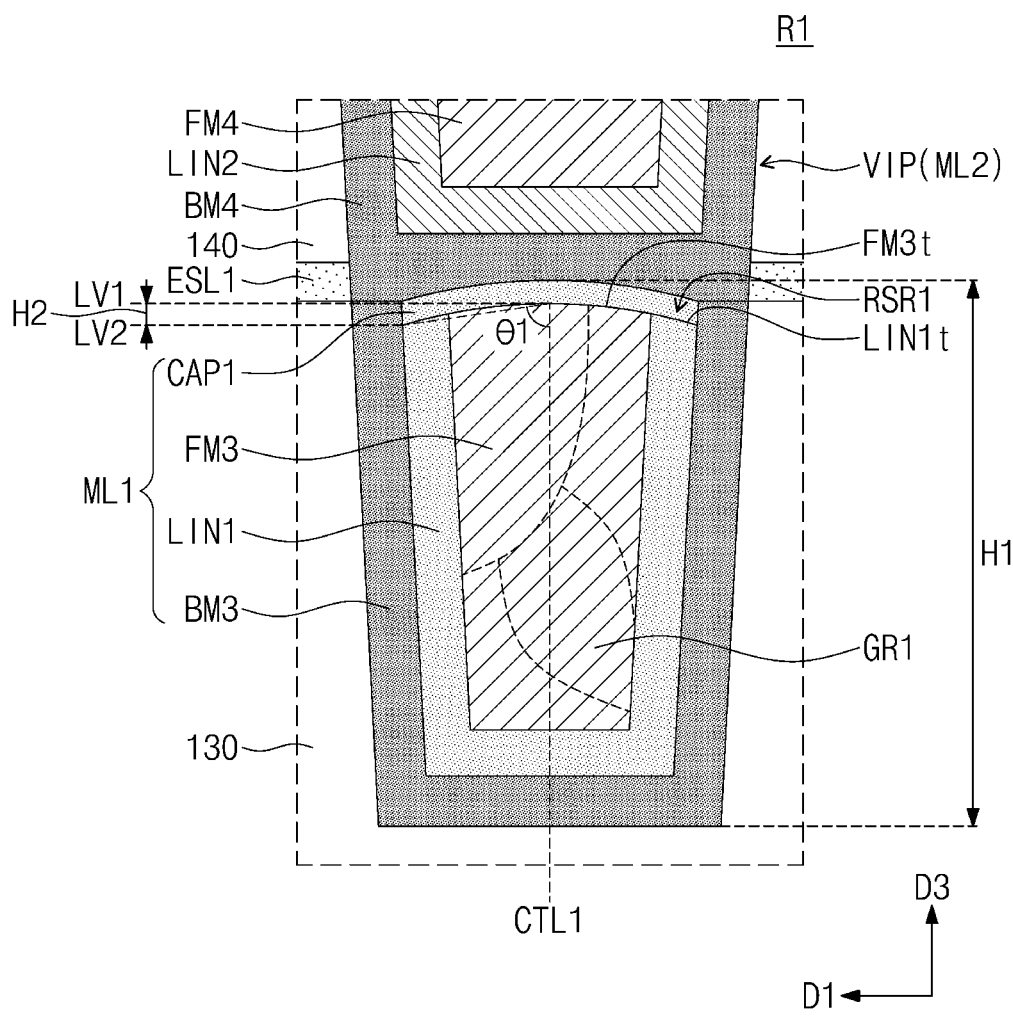
FIG. 3A is an enlarged cross-sectional view of a region 'R1' of FIG. 2C.
Figure 3B:
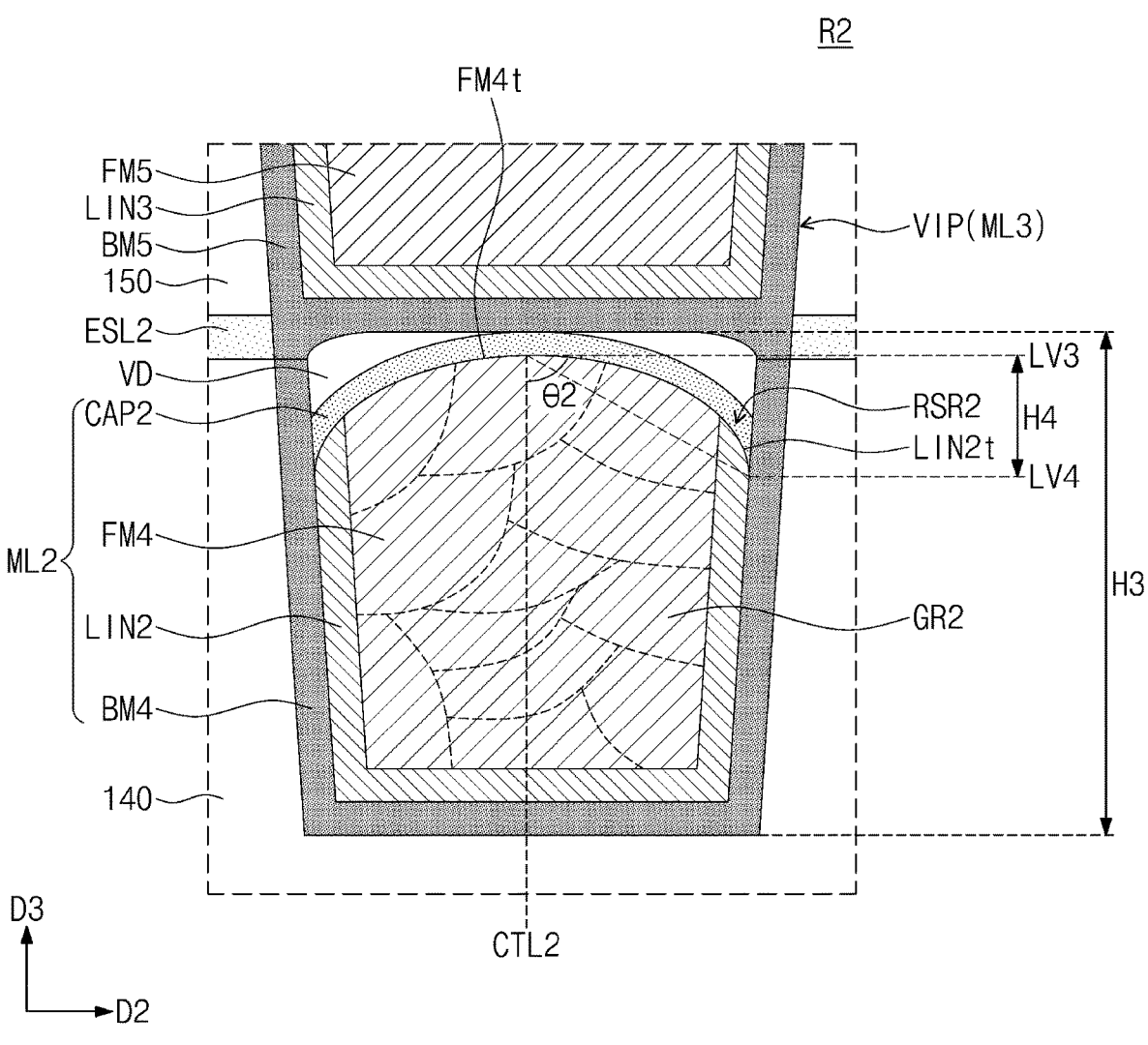
FIG. 3B is an enlarged cross-sectional view of a region 'R2' of FIG. 2A.

FIG. 1 is a plan view illustrating a semiconductor device according to some embodiments. FIGS. 2A, 2B, 2C and 2D are cross-sectional views taken along lines A-A', B-B', C-C' and D-D' of FIG. 1, respectively. FIG. 3A is an enlarged cross-sectional view of a region 'R1' of FIG. 2C. FIG. 3B is an enlarged cross-sectional view of a region 'R2' of FIG. 2A.

Referring to FIGS. 1 and 2A to 2D, a logic cell LC may be provided on a substrate 100. In the present specification, the logic cell LC may be a logic element (e.g., an inverter, a flip-flop, etc.) configured to perform a specific function. For example, the logic cell LC may include transistors and interconnection lines connecting the transistors to each other, which constitute the logic element.

The substrate 100 may include a first active region PR and a second active region NR. In some embodiments, the first active region PR may be a PMOSFET region, and the second active region NR may be an NMOSFET region. The substrate 100 may be a semiconductor substrate including silicon, germanium or silicon-germanium, or a compound semiconductor substrate. For example, the substrate 100 may be a silicon substrate.

The first active region PR and the second active region NR may be defined by a second trench TR2 formed in an upper portion of the substrate 100. The second trench TR2 may be disposed between the first active region PR and the second active region NR. The first active region PR and the second active region NR may be spaced apart from each other in a first direction D1 with the second trench TR2 interposed therebetween. Each of the first and second active regions PR and NR may extend in a second direction D2 intersecting the first direction D1.

A first active pattern AP1 and a second active pattern AP2 may be defined by a first trench TR1 formed in the upper portion of the substrate 100. The first active pattern AP1 and the second active pattern AP2 may be provided on the first active region PR and the second active region NR, respectively. The first trench TR1 may be shallower than the second trench TR2. The first and second active patterns AP1 and AP2 may extend in the second direction D2. The first and second active patterns AP1 and AP2 may be portions of the substrate 100, which vertically protrude.

A device isolation layer ST may fill the first and second trenches TR1 and TR2. The device isolation layer ST may include a silicon oxide layer. Upper portions of the first and second active patterns AP1 and AP2 may vertically protrude above the device isolation layer ST (see FIG. 2D).

A first channel pattern CH1 may be provided on the first active pattern AP1. A second channel pattern CH2 may be provided on the second active pattern AP2. Each of the first channel pattern CH1 and the second channel pattern CH2 may include a first semiconductor pattern SP1, a second semiconductor pattern SP2 and a third semiconductor pattern SP3, which are sequentially stacked. The first to third semiconductor patterns SP1, SP2 and SP3 may be spaced apart from each other in a vertical direction (i.e., a third direction D3).

Each of the first to third semiconductor patterns SP1, SP2 and SP3 may include silicon (Si), germanium (Ge), or silicon-germanium (SiGe). For example, each of the first to third semiconductor patterns SP1, SP2 and SP3 may include crystalline silicon.

A plurality of first recesses RS1 may be formed on the first active pattern AP1. First source/drain patterns (source pattern and drain pattern) SD1 may be provided in the first recesses RS1, respectively. The first source/drain patterns SD1 may be dopant regions having a first conductivity type (e.g., a p-type). The first channel pattern CH1 may be disposed between a pair of the first source/drain patterns SD1. For example, the first to third semiconductor patterns SP1, SP2 and SP3 stacked sequentially may connect the pair of first source/drain patterns SD1 to each other.

A plurality of second recesses RS2 may be formed on the second active pattern AP2. Second source/drain patterns (source pattern and drain pattern) SD2 may be provided in the second recesses RS2, respectively. The second source/drain patterns SD2 may be dopant regions having a second conductivity type (e.g., an n-type). The second channel pattern CH2 may be disposed between a pair of the second source/drain patterns SD2. For example, the first to third semiconductor patterns SP1, SP2 and SP3 stacked sequentially may connect the pair of second source/drain patterns SD2 to each other.

The first and second source/drain patterns SD1 and SD2 may be epitaxial patterns formed by a selective epitaxial growth (SEG) process. For example, a top surface of each of the first and second source/drain patterns SD1 and SD2 may be located at substantially the same level as a top surface of the third semiconductor pattern SP3. According to another embodiment, the top surface of each of the first and second source/drain patterns SD1 and SD2 may be higher than the top surface of the third semiconductor pattern SP3 in the third direction D3.

The first source/drain patterns SD1 may include a semiconductor element (e.g., SiGe) of which a lattice constant is greater than a lattice constant of a semiconductor element of the substrate 100. Thus, the pair of first source/drain patterns SD1 may provide compressive stress to the first channel pattern CH1 therebetween. The second source/drain patterns SD2 may include the same semiconductor element (e.g., Si) as the substrate 100.

Each of the first source/drain patterns SD1 may include a first semiconductor layer SEL1 and a second semiconductor layer SEL2 on the first semiconductor layer SEL1.

The first semiconductor layer SEL1 may be provided on and cover an inner surface of the first recess RS1. A thickness of the first semiconductor layer SEL1 may become continuously smaller from its lower portion toward its upper portion. For example, a thickness, in the third direction D3, of the first semiconductor layer SEL1 on a bottom of the first recess RS1 may be greater than a thickness, in the second direction D2, of the first semiconductor layer SEL1 on an inner sidewall of an upper portion of the first recess RS1. The first semiconductor layer SEL1 may have a U-shape along a profile of the inner surface of the first recess RS1.

The second semiconductor layer SEL2 may fill a remaining region of the first recess RS1 except the first semiconductor layer SEL1. A volume of the second semiconductor layer SEL2 may be greater than a volume of the first semiconductor layer SEL1.

Each of the first semiconductor layer SEL1 and the second semiconductor layer SEL2 may include silicon-germanium (SiGe). For example, the first semiconductor layer SEL1 may contain a relatively low concentration of germanium (Ge). In certain embodiments, the first semiconductor layer SEL1 may contain silicon (Si) except germanium (Ge). A concentration of germanium (Ge) of the first semiconductor layer SEL1 may range from 0 at % to 10 at %.

The second semiconductor layer SEL2 may contain a relatively high concentration of germanium (Ge). For example, a concentration of germanium (Ge) of the second semiconductor layer SEL2 may range from 30 at % to 70 at %. The concentration of germanium (Ge) of the second semiconductor layer SEL2 may increase as a level in the third direction D3 increases. For example, the second semiconductor layer SEL2 adjacent to the first semiconductor layer SEL1 may have a germanium (Ge) concentration of about 40 at %, but an upper portion of the second semiconductor layer SEL2 may have a germanium (Ge) concentration of about 60 at %.

The first and second semiconductor layers SEL1 and SEL2 may include dopants (e.g., boron (B)) capable of allowing the first source/drain pattern SD1 to have the p-type. A concentration (e.g., atomic percent) of the dopants of the second semiconductor layer SEL2 may be greater than a concentration of the dopants of the first semiconductor layer SEL1.

The first semiconductor layer SEL1 may prevent a stacking fault between the substrate 100 and the second semiconductor layer SEL2 and between the second semiconductor layer SEL2 and the first to third semiconductor patterns SP1, SP2 and SP3. When the stacking fault occurs, a channel resistance may be increased. The stacking fault may more easily occur at the bottom of the first recess RS1. Thus, to prevent the stacking fault, the thickness of the first semiconductor layer SEL1 adjacent to the bottom of the first recess RS1 may be relatively large.

The first semiconductor layer SEL1 may protect the second semiconductor layer SEL2 during a process of replacing sacrificial layers SAL with a first portion PO1, a second portion PO2, and a third portion PO3 of a gate electrode GE. For example, the first semiconductor layer SEL1 may prevent an etching material of removing the sacrificial layers SAL from permeating into the second semiconductor layer SEL2 to etch it.

Gate electrodes GE may be provided to intersect the first and second active patterns AP1 and AP2 and to extend in the first direction D1. The gate electrodes GE may be arranged in the second direction D2. Each of the gate electrodes GE may vertically overlap with the first and second channel patterns CH1 and CH2.

The gate electrode GE may include a first portion PO1 disposed between the substrate 100 and the first semiconductor pattern SP1, a second portion PO2 disposed between the first semiconductor pattern SP1 and the second semiconductor pattern SP2, a third portion PO3 disposed between the second semiconductor pattern SP2 and the third semiconductor pattern SP3, and a fourth portion PO4 on the third semiconductor pattern SP3.

Referring again to FIG. 2A, the first to third portions PO1, PO2 and PO3 of the gate electrode GE on the first active region PR may have different widths in the second direction D2. For example, a maximum width of the third portion PO3 in the second direction D2 may be greater than a maximum width of the second portion PO2 in the second direction D2. A maximum width of the first portion PO1 in the second direction D2 may be greater than the maximum width of the third portion PO3 in the second direction D2.

Referring again to FIG. 2D, the gate electrode GE may be provided on a top surface TS, a bottom surface BS and both sidewalls SW of each of the first to third semiconductor patterns SP1, SP2 and SP3. For example, a logic transistor according to the embodiments may be a three-dimensional field effect transistor (e.g., a MBCFET) in which the gate electrode GE three-dimensionally surrounds a channel.

Referring again to FIGS. 1 and 2A to 2D, a pair of gate spacers GS may be disposed on both sidewalls of the fourth portion PO4 of the gate electrode GE, respectively. The gate spacers GS may extend along the gate electrode GE in the first direction D1. Top surfaces of the gate spacers GS may be higher than a top surface of the gate electrode GE in the third direction D3. The top surfaces of the gate spacers GS may be coplanar with a top surface of a first interlayer insulating layer 110 to be described later. The gate spacers GS may include at least one of silicon carbon-nitride (SiCN), silicon carbon-oxynitride (SiCON), or silicon nitride (SiN). For certain examples, each of the gate spacers GS may include a multi-layer formed of at least two of SiCN, SiCON, or SiN.

A gate capping pattern GP may be provided on the gate electrode GE. The gate capping pattern GP may extend along the gate electrode GE in the first direction D1. The gate capping pattern GP may include a material having an etch selectivity with respect to a first insulating layer 110 and a second interlayer insulating layer 120 to be described later. For example, the gate capping pattern GP may include at least one of SiON, SiCN, SiCON, or SiN.

A gate insulating layer GI may be disposed between the gate electrode GE and the first channel pattern CH1 and between the gate electrode GE and the second channel pattern CH2. The gate insulating layer GI may be provided on and cover the top surface TS, the bottom surface BS and the both sidewalls SW of each of the first to third semiconductor patterns SP1, SP2 and SP3. The gate insulating layer GI may be provided on and cover a top surface of the device isolation layer ST under the gate electrode GE (see FIG. 2D).

In some embodiments, the gate insulating layer GI may include a silicon oxide layer, a silicon oxynitride layer, and/or a high-k dielectric layer. The high-k dielectric layer may include a high-k dielectric material of which a dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In certain embodiments, the semiconductor device may include a negative capacitance (NC) FET using a negative capacitor. For example, the gate insulating layer GI may include a ferroelectric material layer having ferroelectric properties, and a paraelectric material layer having paraelectric properties.

The ferroelectric material layer may have a negative capacitance, and the paraelectric material layer may have a positive capacitance. For example, when two or more capacitors are connected in series to each other and a capacitance of each of the capacitors has a positive value, a total capacitance may be reduced to be less than the capacitance of each of the capacitors. When at least one of capacitances of two or more capacitors connected in series to each other has a negative value, a total capacitance may have a positive value and may be greater than an absolute value of the capacitance of each of the capacitors.

When the ferroelectric material layer having the negative capacitance is connected in series to the paraelectric material layer having the positive capacitance, a total capacitance value of the ferroelectric and paraelectric material layers connected in series may increase. The transistor including the ferroelectric material layer may have a subthreshold swing (SS) less than 60 mV/decade at room temperature by using the increase in the total capacitance value.

The ferroelectric material layer may have the ferroelectric properties. For example, the ferroelectric material layer may include at least one of hafnium oxide, hafnium zirconium oxide, barium strontium titanium oxide, barium titanium oxide, or lead zirconium titanium oxide. Here, for an example, the hafnium zirconium oxide may be a material formed by doping hafnium oxide with zirconium (Zr). For another example, the hafnium zirconium oxide may be a compound of hafnium (Hf), zirconium (Zr), and oxygen (O).

The ferroelectric material layer may further include dopants doped therein. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A kind of the dopants included in the ferroelectric material layer may be changed depending on a kind of the ferroelectric material included in the ferroelectric material layer.

When the ferroelectric material layer includes hafnium oxide, the dopants included in the ferroelectric material layer may include at least one of, for example, gadolinium (Gd), silicon (Si), zirconium (Zr), aluminum (Al), or yttrium (Y).

When the dopants are aluminum (Al), the ferroelectric material layer may include aluminum of 3 at % (atomic %) to 8 at %. Here, a ratio of the dopants may be a ratio of the amount of aluminum to a sum of the amounts of hafnium and aluminum.

When the dopants are silicon (Si), the ferroelectric material layer may include silicon of 2 at % to 10 at %. When the dopants are yttrium (Y), the ferroelectric material layer may include yttrium of 2 at % to 10 at %. When the dopants are gadolinium (Gd), the ferroelectric material layer may include gadolinium of 1 at % to 7 at %. When the dopants are zirconium (Zr), the ferroelectric material layer may include zirconium of 50 at % to 80 at %.

The paraelectric material layer may have the paraelectric properties. For example, the paraelectric material layer may include at least one of silicon oxide or a metal oxide having a high-k dielectric constant. For example, the metal oxide included in the paraelectric material layer may include at least one of, but not limited to, hafnium oxide, zirconium oxide, or aluminum oxide.

The ferroelectric material layer and the paraelectric material layer may include the same material. The ferroelectric material layer may have the ferroelectric properties, but the paraelectric material layer may not have the ferroelectric properties. For example, when the ferroelectric material layer and the paraelectric material layer include hafnium oxide, a crystal structure of hafnium oxide included in the ferroelectric material layer may be different from a crystal structure of hafnium oxide included in the paraelectric material layer.

The ferroelectric material layer may have a thickness showing the ferroelectric properties. For example, the thickness of the ferroelectric material layer may range from 0.5 nm to 10 nm, but embodiments are not limited thereto. A critical thickness showing the ferroelectric properties may be changed depending on a type of a ferroelectric material, and thus the thickness of the ferroelectric material layer may be changed depending on a type of the ferroelectric material included therein.

In some embodiments, the gate insulating layer GI may include a single ferroelectric material layer. In other embodiments, the gate insulating layer GI may include a plurality of the ferroelectric material layers spaced apart from each other. The gate insulating layer GI may have a stack structure in which the ferroelectric material layers and the paraelectric material layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2 and SP3. The first metal pattern may include a work function metal of adjusting a threshold voltage of a transistor. A desired threshold voltage of the transistor may be obtained by adjusting a thickness and a composition of the first metal pattern. For example, the first to third portions PO1, PO2 and PO3 of the gate electrode GE may be formed of the first metal pattern corresponding to the work function metal.

The first metal pattern may include a metal nitride layer. For example, the first metal pattern may include nitrogen (N) and at least one metal selected from a group consisting of titanium (Ti), tantalum (Ta), aluminum (Al), tungsten (W), and molybdenum (Mo). In addition, the first metal pattern may further include carbon (C). In some embodiments, the first metal pattern may include a plurality of stacked work function metal layers.

The second metal pattern may include a metal having a resistance lower than that of the first metal pattern. For example, the second metal pattern may include at least one metal selected from a group consisting of tungsten (W), aluminum (Al), titanium (Ti), and tantalum (Ta). For example, the fourth portion PO4 of the gate electrode GE may include the first metal pattern and the second metal pattern on the first metal pattern.

Referring again to FIG. 2B, inner spacers IP may be provided on the second active region NR. The inner spacers IP may be disposed between the second source/drain pattern SD2 and the first to third portions PO1, PO2 and PO3 of the gate electrode GE, respectively. The inner spacers IP may be in direct contact with the second source/drain pattern SD2. Each of the first to third portions PO1, PO2 and PO3 of the gate electrode GE may be spaced apart from the second source/drain pattern SD2 by the inner spacer IP.

A first interlayer insulating layer 110 may be provided on the substrate 100. The first interlayer insulating layer 110 may be provided on and cover the gate spacers GS and the first and second source/drain patterns SD1 and SD2. A top surface of the first interlayer insulating layer 110 may be substantially coplanar with the top surface of the gate capping pattern GP and the top surface of the gate spacer GS in the third direction D3. A second interlayer insulating layer 120 provided on the gate capping pattern GP may be disposed on the first interlayer insulating layer 110. For example, each of the first and second interlayer insulating layers 110 and 120 may include a silicon oxide layer.

A pair of isolation structures DB opposite to each other in the second direction D2 may be provided at both sides of the logic cell LC. The isolation structure DB may extend in the first direction D1 in parallel to the gate electrode GE. The isolation structure DB may penetrate the first and second interlayer insulating layers 110 and 120 and may extend into the first and second active patterns AP1 and AP2. The isolation structure DB may penetrate an upper portion of each of the first and second active patterns AP1 and AP2. The isolation structure DB may isolate the first and second active regions PR and NR of the logic cell LC from active regions of an adjacent logic cell.

An upper portion of each of the first and second active patterns AP1 and AP2 may further include sacrificial layers SAL adjacent to the isolation structure DB. The sacrificial layers SAL may be stacked and may be spaced apart from each other in the third direction D3. The sacrificial layers SAL may be located at the same levels as the first to third portions PO1, PO2 and PO3 of the gate electrode GE, respectively. The isolation structure DB may penetrate the sacrificial layers SAL.

The sacrificial layers SAL may include silicon-germanium (SiGe). A concentration of germanium (Ge) of each of the sacrificial layers SAL may range from 10 at % to 30 at %. The concentration of germanium of the sacrificial layer SAL may be higher than the concentration of germanium of the first semiconductor layer SEL1 described above.

Active contacts AC may penetrate the first and second interlayer insulating layers 110 and 120 to be electrically connected to the first and second source/drain patterns SD1 and SD2. A pair of the active contacts AC may be provided at both sides of the gate electrode GE, respectively. The active contact AC may have a bar shape extending in the first direction D1 when viewed in a plan view.

The active contact AC may be a self-aligned contact. For example, the active contact AC may be formed to be self-aligned with the gate capping pattern GP and the gate spacer GS. For example, the active contact AC may be provided on and cover at least a portion of a sidewall of the gate spacer GS. The active contact AC may be provided on and cover a portion of the top surface of the gate capping pattern GP.

Silicide patterns SC may be disposed between each of some portion of the active contacts AC and the first source/drain pattern SD1 and between each of some portion of the others active contacts AC and the second source/drain pattern SD2, respectively. The active contacts AC may be electrically connected to the source/drain patterns SD1 and SD2 through the silicide patterns SC. The silicide pattern SC may include a metal silicide and may include at least one of, for example, titanium silicide, tantalum silicide, tungsten silicide, nickel silicide, or cobalt silicide. A gate contact GC may penetrate the second interlayer insulating layer 120 and the gate capping pattern GP so as to be electrically connected to the gate electrode GE.

The active contact AC may include a first conductive pattern FM1 and a first barrier pattern BM1 provided adjacent to and surrounding the first conductive pattern FM1. The gate contact GC may include a second conductive pattern FM2 and a second barrier pattern BM2 provided adjacent to and surrounding the second conductive pattern FM2. For example, each of the first and second conductive patterns FM1 and FM2 may include at least one metal of aluminum, copper, tungsten, molybdenum, or cobalt. The first barrier pattern BM1 may be provided on and cover sidewalls and a bottom surface of the first conductive pattern FM1. The second barrier pattern BM2 may be provided on and cover sidewalls and a bottom surface of the second conductive pattern FM2. Each of the first and second barrier patterns BM1 and BM2 may include a metal layer/a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

A third interlayer insulating layer 130, a fourth interlayer insulating layer 140, a fifth interlayer insulating layer 150 and a sixth interlayer insulating layer 160 may be sequentially provided on the second interlayer insulating layer 120. For example, each of the third to sixth interlayer insulating layers 130, 140, 150 and 160 may include a silicon oxide layer.

A first metal layer M1 may be provided in the third interlayer insulating layer 130. The first metal layer M1 may include power interconnection lines POR, first interconnection lines ML1, and vias VI. The vias VI may be provided under the first interconnection lines ML1 and the power interconnection lines POR. A drain voltage VDD or a source voltage VSS may be applied to each of the power interconnection lines POR.

Referring to FIG. 1, a first cell boundary CB1 extending in the second direction D2 may be formed at a side of the logic cell LC. A second cell boundary CB2 extending in the second direction D2 may be formed at another side of the logic cell LC, which is opposite to the first cell boundary CB1. The power interconnection line POR to which the drain voltage VDD is applied may be disposed on the first cell boundary CB1. The power interconnection line POR to which the drain voltage VDD is applied may extend along the first cell boundary CB1 in the second direction D2. The power interconnection line POR to which the source voltage VSS is applied may be disposed on the second cell boundary CB2. The power interconnection line POR to which the source voltage VSS is applied may extend along the second cell boundary CB2 in the second direction D2.

The first interconnection lines ML1 may be arranged in the first direction D1 between the power interconnection line POR configured to receive the drain voltage VDD and the power interconnection line POR configured to receive the source voltage VSS. Each of the first interconnection lines ML1 may have a line shape or bar shape extending in the second direction D2.

The vias VI may be provided under the power interconnection lines POR and the first interconnection lines ML1 of the first metal layer M1. Some of the vias VI may be disposed between corresponding ones of the active contacts AC and the power interconnection lines POR and between corresponding ones of the active contacts AC and corresponding ones of the first interconnection lines ML1. Another of the vias VI may be disposed between the gate contact GC and a corresponding one of the first interconnection lines ML1.

The first interconnection line ML1 and the power interconnection line POR of the first metal layer M1 may be formed by a process different from a process of forming the vias VI thereunder. For example, each of the first interconnection line ML1 and the via VI may be formed by a single damascene process. The semiconductor device according to the present embodiments may be formed using processes requiring a size that is less than 20 nm.

Each of the first interconnection lines ML1 may include a third barrier pattern BM3, a first liner LIN1 on the third barrier pattern BM3, a third conductive pattern FM3 on the first liner LIN1, and a first capping pattern CAP1 on the third conductive pattern FM3. The first liner LIN1 may include a ruthenium cobalt (RuCo) compound. The first liner LIN1 may include a ruthenium cobalt alloy. A maximum width of the first interconnection line ML1 in the first direction D1 may be a first width W1. An upper portion of the third conductive pattern FM3 and an upper portion of the first liner LIN1 may be recessed to form a first recess region RSR1.

A first etch stop layer ESL1 may be provided to cover the third interlayer insulating layer 130. The first etch stop layer ESL1 may be provided on and cover top surfaces of the power interconnection lines POR and the first interconnection lines ML1. The first etch stop layer ESL1 may be disposed between the third and fourth interlayer insulating layers 130 and 140.

A second metal layer M2 may be provided in the fourth interlayer insulating layer 140. The second metal layer M2 may include second interconnection lines ML2. Each of the second interconnection lines ML2 may have a line shape or bar shape extending in the first direction D1.

Each of the second interconnection lines ML2 may include a fourth barrier pattern BM4, a second liner LIN2 on the fourth barrier pattern BM4, a fourth conductive pattern FM4 on the second liner LIN2, and a second capping pattern CAP2 on the fourth conductive pattern FM4. The second liner LIN2 may include cobalt (Co). A maximum width of the second interconnection line ML2 in the second direction D2 may be a second width W2. The second width W2 may be greater than the first width W1. An upper portion of the fourth conductive pattern FM4 and an upper portion of the second liner LIN2 may be recessed to form a second recess region RSR2.

The second interconnection line ML2 may include a line portion LIP and a via portion VIP. The line portion LIP of the second interconnection line ML2 may be provided in an upper portion of the fourth interlayer insulating layer 140 and may extend in the first direction D1. The via portion VIP of the second interconnection line ML2 may be provided in a lower portion of the fourth interlayer insulating layer 140 and may extend from the line portion LIP of the second interconnection line ML2 toward the first metal layer M1. For example, the via portion VIP of the second interconnection line ML2 may be a via disposed between the first metal layer M1 and the line portion LIP of the second interconnection line ML2 to connect them to each other. The via portion VIP of the second interconnection line ML2 may penetrate the first etch stop layer ESL1.

A second etch stop layer ESL2 may be provided to cover the fourth interlayer insulating layer 140. The second etch stop layer ESL2 may be provided on and cover top surfaces of the second interconnection lines ML2. The second etch stop layer ESL2 may be disposed between the fourth and fifth interlayer insulating layers 140 and 150.

A third metal layer M3 may be provided in the fifth interlayer insulating layer 150. The third metal layer M3 may include third interconnection lines ML3. Each of the third interconnection lines ML3 may have a line shape or bar shape extending in the second direction D2.

The third interconnection lines ML3 may have substantially the same or similar structure as the second interconnection lines ML2. Each of the third interconnection lines ML3 may include a fifth barrier pattern BM5, a third liner LIN3 on the fifth barrier pattern BM5, a fifth conductive pattern FM5 on the third liner LIN3, and a third capping pattern CAP3 on the fifth conductive pattern FM5. The third liner LIN3 may include cobalt (Co). A maximum width of the third interconnection line ML3 in the first direction D1 may be a third width W3. The third width W3 may be greater than the second width W2. An upper portion of the fifth conductive pattern FM5 and an upper portion of the third liner LIN3 may be recessed to form a second recess region RSR2. The third interconnection line ML3 may include a line portion LIP and a via portion VIP. The line portion LIP of the third interconnection line ML3 may be provided in an upper portion of the fifth interlayer insulating layer 150 and may extend in the second direction D2. The via portion VIP of the third interconnection line ML3 may be provided in a lower portion of the fifth interlayer insulating layer 150 and may extend from the line portion LIP of the third interconnection line ML3 toward the second metal layer M2. The via portion VIP of the third interconnection line ML3 may penetrate the second etch stop layer ESL2.

A third etch stop layer ESL3 may be provided to cover the fifth interlayer insulating layer 150. The third etch stop layer ESL3 may be provided on and cover top surfaces of the third interconnection lines ML3. The third etch stop layer ESL3 may be disposed between the fifth and sixth interlayer insulating layers 150 and 160.

A fourth metal layer M4 may be provided in the sixth interlayer insulating layer 160. The fourth metal layer M4 may include fourth interconnection lines ML4. Each of the fourth interconnection lines ML4 may have a line shape or bar shape extending in the first direction D1. For example, the fourth interconnection lines ML4 may extend in the first direction D1 in parallel to each other.

The fourth interconnection lines ML4 may have substantially the same or similar structure as the second interconnection lines ML2. Each of the fourth interconnection lines ML4 may include a sixth barrier pattern BM6, a fourth liner LIN4 on the sixth barrier pattern BM6, a sixth conductive pattern FM6 on the fourth liner LIN4, and a fourth capping pattern CAP4 on the sixth conductive pattern FM6. The fourth liner LIN4 may include cobalt (Co). A maximum width of the fourth interconnection line ML4 in the second direction D2 may be a fourth width W4. The fourth width W4 may be greater than the third width W3. An upper portion of the sixth conductive pattern FM6 and an upper portion of the fourth liner LIN4 may be recessed to form a second recess region RSR2.

The fourth interconnection line ML4 may include a line portion LIP and a via portion VIP. The line portion LIP of the fourth interconnection line ML4 may be provided in an upper portion of the sixth interlayer insulating layer 160 and may extend in the first direction D1. The via portion VIP of the fourth interconnection line ML4 may be provided in a lower portion of the sixth interlayer insulating layer 160 and may extend from the line portion LIP of the fourth interconnection line ML4 toward the third metal layer M3. The via portion VIP of the fourth interconnection line ML4 may penetrate the third etch stop layer ESL3.

The first interconnection line ML1 and the second interconnection line ML2 will be described in more detail with reference to FIGS. 3A and 3B. Referring to FIG. 3A, the first interconnection line ML1 may include the third barrier pattern BM3, the first liner LIN1, the third conductive pattern FM3, and the first capping pattern CAP1. A cross section of the third barrier pattern BM3 may have a U-shape. A top surface of the third barrier pattern BM3 may be substantially coplanar with a top surface of the third interlayer insulating layer 130 in the third direction D3. According to another embodiment, the top surface of the third barrier pattern BM3 may be lower than the top surface of the third interlayer insulating layer 130.

The third barrier pattern BM3 may prevent a metal material of the third conductive pattern FM3 from being diffused into the third interlayer insulating layer 130. The third barrier pattern BM3 may include a metal layer/a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

The first liner LIN1 may be provided on the third barrier pattern BM3. The first liner LIN1 may be conformally provided along an inner surface of the third barrier pattern BM3. The first liner LIN1 may include a ruthenium cobalt (RuCo) compound.

The third conductive pattern FM3 may be provided on the first liner LIN1. The first liner LIN1 may cover sidewalls and a bottom surface of the third conductive pattern FM3. For example, the third conductive pattern FM3 may include copper (Cu), ruthenium (Ru), cobalt (Co), tungsten (W), or molybdenum (Mo). In particular, the third conductive pattern FM3 may include copper (Cu). The first liner LIN1 may prevent migration of the metal material included in the third conductive pattern FM3 and may improve filling properties of the third conductive pattern FM3.

The first capping pattern CAP1 may be provided to cover a top surface of the third conductive pattern FM3 and a top surface of the first liner LIN1. The first capping pattern CAP may be conformally provided. The first capping pattern CAP may include at least one of ruthenium (Ru), cobalt (Co), or graphene.

The top surface LIN1$t$ of the first liner LIN1 may have a curved shape. The top surface FM3$t$ of the third conductive pattern FM3 may have a curved shape. The top surface LIN1$t$ of the first liner LIN1 and the top surface FM3$t$ of the third conductive pattern FM3 may be convex. The first capping pattern CAP1 covering the top surface LIN1$t$ of the first liner LIN1 and the top surface FM3$t$ of the third conductive pattern FM3 may have a curved profile corresponding thereto.

The upper portion of the third conductive pattern FM3 and the upper portion of the first liner LIN1 may be recessed to form the first recess region RSR1. Thus, the top surface LIN1$t$ of the first liner LIN1 may be located at a lower level than the top surface of the third barrier pattern BM3 in the third direction D3.

An uppermost portion of the top surface FM3$t$ of the third conductive pattern FM3 may be located at a first level LV1. A lowermost portion of the top surface LIN1$t$ of the first liner LIN1 may be located at a second level LV2. A height of the first interconnection line ML1 may be a first height H1. The first height H1 may be a vertical distance between an uppermost portion and a lowermost portion of the first interconnection line ML1. A height difference between the first level LV1 and the second level LV2 may be a second height H2. For example, the second height H2 may range from 1% to 5% of the first height H1.

An angle between a central line CTL1 crossing a center of the first interconnection line ML1 and a straight line connecting the uppermost portion of the top surface FM3$t$ of the third conductive pattern FM3 and the lowermost portion of the top surface LIN1$t$ of the first liner LIN1 may be a first angle θ1. The first angle θ1 may range from 75 degrees to 85 degrees.

The via portion VIP of the second interconnection line ML2 may be in contact with the first interconnection line ML1. A width, in the first direction D1, of the via portion VIP of the second interconnection line ML2 may be greater than the first width W1. A bottommost surface of the fourth barrier pattern BM4 of the via portion VIP of the second interconnection line ML2 may have a profile corresponding to a top surface of the first capping pattern CAP1. For example, an empty space may not be formed between the via portion VIP of the second interconnection line ML2 and the first interconnection line ML1, but a contact surface thereof may be relatively increased. Thus, a resistance between the first interconnection line ML1 and the second interconnection line ML2 may be relatively reduced.

Referring to FIG. 3B, the second interconnection line ML2 may include the fourth barrier pattern BM4, the second liner LIN2, the fourth conductive pattern FM4, and the second capping pattern CAP2. A cross section of the fourth barrier pattern BM4 may have a U-shape. A top surface of the fourth barrier pattern BM4 may be located at substantially the same level as a top surface of the fourth interlayer insulating layer 140 in the third direction D3. According to another embodiment, the top surface of the fourth barrier pattern BM4 may be lower than the top surface of the fourth interlayer insulating layer 140.

The fourth barrier pattern BM4 may prevent a metal material of the fourth conductive pattern FM4 from being diffused into the fourth interlayer insulating layer 140. The fourth barrier pattern BM4 may include a metal layer/a metal nitride layer. For example, the fourth barrier pattern BM4 may include the same material as the third barrier pattern BM3. According to another embodiment, the fourth barrier pattern BM4 may include a different material from that of the third barrier pattern BM3.

The second liner LIN2 may be provided on the fourth barrier pattern BM4. The second liner LIN2 may be conformally provided along an inner surface of the fourth barrier pattern BM4. The second liner LIN2 may include cobalt (Co). The second liner LIN2 may prevent migration of the metal material included in the fourth conductive pattern FM4 and may improve filling properties of the fourth conductive pattern FM4.

The fourth conductive pattern FM4 may be provided on the second liner LIN2. The second liner LIN2 may be provided on and cover sidewalls and a bottom surface of the fourth conductive pattern FM4. For example, the fourth conductive pattern FM4 may include the same metal material as the third conductive pattern FM3.

The second capping pattern CAP2 may be provided to cover a top surface of the fourth conductive pattern FM4 and a top surface of the second liner LIN2. The second capping pattern CAP2 may be conformally provided. For example, the second capping pattern CAP2 may include the same material as the first capping pattern CAP1. According to another embodiment, the second capping pattern CAP2 may include a different material from that of the first capping pattern CAP1.

The top surface LIN2$t$ of the second liner LIN2 may have a curved shape. The top surface FM4$t$ of the fourth conductive pattern FM4 may have a curved shape. For example, the top surface LIN2$t$ of the second liner LIN2 and the top surface FM4$t$ of the fourth conductive pattern FM4 may be convex. The second capping pattern CAP2 covering the top surface LIN2$t$ of the second liner LIN2 and the top surface FM4$t$ of the fourth conductive pattern FM4 may have a curved shape corresponding thereto.

The upper portion of the fourth conductive pattern FM4 and the upper portion of the second liner LIN2 may be recessed to form the second recess region RSR2. Thus, the top surface LIN2$t$ of the second liner LIN2 may be located at a lower level than the top surface of the fourth barrier pattern BM4 in the third direction D3.

The second recess region RSR2 may be deeper than the first recess region RSR1. A depth of the first recess region RSR1 may correspond to a height difference between a level of the top surface of the third barrier pattern BM3 and the level of the lowermost portion of the top surface LIN1$t$ of the first liner LIN1. A depth of the second recess region RSR2 may correspond to a height difference between a level of the top surface of the fourth barrier pattern BM4 and a level of a lowermost portion of the top surface LIN2$t$ of the second liner LIN2. As described later, this may be because a recessed amount of the first liner LIN1 including the ruthenium cobalt compound in a planarization process is less than a recessed amount of the second liner LIN2 including cobalt in a planarization process.

A curvature of the top surface FM3$t$ of the third conductive pattern FM3 may be less than a curvature of the top surface FM4$t$ of the fourth conductive pattern FM4. A curvature of the top surface LIN1$t$ of the first liner LIN1 may be less than a curvature of the top surface LIN2$t$ of the second liner LIN2.

An uppermost portion of the top surface FM4$t$ of the fourth conductive pattern FM4 may be located at a third level LV3. The lowermost portion of the top surface LIN2$t$ of the second liner LIN2 may be located at a fourth level LV4. A height of the second interconnection line ML2 may be a third height H3. The third height H3 may be a vertical distance between an uppermost portion and a lowermost portion of the second interconnection line ML2. A level (or height) difference between the third level LV3 and the fourth level LV4 may be a fourth height H4. For example, the fourth height H4 may range from 10% to 20% of the third height H3. The second height H2 may be less than the fourth height H4.

An angle between a second central line CTL2 crossing a center of the second interconnection line ML2 and a straight line connecting the uppermost portion of the top surface FM4$t$ of the fourth conductive pattern FM4 and the lowermost portion of the top surface LIN2$t$ of the second liner LIN2 may be a second angle $\theta2$. The second angle $\theta2$ may range from 40 degrees to 65 degrees. The second angle $\theta2$ may be less than the first angle $\theta1$.

The third conductive pattern FM3 may include first grains GR1. The fourth conductive pattern FM4 may include second grains GR2. The first grains GR1 and the second grains GR2 may be formed by grain boundaries. An average size of the second grains GR2 may be less than an average size of the first grains GR1.

The via portion VIP of the third interconnection line ML3 may be in contact with the second interconnection line ML2. A void VD may be provided between the via portion VIP of the third interconnection line ML3 and the second interconnection line ML2. For example, the void VD may be provided between the fifth barrier pattern BM5 of the third interconnection line ML3 and the second capping pattern CAP2. This may be due to the fifth barrier pattern BM5 not being uniformly deposited on the second capping pattern CAP2 due to the relatively deep depth of the second recess region RSR2.

According to embodiments, the liner may include the ruthenium cobalt compound. The liner may include the ruthenium element having better ability to prevent migration of a metal material (in particular, copper) than cobalt, and thus filling properties of the conductive pattern formed on the liner may be improved.

The liner including the ruthenium cobalt compound may be formed to have a thickness thinner than that of a liner including cobalt. Thus, a volume of the conductive pattern formed on the liner may be relatively increased.

In addition, the amount of ruthenium recessed in a planarization process may be less than the amount of cobalt recessed in a planarization process. Thus, the amount of the conductive pattern recessed in the planarization process may also be smaller in the case in which the liner including the ruthenium cobalt compound is used. Accordingly, the volume of the conductive pattern may be relatively increased to reduce a resistance of the interconnection line. Furthermore, since the depth of the recess region formed by recessing of the conductive pattern and the liner is reduced, the void described with reference to FIG. 3B may not be formed between the interconnection lines. Thus, a delamination phenomenon between the interconnection lines may be prevented, and an electrical resistance between the interconnection lines may be reduced. As a result, electrical characteristics of the semiconductor device may be improved.

Figure 15A:
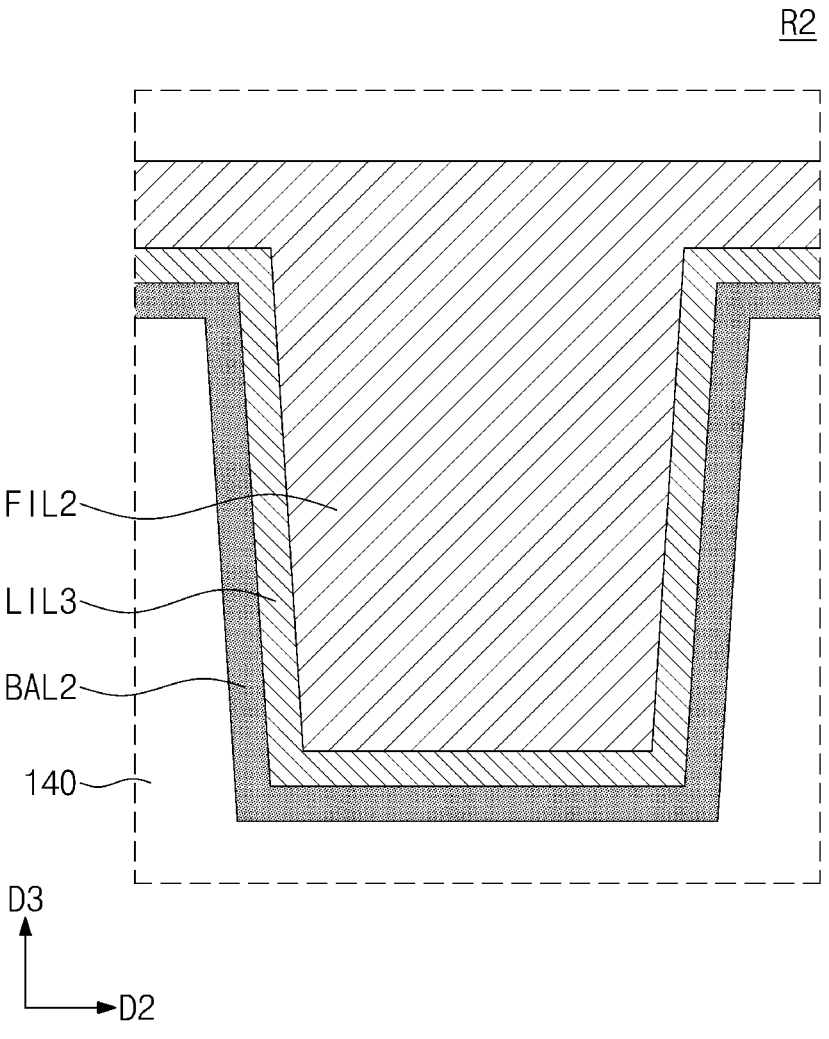
FIGS. 15A to 15C are enlarged cross-sectional views of a region 'R2' of FIG. 14A to illustrate a method of forming a second interconnection line.
Figure 15B:
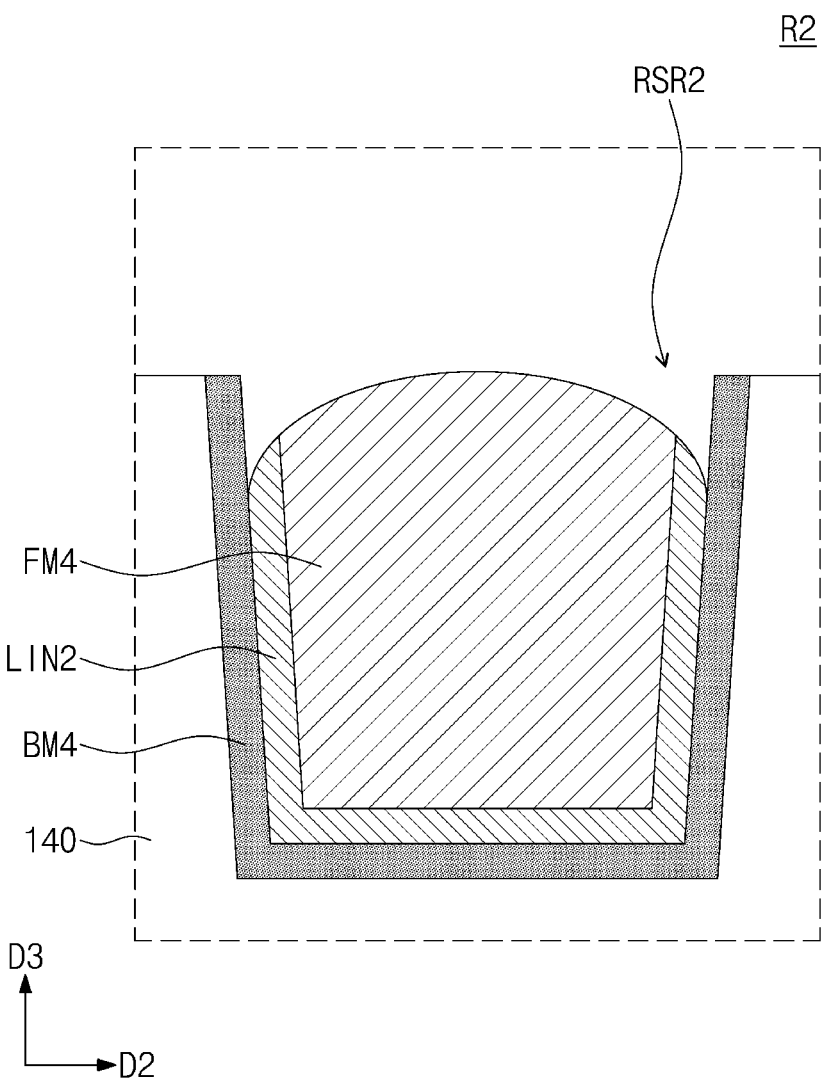
Figure 15C:
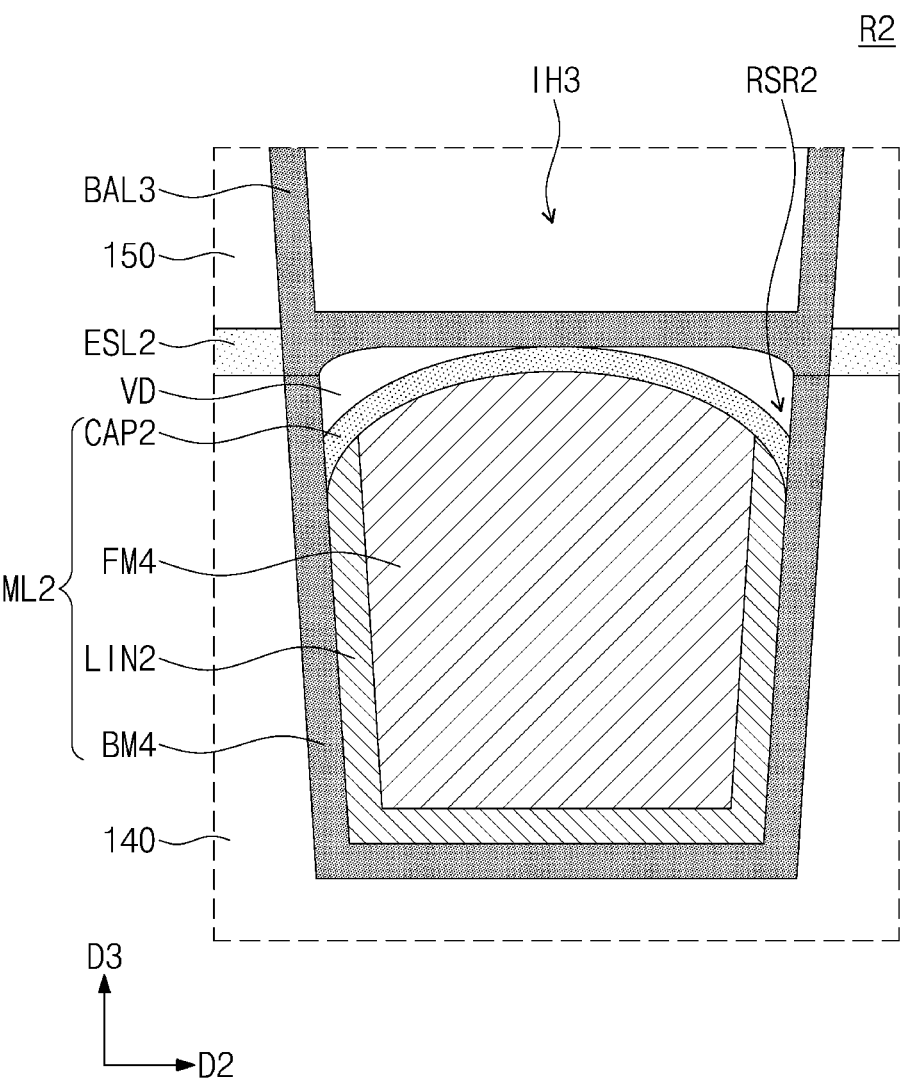

FIGS. 4, 6, 8, 10 and 13 are plan views illustrating a method of manufacturing a semiconductor device according to some embodiments. FIGS. 5A, 7A, 9A, 11A and 14A are cross-sectional views taken along lines A-A' of FIGS. 4, 6, 8, 10 and 13, respectively. FIGS. 7B, 9B, 11B and 14B are cross-sectional views taken along lines B-B' of FIGS. 6, 8, 10 and 13, respectively. FIGS. 7C, 9C, 11C and 14C are cross-sectional views taken along lines C-C' of FIGS. 6, 8, 10 and 13, respectively. FIGS. 5B, 7D, 9D, 11D and 14D are cross-sectional views taken along lines D-D' of FIGS. 4, 6, 8, 10 and 13, respectively. FIGS. 12A to 12D are enlarged cross-sectional views of a region 'R1' of FIG. 11C to illustrate a method of forming a first interconnection line. FIGS. 15A to 15C are enlarged cross-sectional views of a region 'R2' of FIG. 14A to illustrate a method of forming a second interconnection line.

Figure 4:
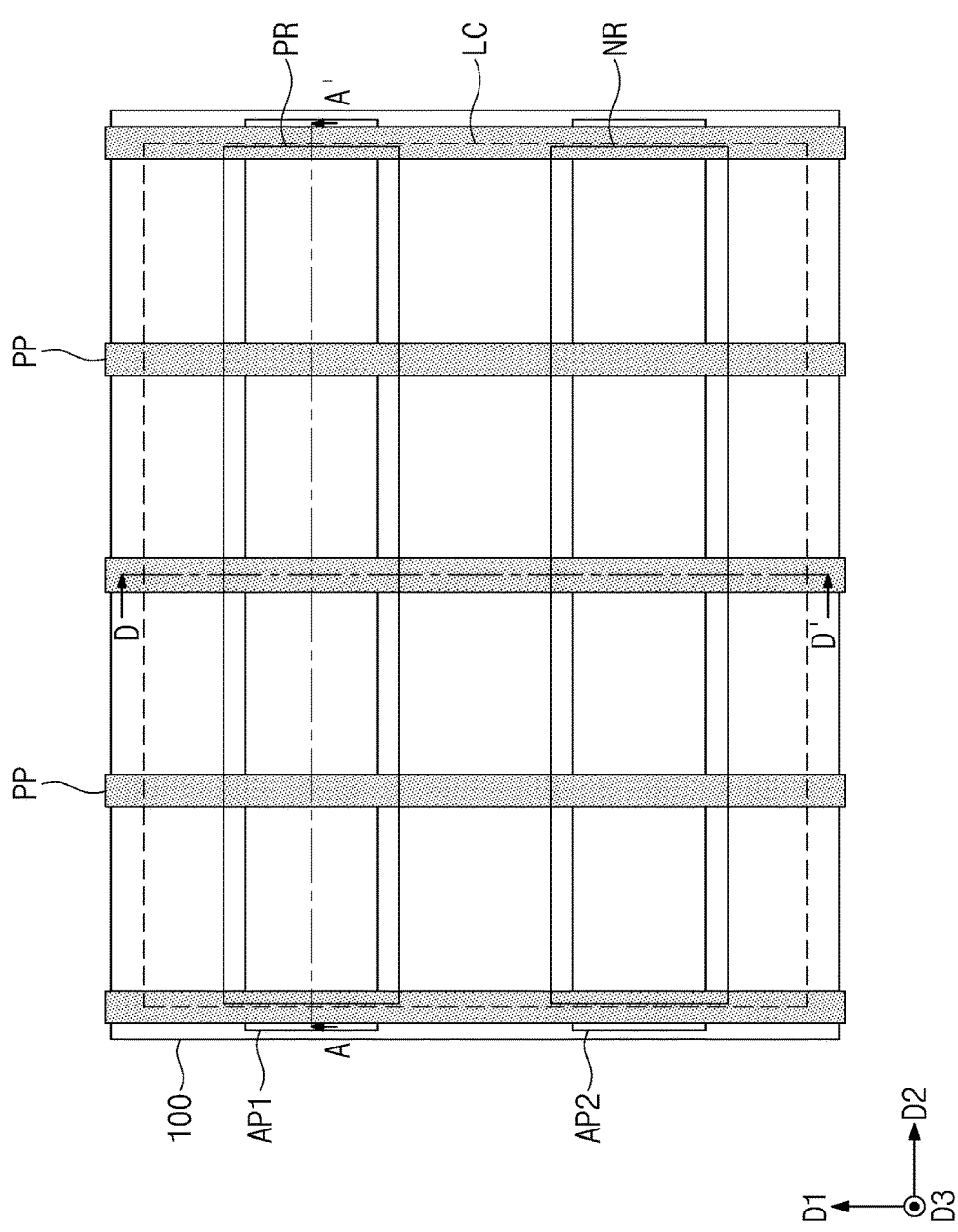
FIGS. 4, 6, 8, 10 and 13 are plan views illustrating a method of manufacturing a semiconductor device according to some embodiments.
Figure 5A:
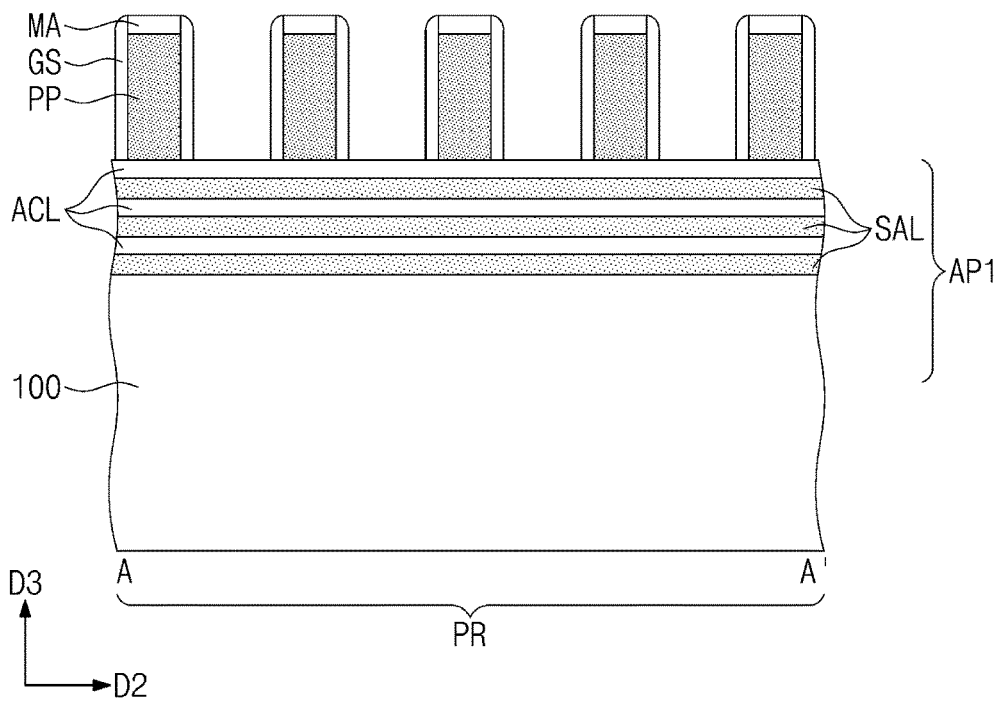
FIGS. 5A, 7A, 9A, 11A and 14A are cross-sectional views taken along lines A-A' of FIGS. 4, 6, 8, 10 and 13, respectively.
Figure 5B:
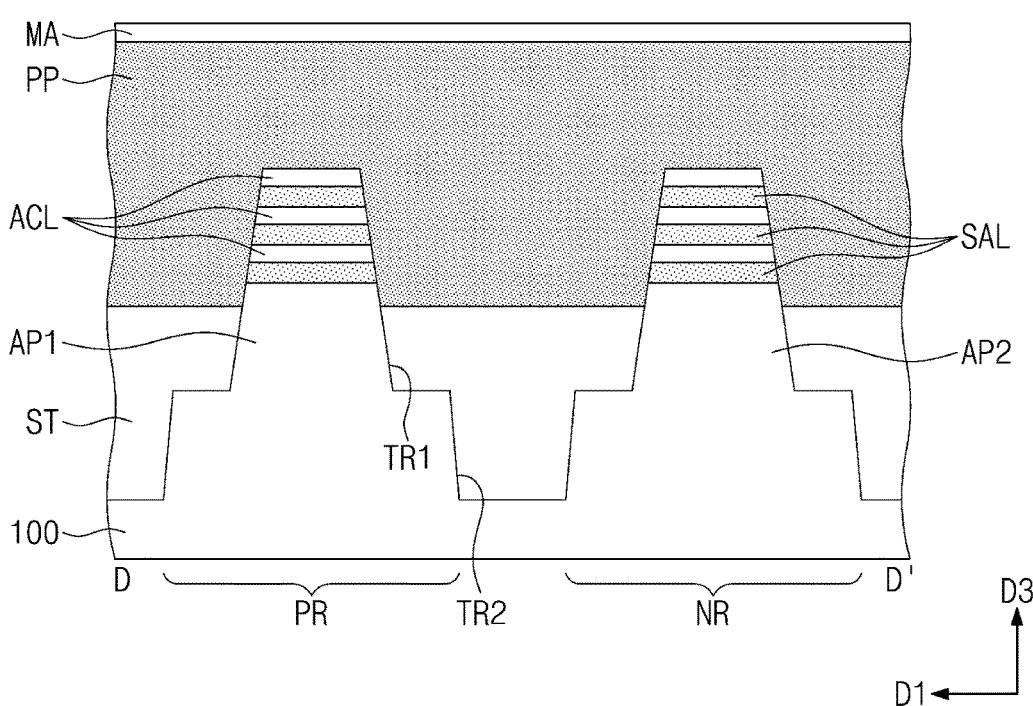
FIGS. 5B, 7D, 9D, 11D and 14D are cross-sectional views taken along lines D-D' of FIGS. 4, 6, 8, 10 and 13, respectively.
Figure 6:
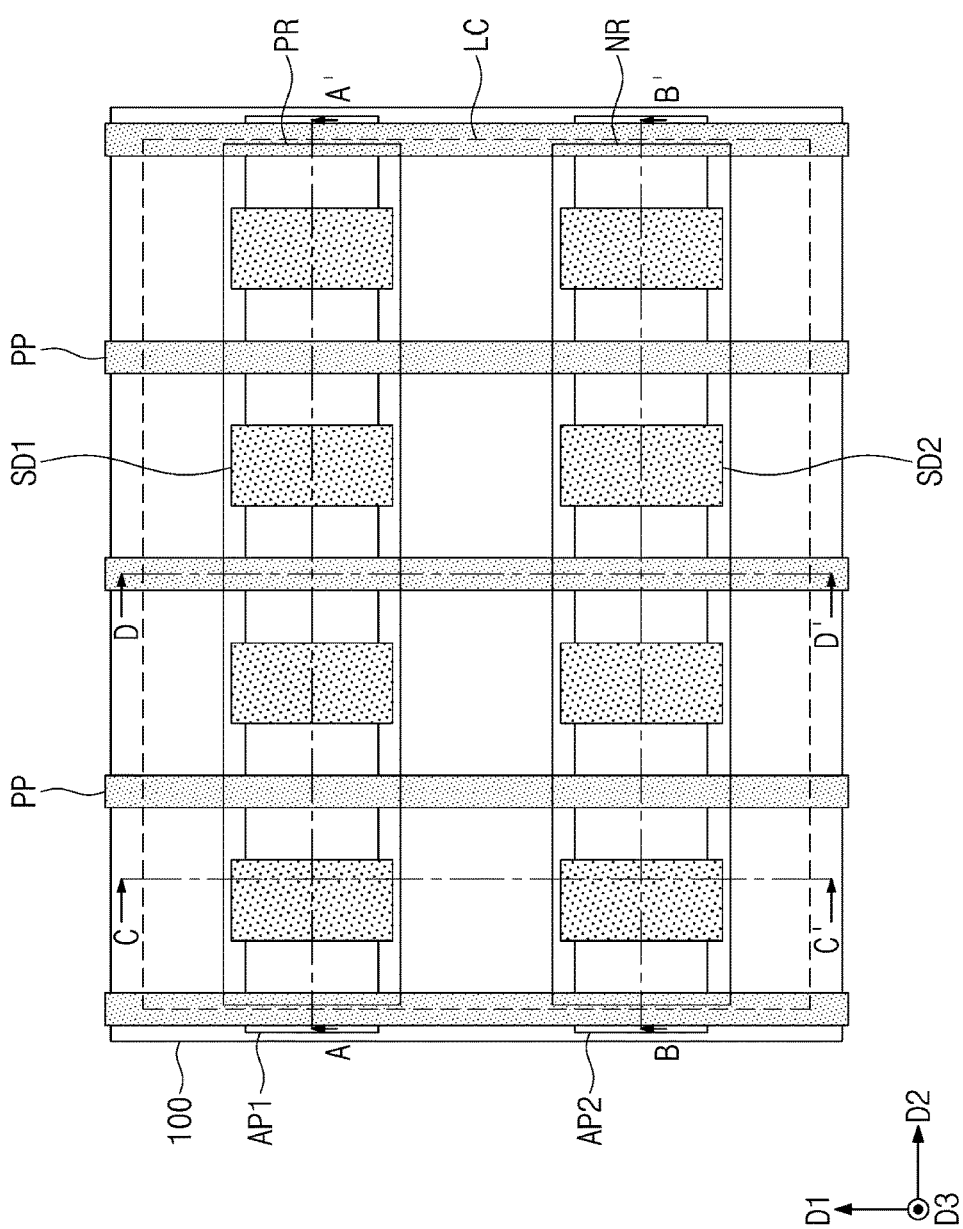
Figure 7A:
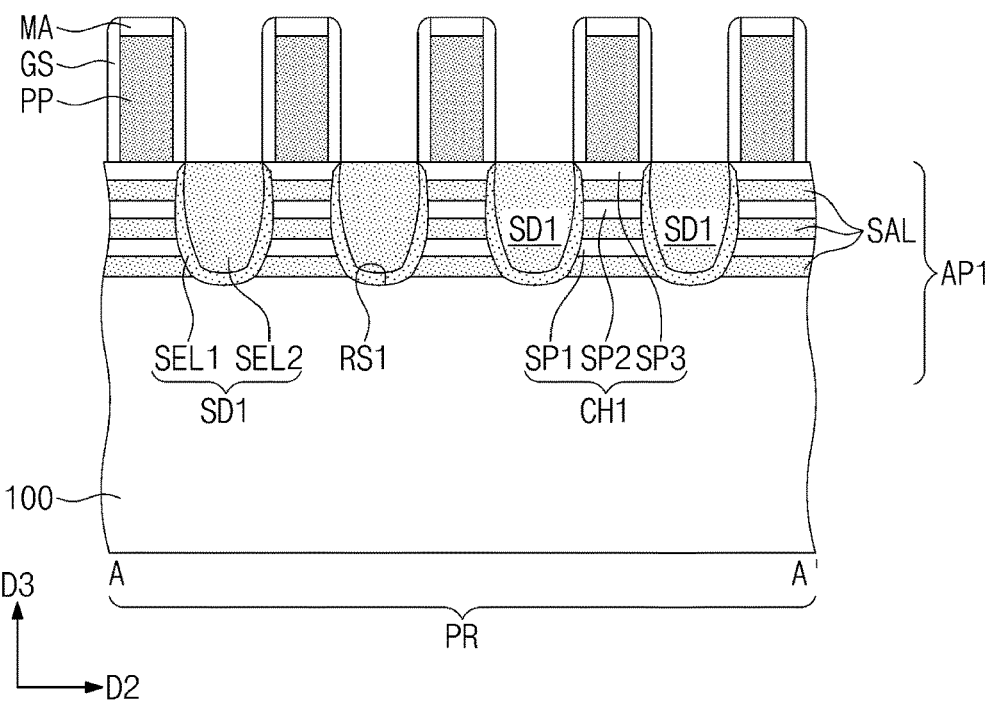
Figure 7B:
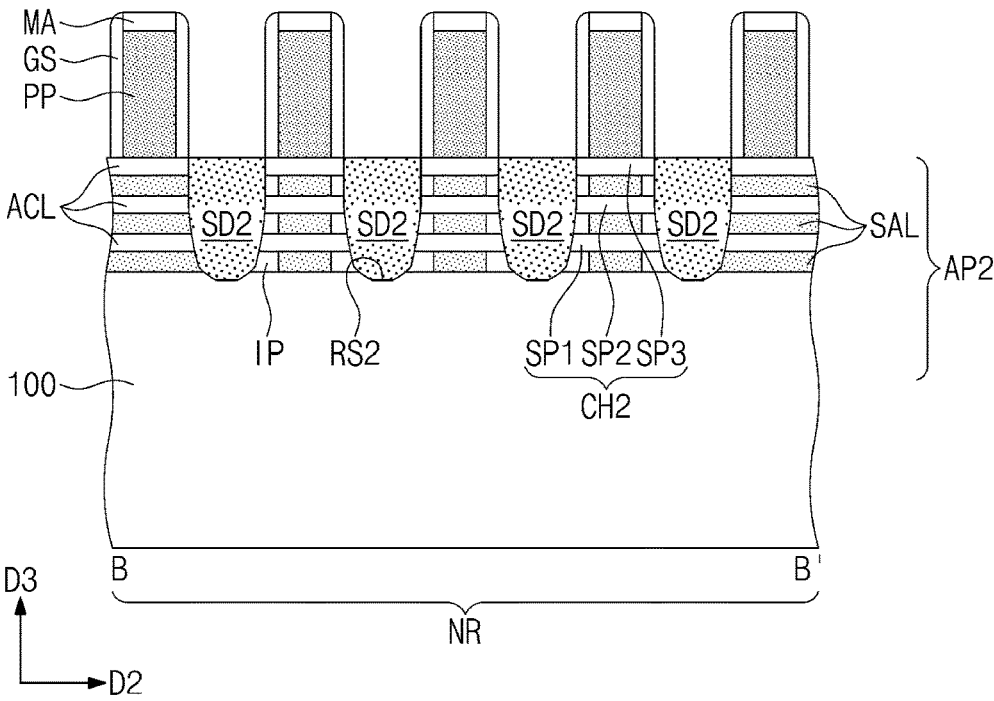
FIGS. 7B, 9B, 11B and 14B are cross-sectional views taken along lines B-B' of FIGS. 6, 8, 10 and 13, respectively.
Figure 7C:
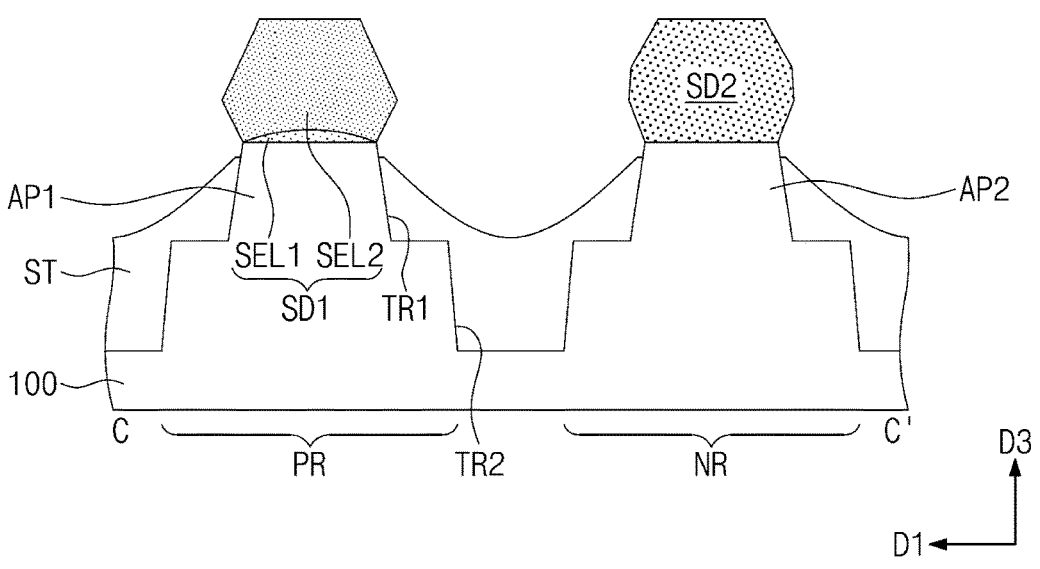
FIGS. 7C, 9C, 11C and 14C are cross-sectional views taken along lines C-C' of FIGS. 6, 8, 10 and 13, respectively.
Figure 7D:
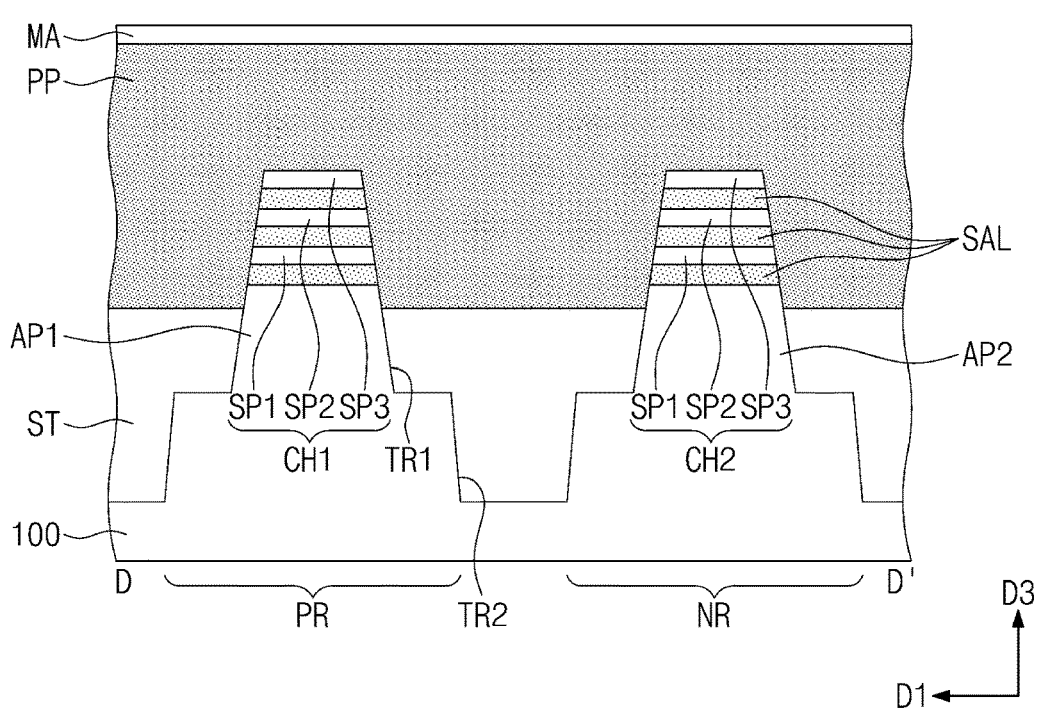
Figure 8:
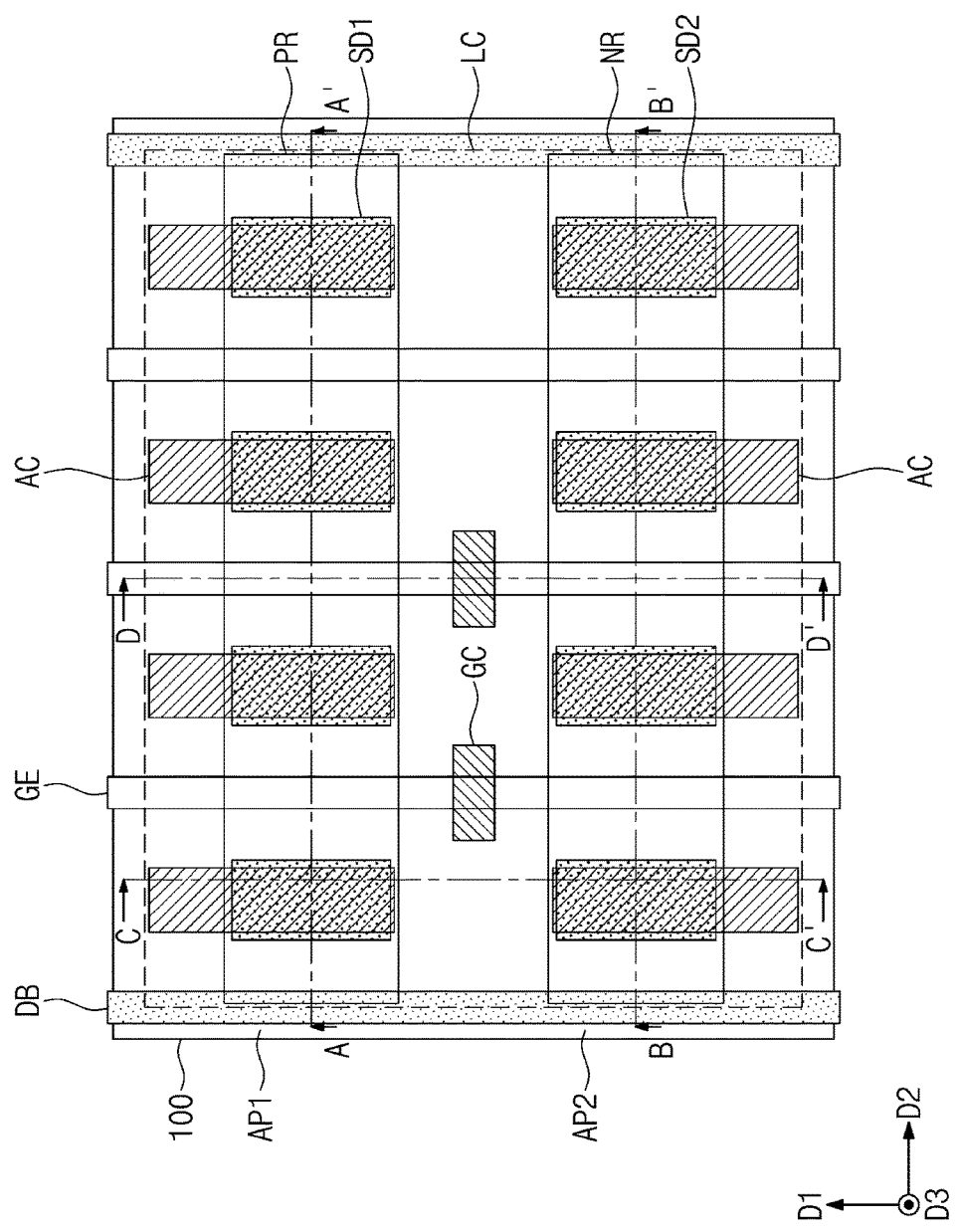
Figure 9A:
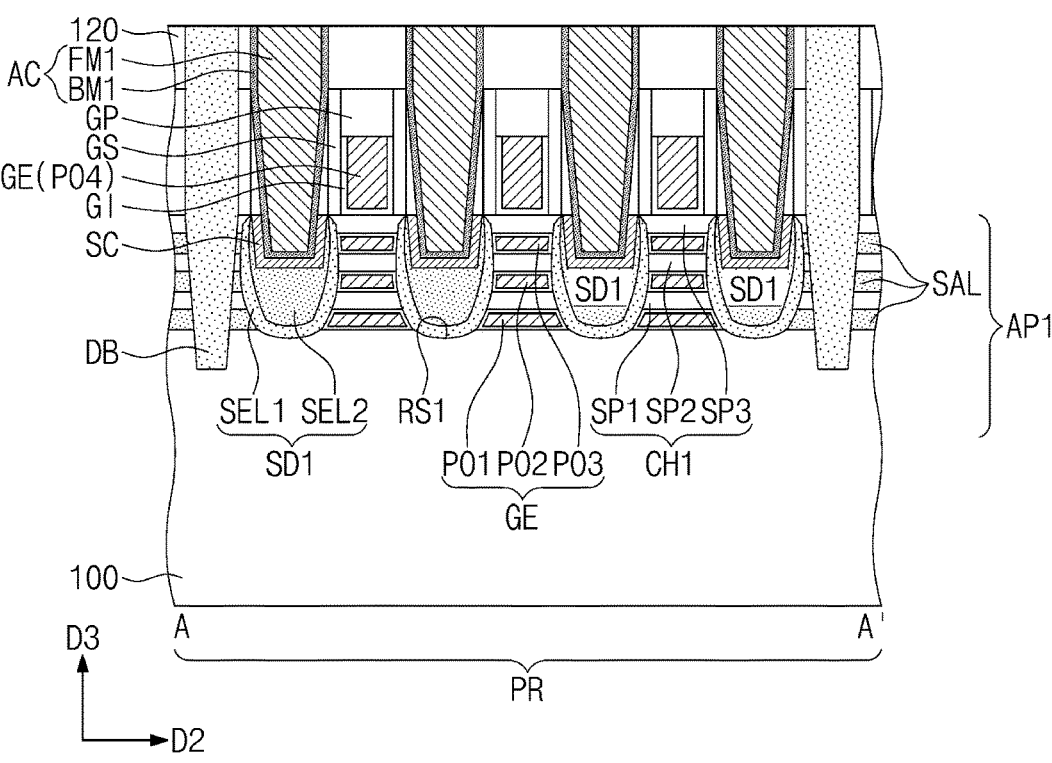
Figure 9B:
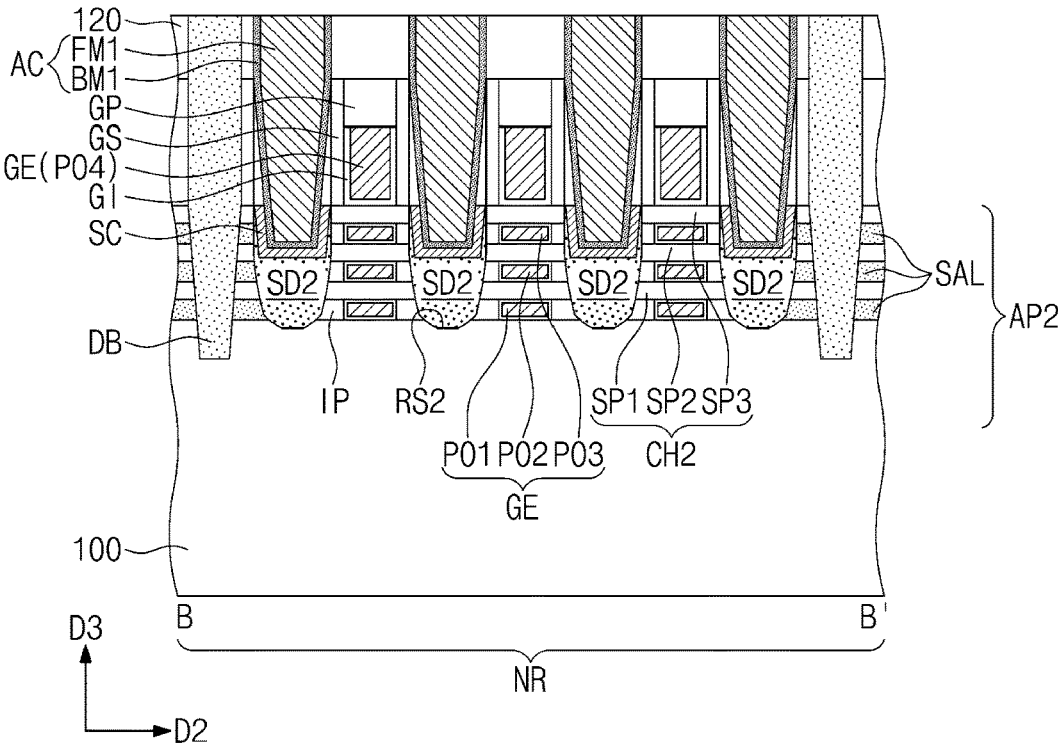
Figure 9C:
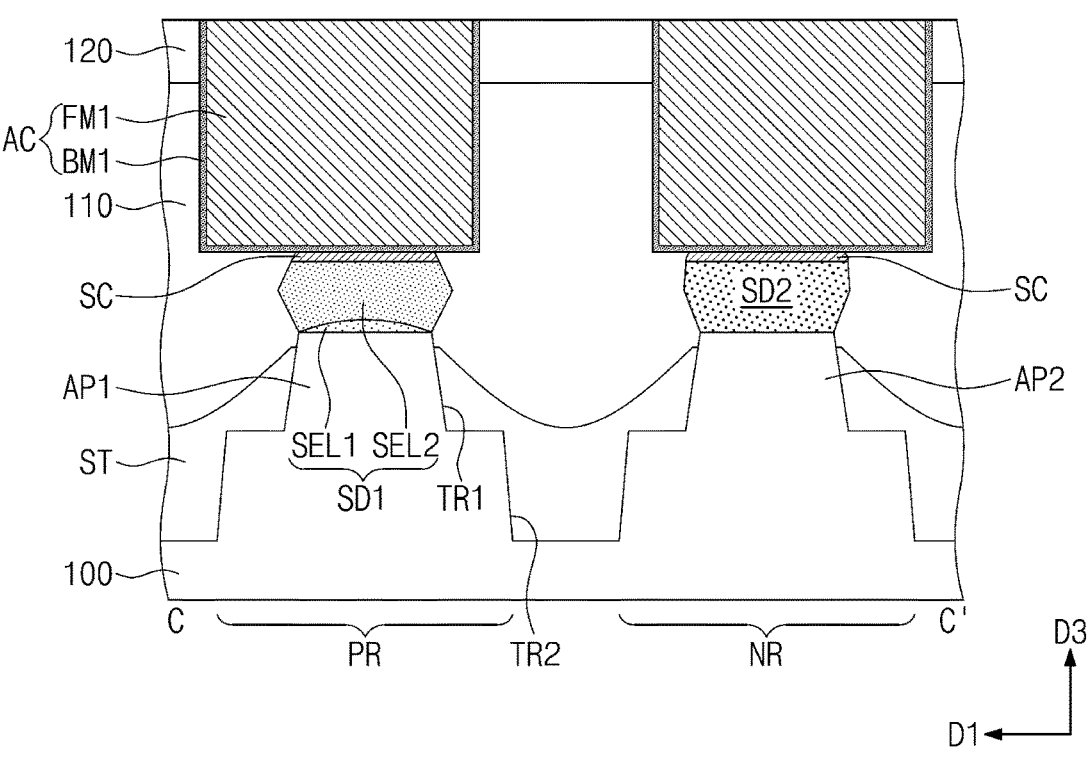
Figure 9D:
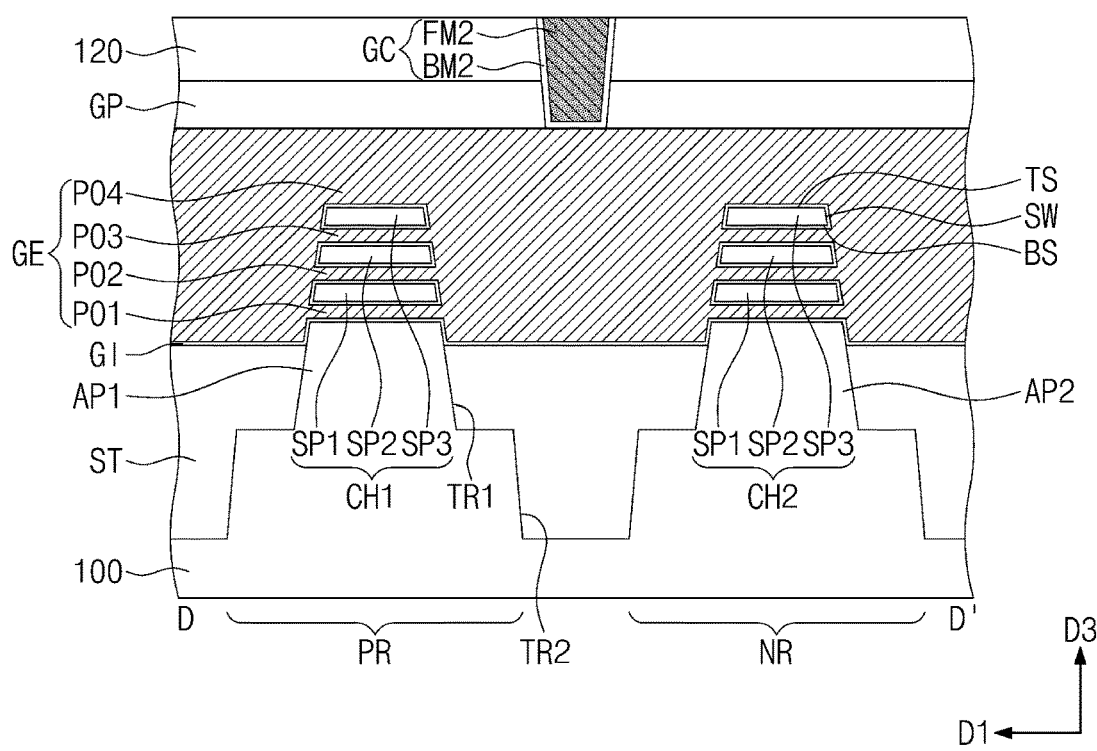
Figure 10:
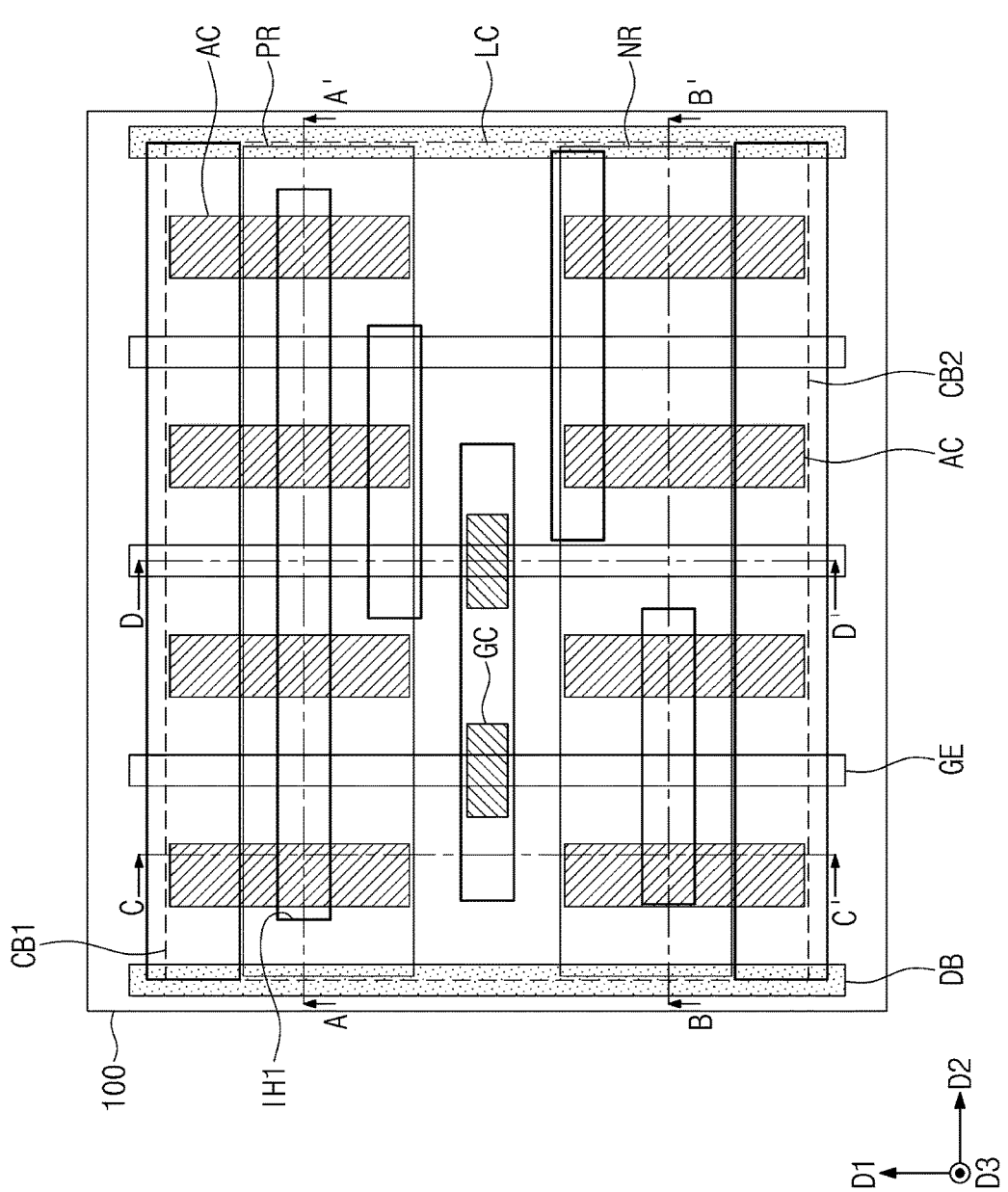
Figure 11A:
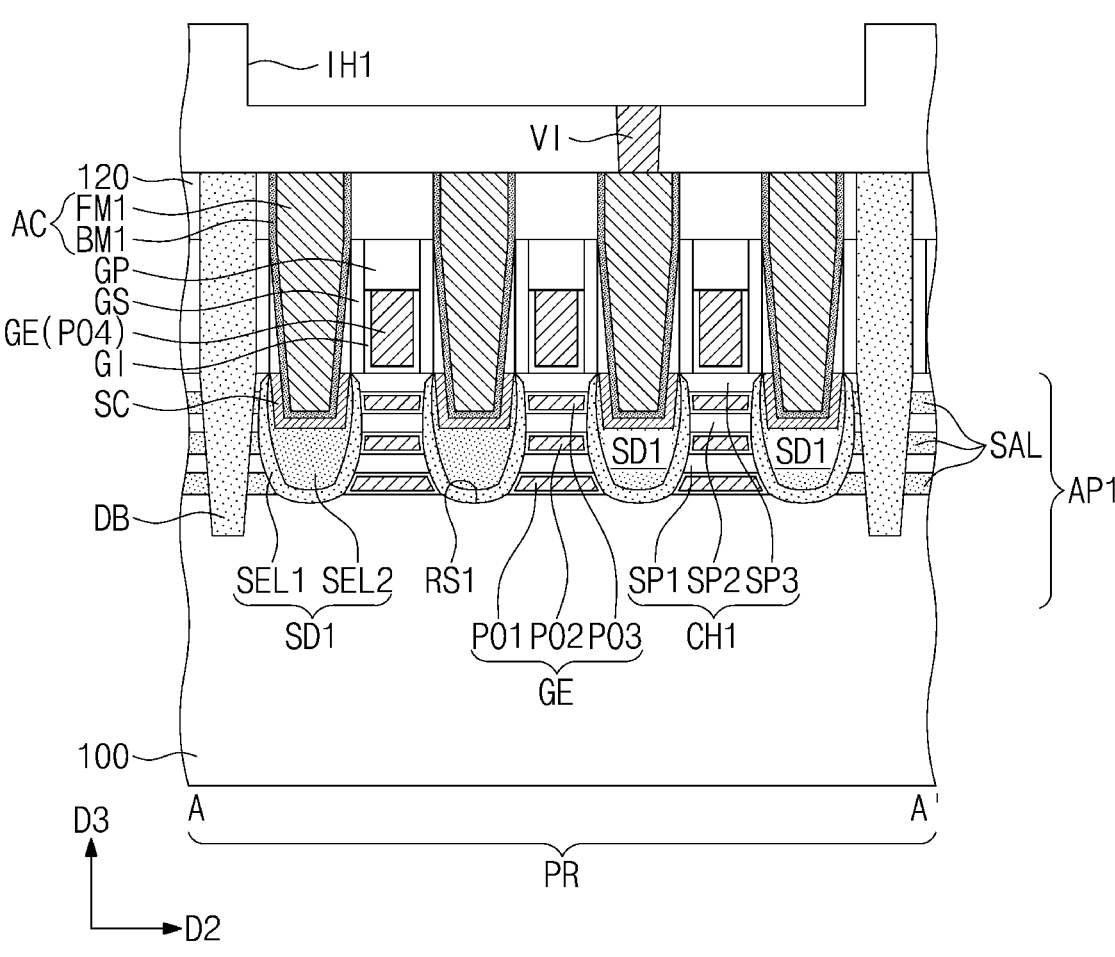
Figure 11B:
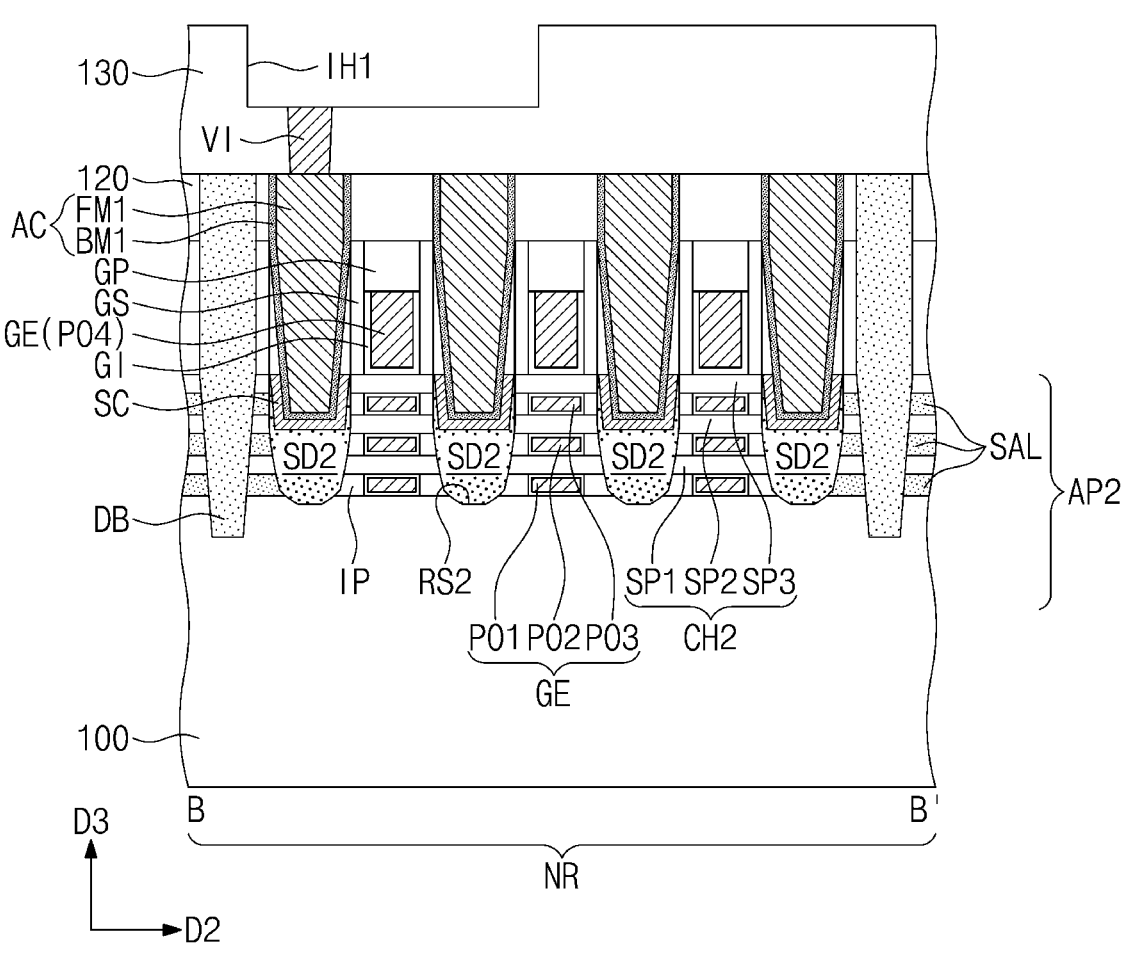
Figure 11C:
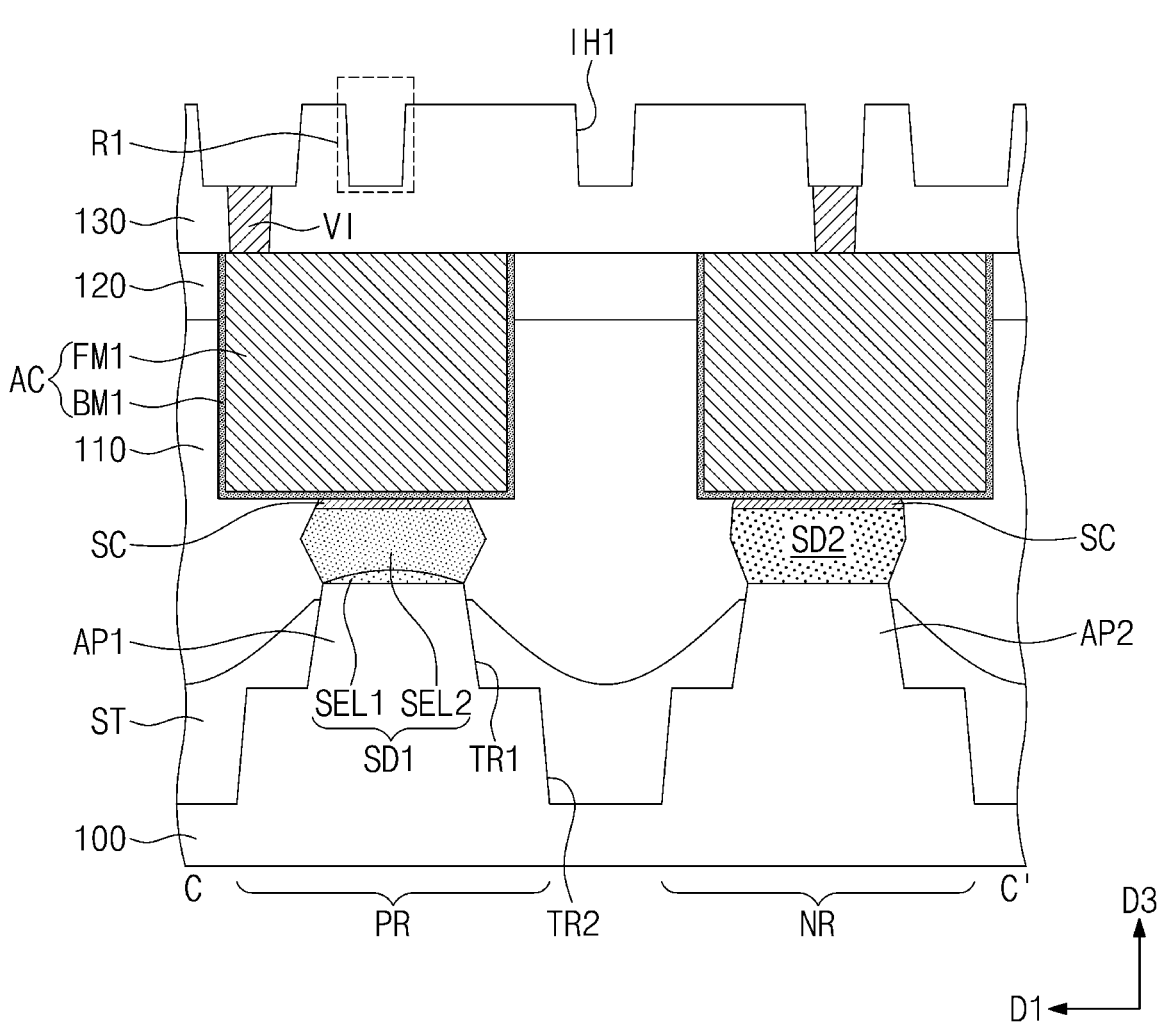
Figure 11D:
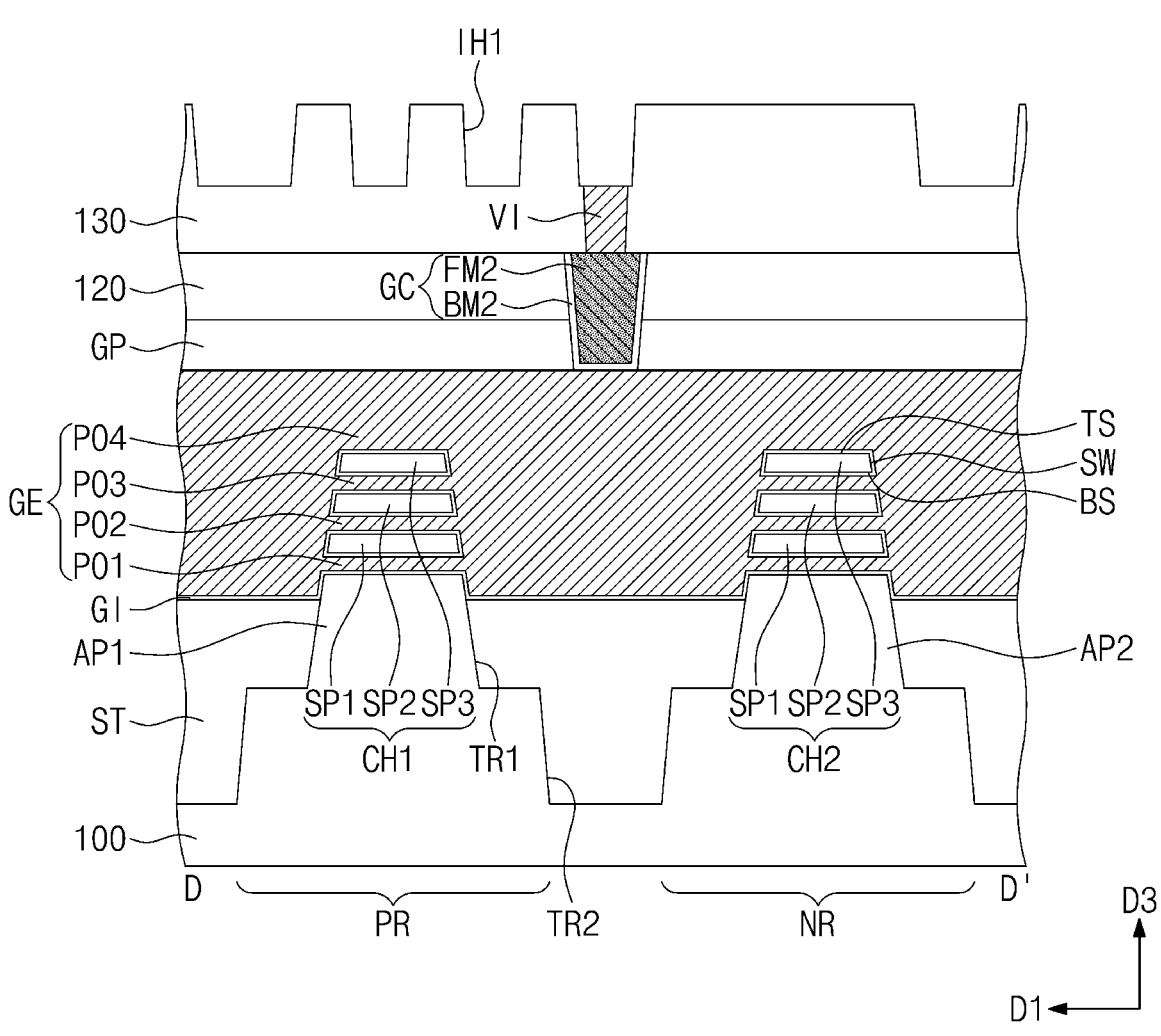

Referring to FIGS. 4, 5A and 5B, sacrificial layers SAL and active layers ACL may be alternately formed on a substrate 100. The sacrificial layers SAL may include one of silicon (Si), germanium (Ge) and silicon-germanium (SiGe), and the active layers ACL may include another of silicon (Si), germanium (Ge) and silicon-germanium (SiGe).

For example, the sacrificial layers SAL may include silicon-germanium (SiGe), and the active layers ACL may include silicon (Si). A concentration of germanium (Ge) of each of the sacrificial layers SAL may range from 10 at % to 30 at %.

The substrate 100 including a first active region PR and a second active region NR may be provided. The first active region PR and the second active region NR may form a logic cell LC on the substrate 100.

Mask patterns may be formed on the first active region PR and the second active region NR of the substrate 100, respectively. Each of the mask patterns may have a line shape or bar shape extending in the second direction D2.

A first patterning process may be performed using the mask patterns as etch masks to form a first trench TR1 defining a first active pattern AP1 and a second active pattern AP2. The first active pattern AP1 and the second active pattern AP2 may be formed on the first active region PR and the second active region NR, respectively. Each of the first active pattern AP and the second active pattern AP2 may include the sacrificial layers SAL and the active layers ACL, which are alternately stacked in its upper portion.

A second patterning process may be performed on the substrate 100 to form a second trench TR2 defining the first active region PR and the second active region NR. The second trench TR2 may be deeper than the first trench TR1.

A device isolation layer ST may be formed on the substrate 100 to fill the first and second trenches TR1 and TR2. For example, an insulating layer may be formed on the substrate 100 to cover the first and second active patterns AP1 and AP2. The device isolation layer ST may be formed by recessing the insulating layer until the sacrificial layers SAL are exposed.

The device isolation layer ST may include an insulating material (e.g., silicon oxide). An upper portion of each of the first and second active patterns AP1 and AP2 may be exposed above the device isolation layer ST. For example, the upper portion of each of the first and second active patterns AP1 and AP2 may vertically protrude above the device isolation layer ST.

Sacrificial patterns PP may be formed to intersect the first and second active patterns AP1 and AP2. The sacrificial patterns PP may have line shapes or bar shapes extending in the first direction D1. The sacrificial patterns PP may be arranged at a certain pitch in the second direction D2.

For example, the formation of the sacrificial patterns PP may include forming a sacrificial layer on an entire top surface of the substrate 100, forming hard mask patterns MA on the sacrificial layer, and patterning the sacrificial layer using the hard mask patterns MA as etch masks. The sacrificial layer may include poly-silicon.

A pair of gate spacers GS may be formed on both sidewalls of each of the sacrificial patterns PP, respectively.

The formation of the gate spacers GS may include conformally forming a gate spacer layer on an entire top surface of the substrate 100 and anisotropically etching the gate spacer layer. For example, the gate spacer layer may include at least one of SiCN, SiCON, or SiN. In certain embodiments, the gate spacer layer may be formed of a multi-layer including at least two of SiCN, SiCON, or SiN.

Referring to FIGS. 6 and 7A to 7D, first recesses RS1 may be formed in an upper portion of the first active pattern AP1. Second recesses RS2 may be formed in an upper portion of the second active pattern AP2. The device isolation layer ST at both sides of each of the first and second active patterns AP1 and AP2 may be recessed during the formation of the first and second recesses RS1 and RS2 (see FIG. 7C).

For example, the upper portion of the first active pattern AP1 may be etched using the hard mask patterns MA and the gate spacers GS as etch masks to form the first recesses RS1. The first recess RS1 may be formed between a pair of the sacrificial patterns PP. The second recesses RS2 of the upper portion of the second active pattern AP2 may be formed by the same method as the first recesses RS1.

First source/drain patterns SD1 may be formed in the first recesses RS1, respectively. For example, a first selective epitaxial growth (SEG) process may be performed using an inner surface of the first recess RS1 as a seed layer to form a first semiconductor layer SEL1. The first semiconductor layer SEL1 may be grown using first to third semiconductor patterns SP1, SP2 and SP3 and the substrate 100 exposed by the first recess RS1 as a seed. For example, the first SEG process may include a chemical vapor deposition (CVD) process or a molecular beam epitaxy (MBE) process.

The first semiconductor layer SEL1 may include a semiconductor element (e.g., SiGe) having a lattice constant that is greater than a lattice constant of a semiconductor element of the substrate 100. The first semiconductor layer SEL1 may contain a relatively low concentration of germanium (Ge). In certain embodiments, the first semiconductor layer SEL1 may contain silicon (Si) except germanium (Ge). A concentration of germanium (Ge) of the first semiconductor layer SEL1 may range from 0 at % to 10 at %.

A second SEG process may be performed on the first semiconductor layer SEL1 to form a second semiconductor layer SEL2. The second semiconductor layer SEL2 may be formed to completely fill the first recess RS1. The second semiconductor layer SEL2 may contain a relatively high concentration of germanium (Ge). For example, a concentration of germanium (Ge) of the second semiconductor layer SEL2 may range from 30 at % to 70 at %.

The first semiconductor layer SEL1 and the second semiconductor layer SEL2 may be included in the first source/drain pattern SD1. Dopants may be injected in-situ during the first and second SEG processes. In certain embodiments, the dopants may be injected or implanted into the first source/drain patterns SD1 after the formation of the first source/drain patterns SD1. The first source/drain pattern SD1 may be doped with the dopants to have a first conductivity type (e.g., a p-type).

Second source/drain patterns SD2 may be formed in the second recesses RS2, respectively. For example, the second source/drain pattern SD2 may be formed by performing a SEG process using an inner surface of the second recess RS2 as a seed layer. For example, the second source/drain patterns SD2 may include the same semiconductor element (e.g., silicon) as the substrate 100. The second source/drain patterns SD2 may be doped with dopants to have a second conductivity type (e.g., an n-type). Inner spacers IP may be formed between the second source/drain pattern SD2 and the sacrificial layers SAL, respectively.

Referring to FIGS. 8 and 9A to 9D, a first interlayer insulating layer 110 may be formed to cover the first and second source/drain patterns SD1 and SD2, the hard mask patterns MA, and the gate spacers GS. For example, the first interlayer insulating layer 110 may include a silicon oxide layer.

The first interlayer insulating layer 110 may be planarized to expose top surfaces of the sacrificial patterns PP. The planarization of the first interlayer insulating layer 110 may be performed using an etch-back process or a chemical mechanical polishing (CMP) process. The hard mask patterns MA may be completely removed during the planarization process. As a result, a top surface of the first interlayer insulating layer 110 may be substantially coplanar with the top surfaces of the sacrificial patterns PP and top surfaces of the gate spacers GS in the third direction D3.

The exposed sacrificial patterns PP may be selectively removed. First empty spaces exposing the first and second active patterns AP1 and AP2 may be formed by the removal of the sacrificial pattern PP. Some of the sacrificial patterns PP may not be removed. For example, a mask layer may be formed on the some of the sacrificial patterns PP which are not removed, and thus the some of the sacrificial patterns PP may not be removed but may remain. The sacrificial layers SAL of each of the first and second active patterns AP1 and AP2 may be exposed through the first empty space.

The sacrificial layers SAL exposed through the first empty space may be selectively removed. For example, an etching process of selectively etching the sacrificial layers SAL may be performed to remove the sacrificial layers SAL while leaving the first to third semiconductor patterns SP1, SP2 and SP3. The etching process may have a high etch rate with respect to silicon-germanium having a relatively high germanium concentration. For example, the etching process may have a high etch rate with respect to silicon-germanium having a germanium concentration greater than 10 at %.

The sacrificial layers SAL on the first active region PR and the second active region NR may be removed during the etching process. The etching process may be a wet etching process. An etching material used in the etching process may quickly remove the sacrificial layer SAL having a relatively high germanium concentration. The first source/drain pattern SD1 of the first active region PR may be protected by the first semiconductor layer SEL1 having the relatively low germanium concentration during the etching process.

Since the sacrificial layers SAL are selectively removed, the first to third semiconductor patterns SP1, SP2 and SP3 may remain on each of the first and second active patterns AP1 and AP2. Second empty spaces corresponding to regions formed by the removal of the sacrificial layers SAL may be formed. The second empty spaces may be formed between the first to third semiconductor patterns SP1, SP2 and SP3.

A gate insulating layer GI may be conformally formed in the first and second empty spaces. A gate electrode GE may be formed on the gate insulating layer GI. The gate electrode GE may be formed to fill the first and second empty spaces. Particularly, the gate electrode GE may include first to third portions PO1, PO2 and PO3 filling the second empty spaces. The gate electrode GE may further include a fourth portion PO4 filling the first empty space. A gate capping pattern GP may be formed on the gate electrode GE.

A second interlayer insulating layer 120 may be formed on the first interlayer insulating layer 110. The second interlayer insulating layer 120 may include a silicon oxide layer. Active contacts AC may be formed to penetrate the second interlayer insulating layer 120 and the first interlayer insulating layer 110, and the active contacts AC may be electrically connected to the first and second source/drain patterns SD1 and SD2. A gate contact GC may be formed to penetrate the second interlayer insulating layer 120 and the gate capping pattern GP, and the gate contact GC may be electrically connected to the gate electrode GE.

A pair of isolation structures DB may be formed at both sides of the logic cell LC, respectively. The isolation structure DB may penetrate the second interlayer insulating layer 120, the remaining sacrificial pattern PP, and an upper portion of the active pattern AP1 or AP2 under the remaining sacrificial pattern PP. The isolation structure DB may include an insulating material such as silicon oxide or silicon nitride.

Referring to FIGS. 10 and 11A to 11D, a third interlayer insulating layer 130 may be formed on the active contacts AC and the gate contacts GC. Vias VI may be formed in the third interlayer insulating layer 130. First interconnection line holes IH1 exposing top surfaces of the vias VI may be formed in the third interlayer insulating layer 130. The first interconnection lines ML1 described with reference to FIGS. 2A to 2D may be formed in the first interconnection line holes IH1.

Figure 12A:
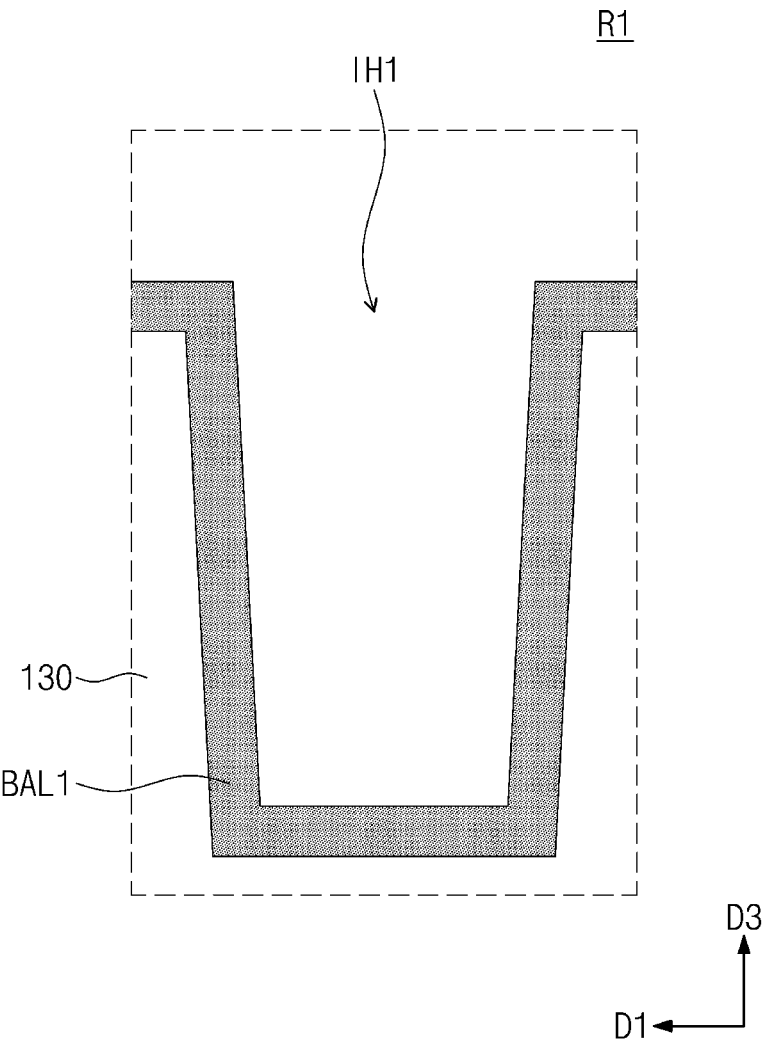
FIGS. 12A to 12D are enlarged cross-sectional views of a region 'R1' of FIG. 11C to illustrate a method of forming a first interconnection line.

A method of forming the first interconnection line will be described in more detail with reference to FIGS. 12A to 12D. Referring to FIG. 12A, a first barrier layer BAL1 may be conformally formed in the first interconnection line hole IH1. The first barrier layer BAL1 may include a metal layer/a metal nitride layer. The first barrier layer BAL1 may be conformally formed along inner sidewalls and a bottom surface of the first interconnection line hole IH1 and a top surface of the third interlayer insulating layer 130.

Figure 12B:
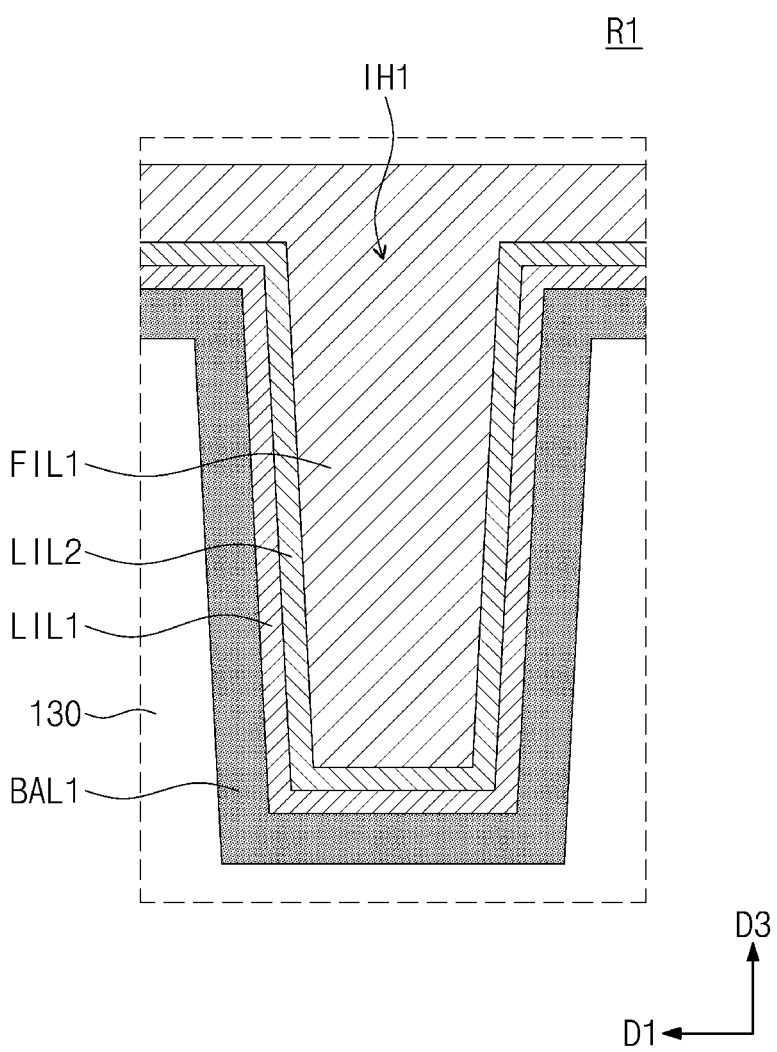

Referring to FIG. 12B, a first liner layer LIL1 may be conformally formed on the first barrier layer BALL. For example, the first liner layer LIL1 may be formed using an atomic layer deposition (ALD) process. The first liner layer LIL1 may include ruthenium (Ru). A second liner layer LIL2 may be conformally formed on the first liner layer LIL1. For example, the second liner layer LIL2 may be formed using an atomic layer deposition (ALD) process. The second liner layer LIL2 may include cobalt (Co). A first conductive layer FIL1 may be formed on the second liner layer LIL2. The first conductive layer FIL1 may fill a remaining portion of the first interconnection line hole IH1. The first conductive layer FIL1 may include a metal material. For example, the first conductive layer FIL1 may include copper (Cu).

Figure 12C:
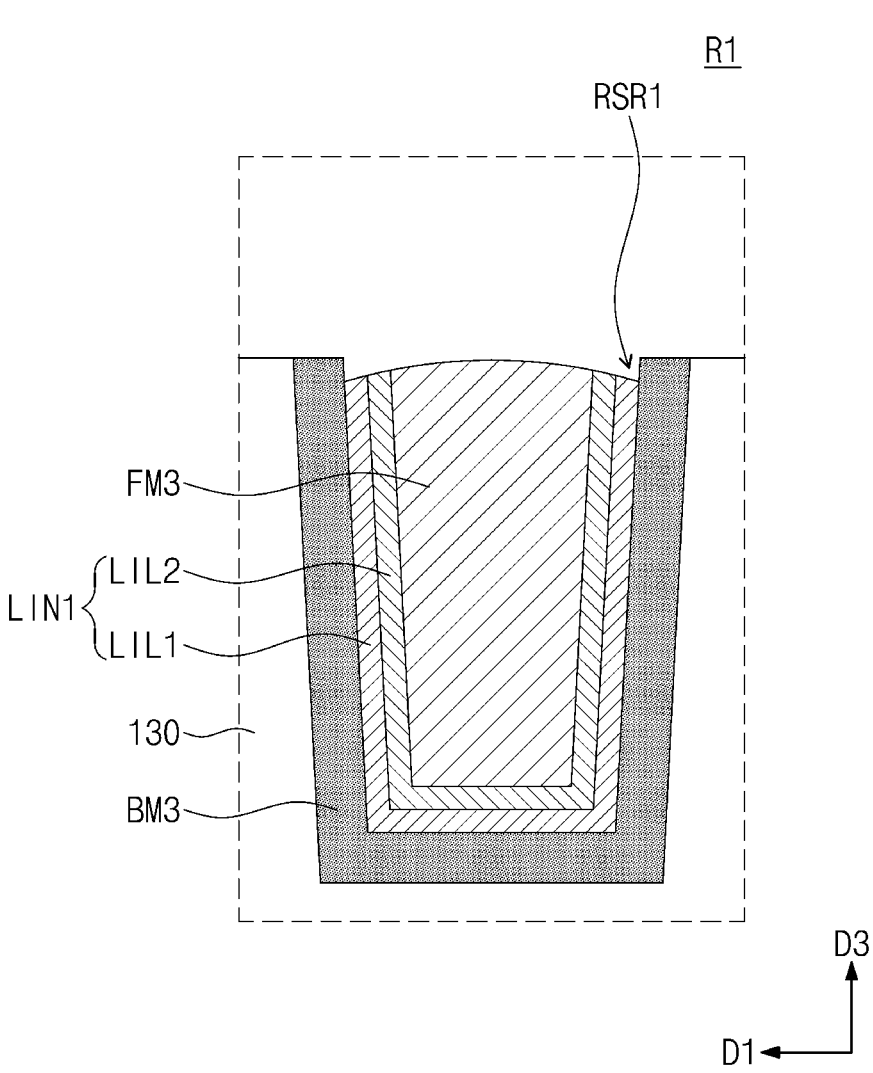

Referring to FIG. 12C, a planarization process may be performed to etch the first conductive layer FIL1, the second liner layer LIL2, the first liner layer LIL1, and the first barrier layer BAL1. The first barrier layer BAL1 may be etched to form a third barrier pattern BM3. The etched first liner layer LIL1 and the etched second liner layer LIL2 may constitute a first liner LIN1. The first conductive layer FIL1 may be etched to form a third conductive pattern FM3. The planarization process may be performed until a top surface of the third barrier pattern BM3 is coplanar with the top surface of the third interlayer insulating layer 130 in the third direction D3.

In the planarization process, an upper portion of the third conductive pattern FM3 and an upper portion of the first liner LIN1 may be further recessed to form a first recess region RSR1. Thus, a top surface of the first liner LIN1 and a top surface of the third conductive pattern FM3 may have curved profiles.

Figure 12D:
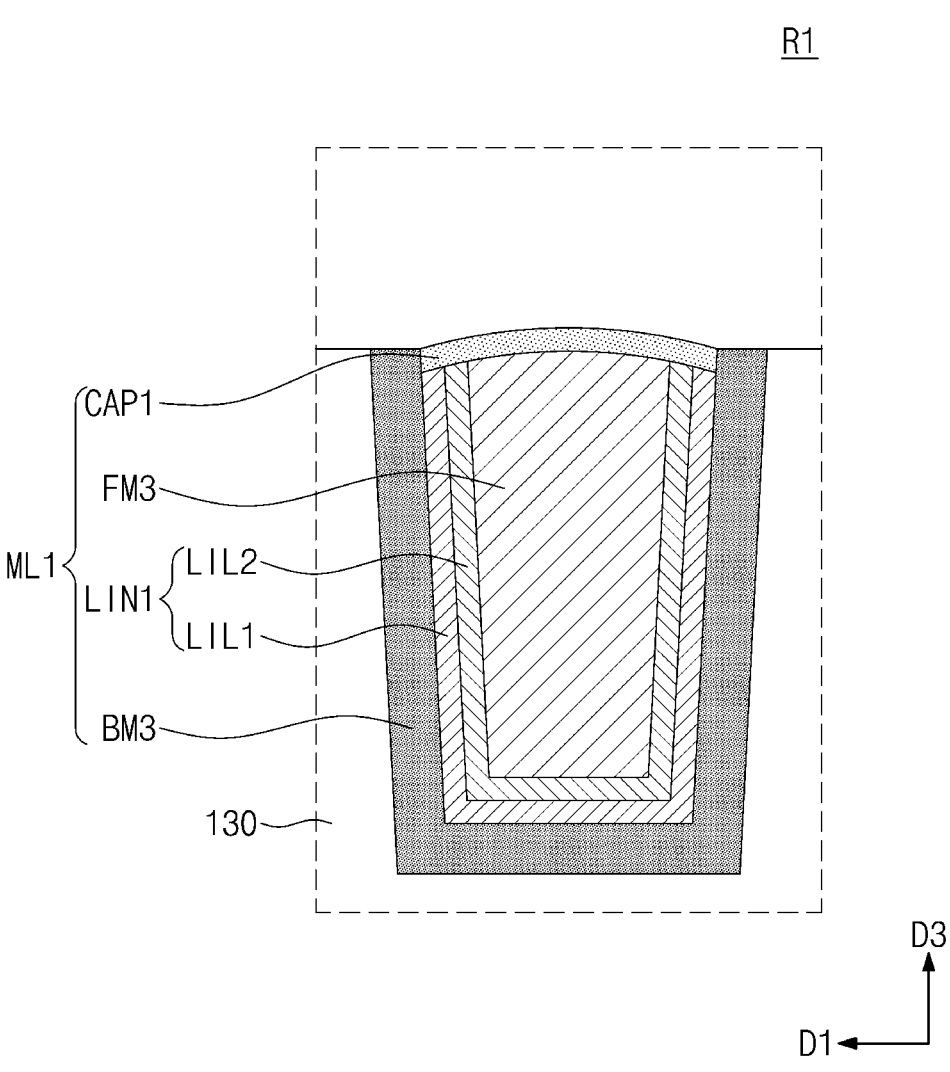
Figure 13:
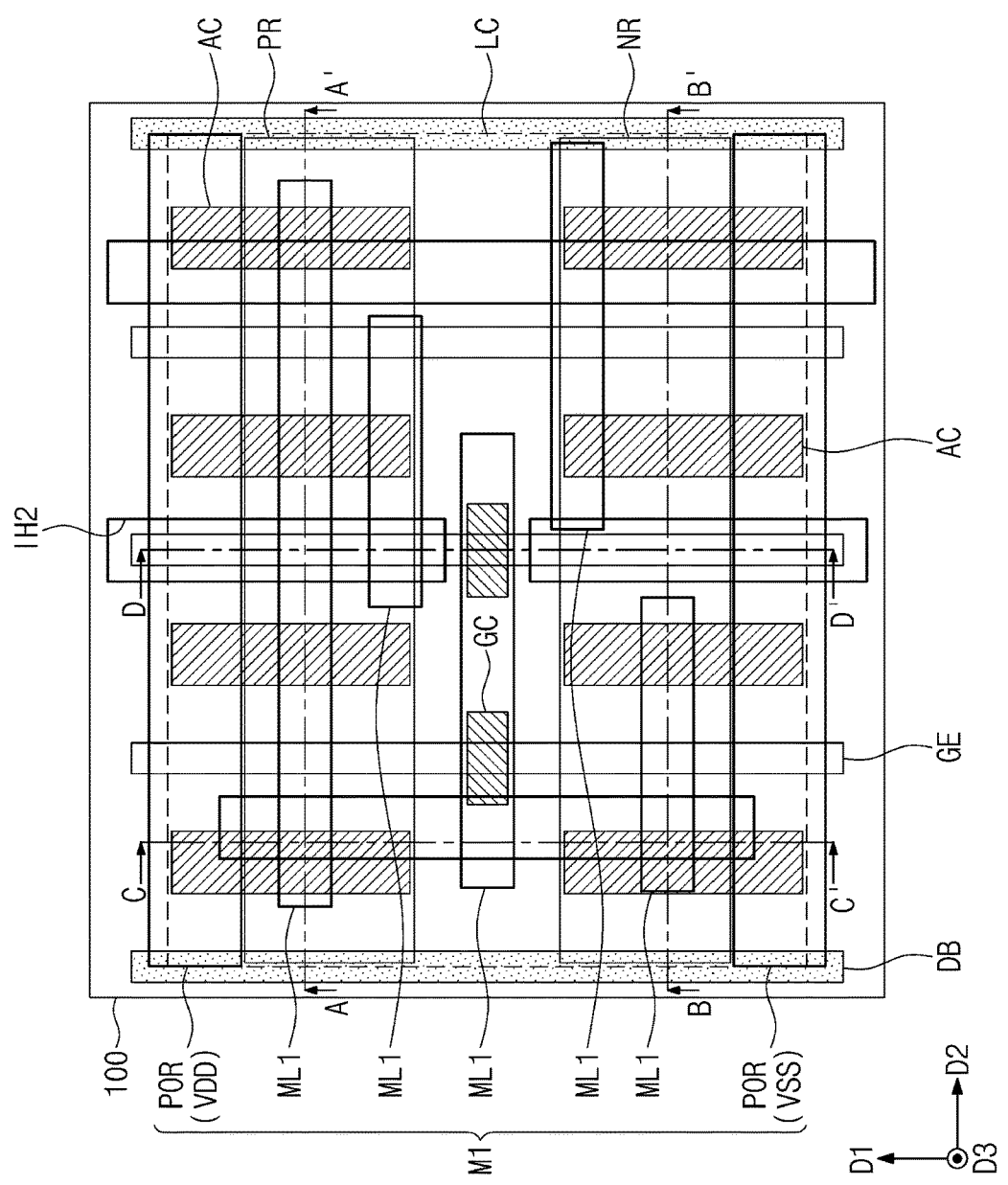
Figure 14A:
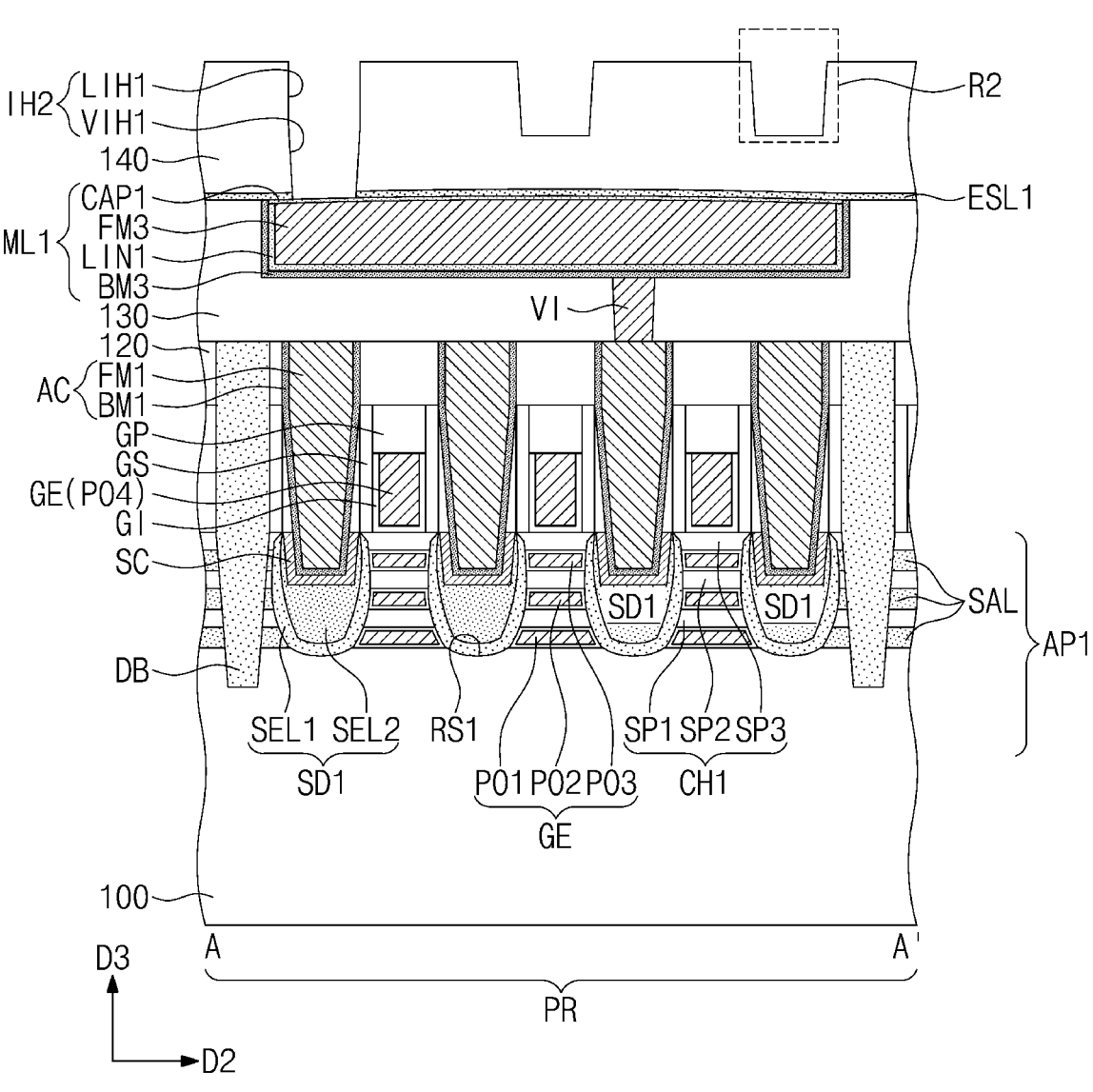
Figure 14B:
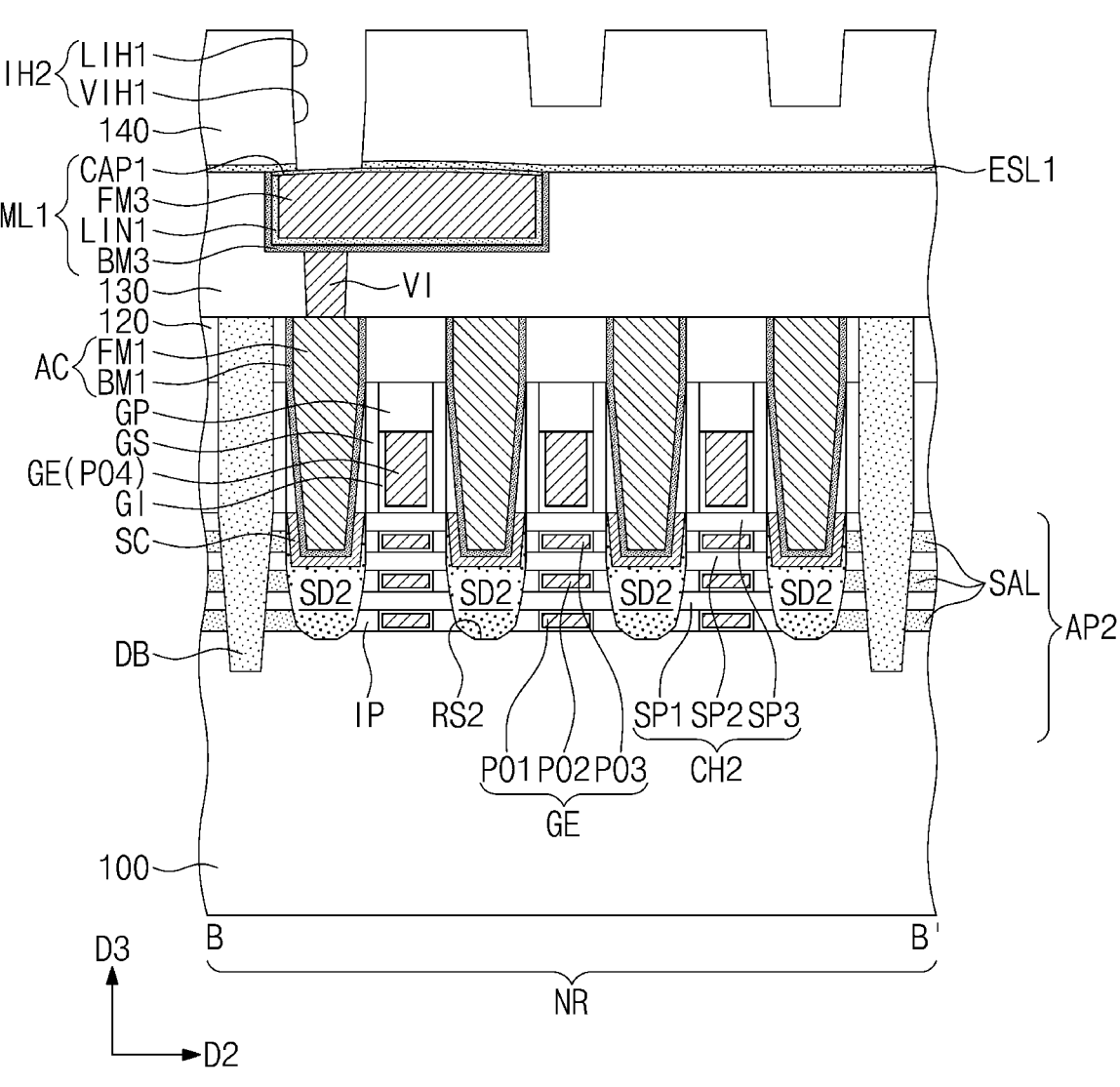
Figure 14C:
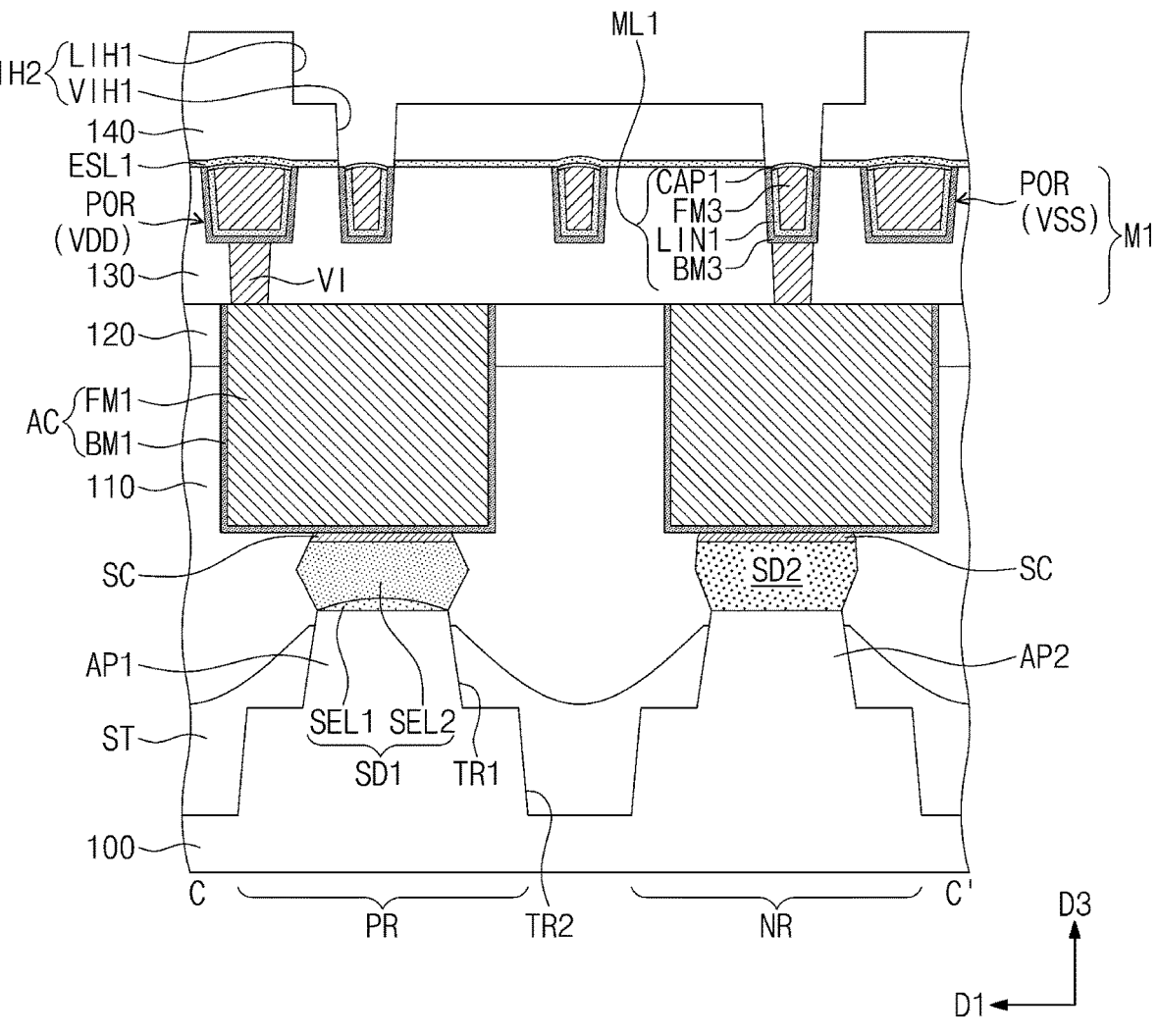
Figure 14D:
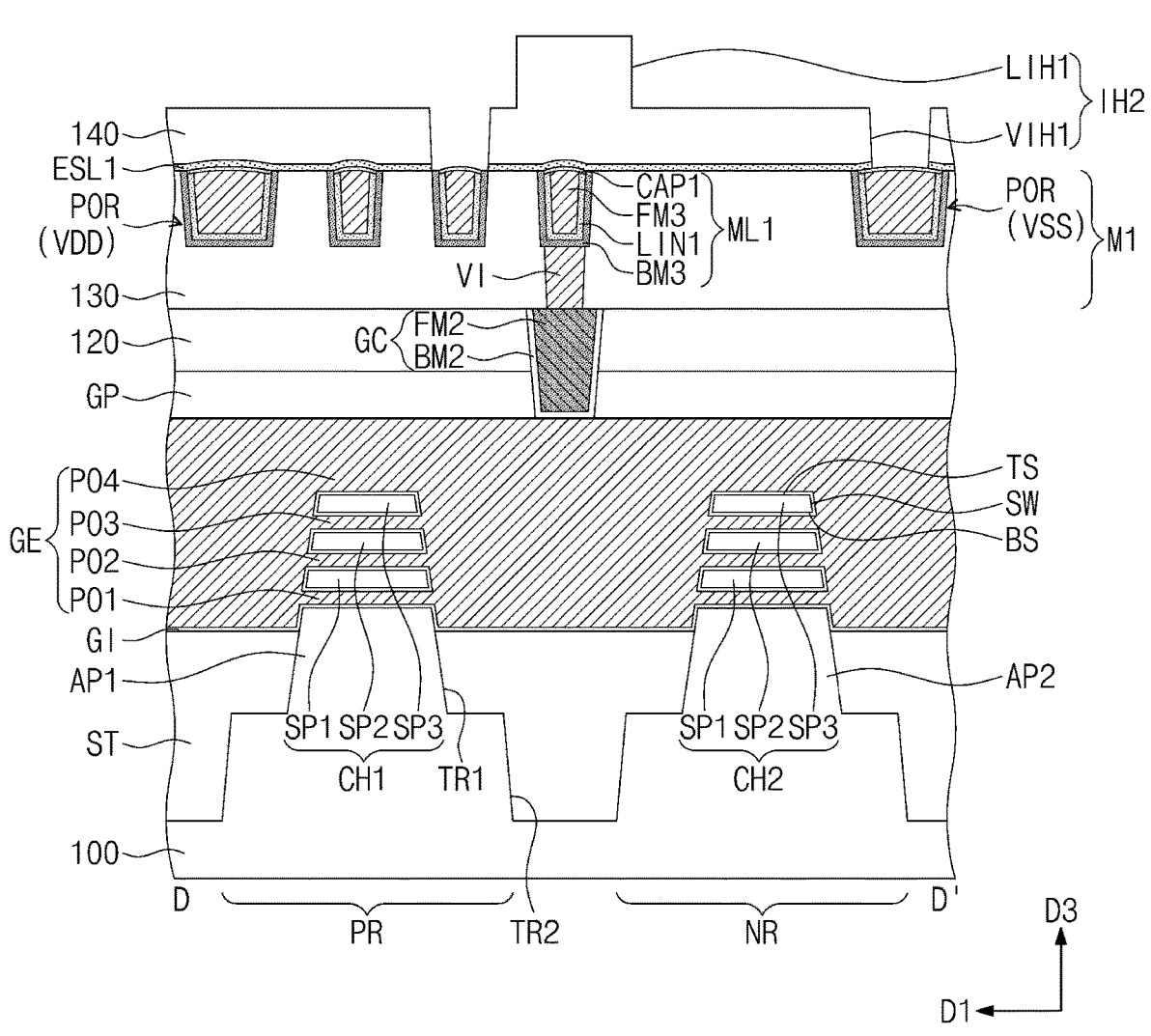

Referring to FIG. 12D, a first capping pattern CAP1 may be formed on the third conductive pattern FM3 and the first liner LIN1. For example, the first capping pattern CAP may be formed using an atomic layer deposition (ALD) process. The first capping pattern CAP1 may include ruthenium (Ru), cobalt (Co), or graphene. The first capping pattern CAP1 may have a profile corresponding to the top surface of the first liner LIN1 and the top surface of the third conductive pattern FM3.

In a subsequent process, ruthenium (Ru) of the first liner layer LIL1 and cobalt (Co) of the second liner layer LIL2 may chemically react with each other to form a ruthenium cobalt (RuCo) compound. A high-temperature process may be performed when a fourth interlayer insulating layer 140 and a second metal layer M2 to be described later are formed, and ruthenium (Ru) of the first liner layer LIL1 may chemically react with cobalt (Co) of the second liner layer LIL2 in this process. Thus, an interface between the first liner layer LIL1 and the second liner layer LIL2 may not be visible unlike FIG. 12D.

Referring to FIGS. 13 and 14A to 14D, a first etch stop layer ESL1 may be formed to cover the first metal layer M1. A fourth interlayer insulating layer 140 may be formed on the first etch stop layer ESL1. Second interconnection line holes IH2 may be formed in the fourth interlayer insulating layer 140. The second interconnection line hole IH2 may include a first line hole LIH1 extending in the first direction D1, and a first via hole VIH1 further recessed from the first line hole LIH1 to expose the first metal layer M1. The first via hole VIH1 may penetrate the first etch stop layer ESL1. The second interconnection lines ML2 described with reference to FIGS. 2A to 2D may be formed in the second interconnection line holes IH2.

A method of forming the second interconnection line will be described in more detail with reference to FIGS. 15A to 15C. Referring to FIG. 15A, a second barrier layer BAL2 may be conformally formed in the second interconnection line hole IH2. The second barrier layer BAL2 may include a metal layer/a metal nitride layer. The second barrier layer BAL2 may be conformally formed along a bottom surface and inner sidewalls of the second interconnection line hole IH2 and a top surface of the fourth interlayer insulating layer 140. The second barrier layer BAL2 may also be conformally formed on the first capping pattern CAP1 (see FIG. 3A). This may be due to the first recess region RSR1 not being relatively deep.

A third liner layer LIL3 may be conformally formed on the second barrier layer BAL2. The third liner layer LIL3 may include cobalt (Co). For example, the third liner layer LIL3 may be formed using an atomic layer deposition (ALD) process. A second conductive layer FIL2 may be formed on the third liner layer LIL3. The second conductive layer FIL2 may fill a remaining portion of the second interconnection line hole IH2. The second conductive layer FIL2 may include a metal material (e.g., copper).

Referring to FIG. 15B, a planarization process may be performed to etch the second conductive layer FIL2, the third liner layer LIL3, and the second barrier layer BAL2. The second barrier layer BAL2 may be etched to form a fourth barrier pattern BM4. The third liner layer LIL3 may be etched to form a second liner LIN2. The second conductive layer FIL2 may be etched to form a fourth conductive pattern FM4. The planarization process may be performed until a top surface of the fourth barrier pattern BM4 is coplanar with the top surface of the fourth interlayer insulating layer 140 in the third direction D3.

In the planarization process, an upper portion of the fourth conductive pattern FM4 and an upper portion of the second liner LIN2 may be further recessed to form a second recess region RSR2. Thus, a top surface of the second liner LIN2 and a top surface of the fourth conductive pattern FM4 may have curved profiles. The second recess region RSR2 may be deeper than the first recess region RSR1 described with reference to FIG. 12C. This may be due to the amount of ruthenium recessed in the planarization process being less than the amount of cobalt recessed in the planarization process.

Referring to FIG. 15C, a second capping pattern CAP2 may be formed on the fourth conductive pattern FM4 and the second liner LIN2. For example, the second capping pattern CAP2 may be formed using an atomic layer deposition (ALD) process. For example, the second capping pattern CAP2 may include the same material as the first capping pattern CAP1. The second capping pattern CAP2 may have a profile corresponding to the top surface of the second liner LIN2 and the top surface of the fourth conductive pattern FM4.

A second etch stop layer ESL2 may be formed to cover a top surface of the second interconnection line ML2 and the top surface of the fourth interlayer insulating layer 140. A fifth interlayer insulating layer 150 may be formed on the second etch stop layer ESL2. A third interconnection line hole IH3 exposing the second interconnection line ML2 may be formed in the fifth interlayer insulating layer 150. A third barrier layer BAL3 may be conformally formed in the third interconnection line hole IH3. The third barrier layer BAL3 may be conformally formed along a bottom surface and inner sidewalls of the third interconnection line hole IH3. A void VD may be formed between the third barrier layer BAL3 and the second interconnection line ML2. This may be due to the second recess region RSR2 being relatively deep such that the third barrier layer BAL3 is not uniformly deposited along a top surface of the second capping pattern CAP2.

Referring again to FIGS. 1, 2A to 2D, 3A and 3B, a third metal layer M3 may be formed in the fifth interlayer insulating layer 150. A sixth interlayer insulating layer 160 may be formed on the fifth interlayer insulating layer 150. A fourth metal layer M4 may be formed in the sixth interlayer insulating layer 160. Methods of forming the third metal layer M3 and the fourth metal layer M4 may be substantially the same as the method of forming the second metal layer M2.

Figure 16A:
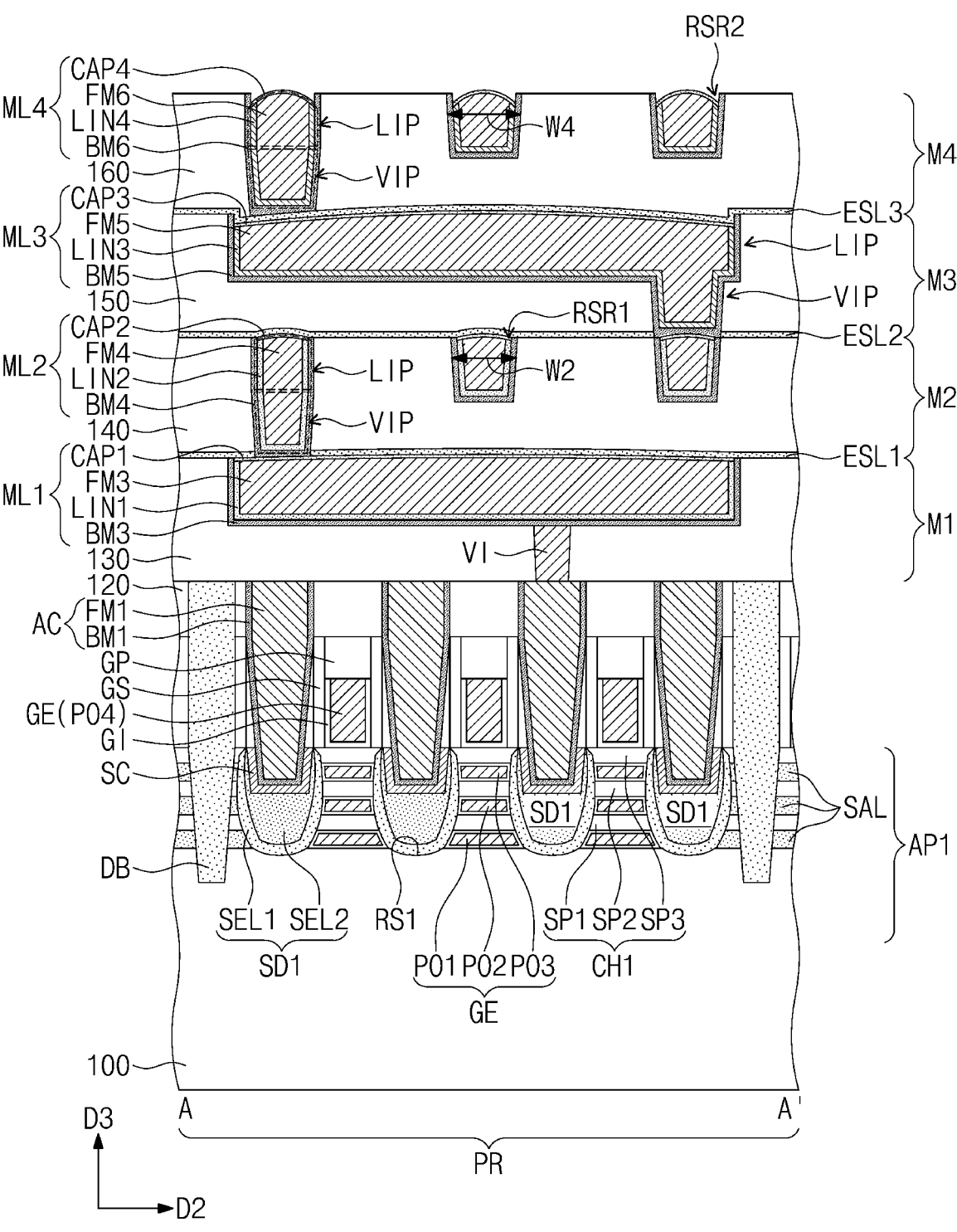
FIGS. 16A and 16B are cross-sectional views taken along the lines A-A' and C-C' of FIG. 1, respectively, to illustrate a semiconductor device according to some embodiments.
Figure 16B:
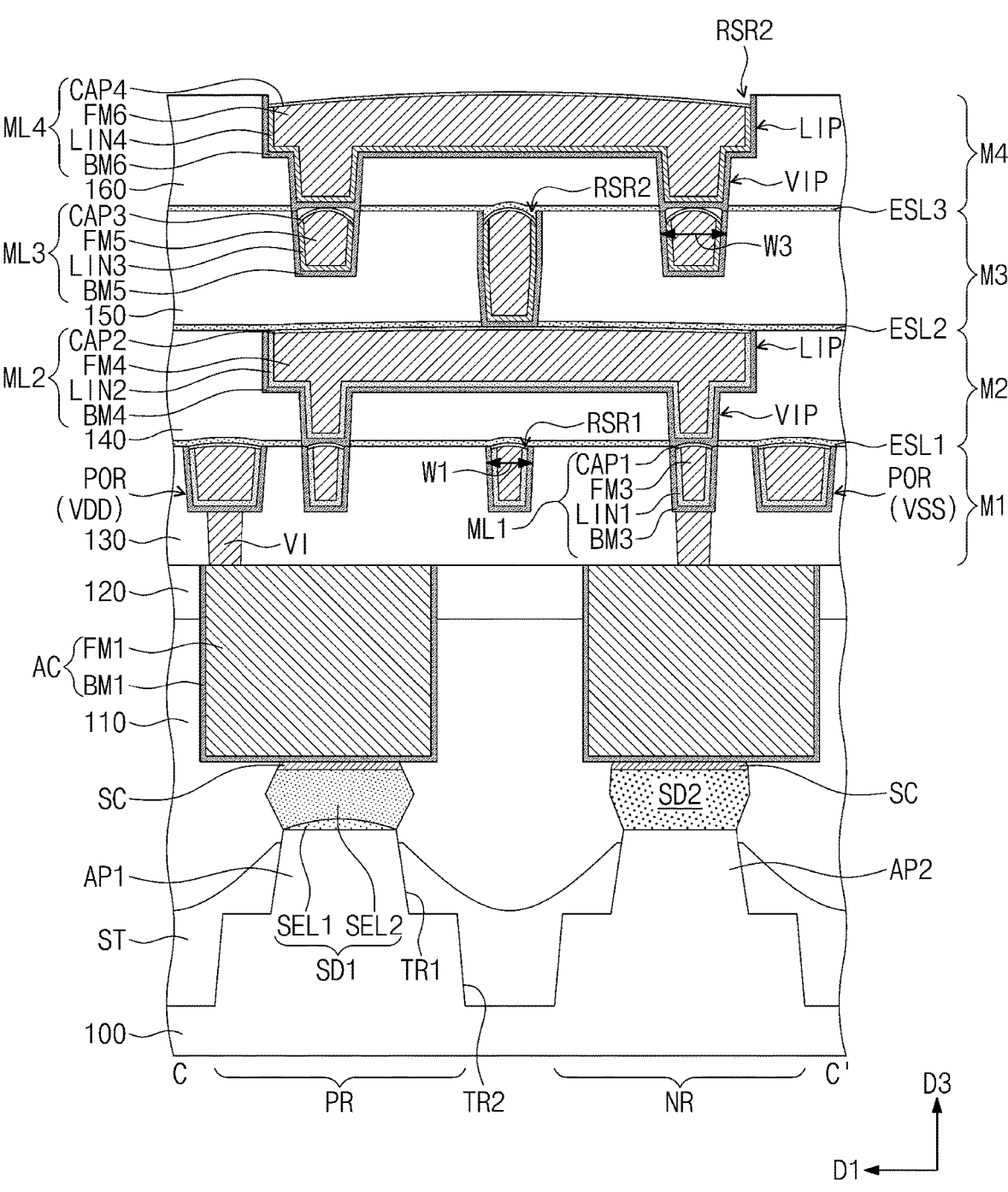

FIGS. 16A and 16B are cross-sectional views taken along the lines A-A' and C-C' of FIG. 1, respectively, to illustrate a semiconductor device according to some embodiments. In the embodiments, the descriptions to the same components and features as in the above embodiments of FIGS. 1, 2A to 2D, 3A and 3B will be omitted and differences between the embodiments and the above embodiments of FIGS. 1, 2A to 2D, 3A and 3B will be mainly described for the purpose of ease and convenience in explanation.

Referring to FIGS. 1, 16A and 16B, the second liner LIN2 may include the ruthenium cobalt (RuCo) compound. An upper portion of the fourth conductive pattern FM4 and an upper portion of the second liner LIN2 may be recessed to form the first recess region RSR1. The second recess region RSR2 may be deeper than the first recess region RSR1.

Figure 17A:
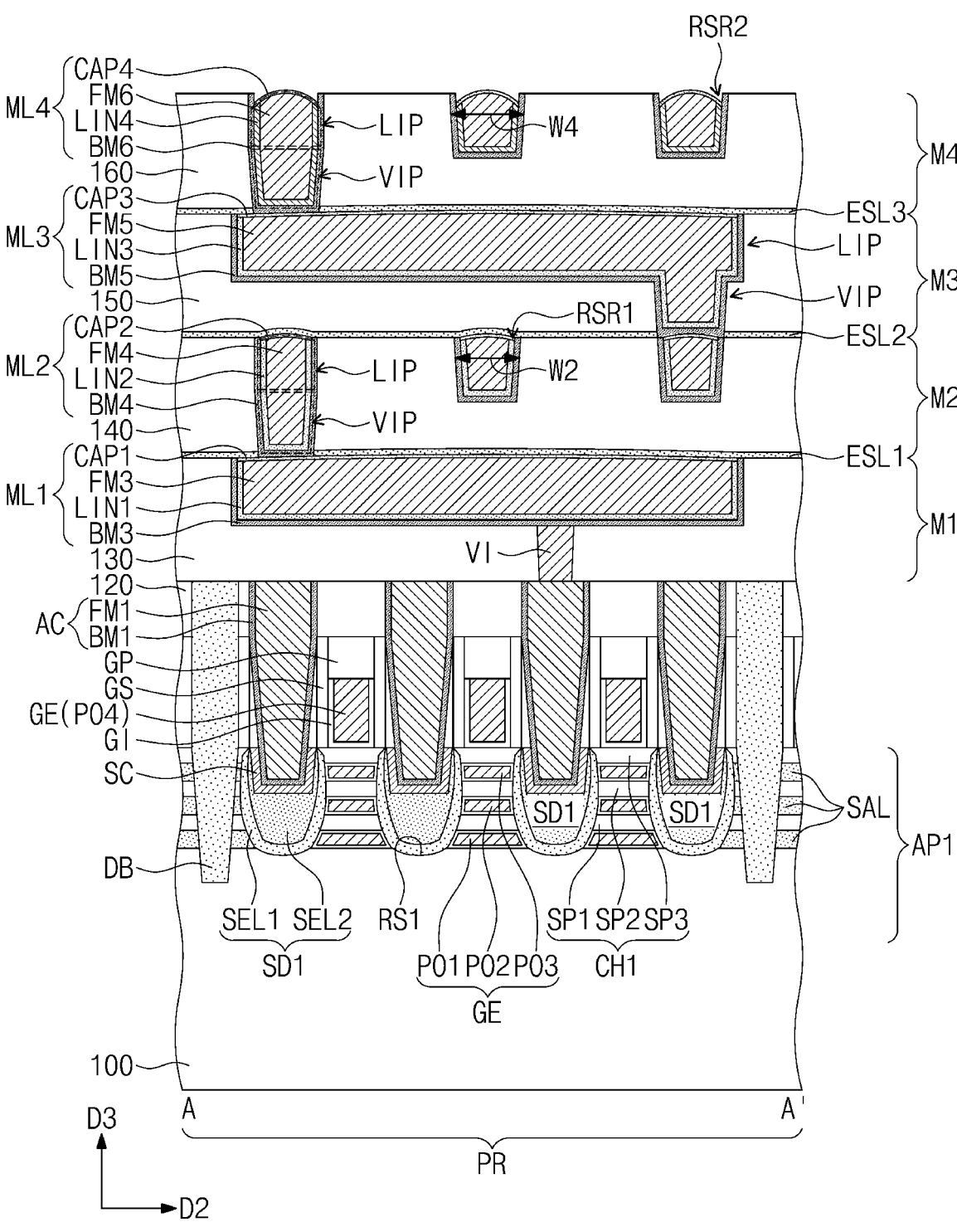
FIGS. 17A and 17B are cross-sectional views taken along the lines A-A' and C-C' of FIG. 1, respectively, to illustrate a semiconductor device according to some embodiments.
Figure 17B:
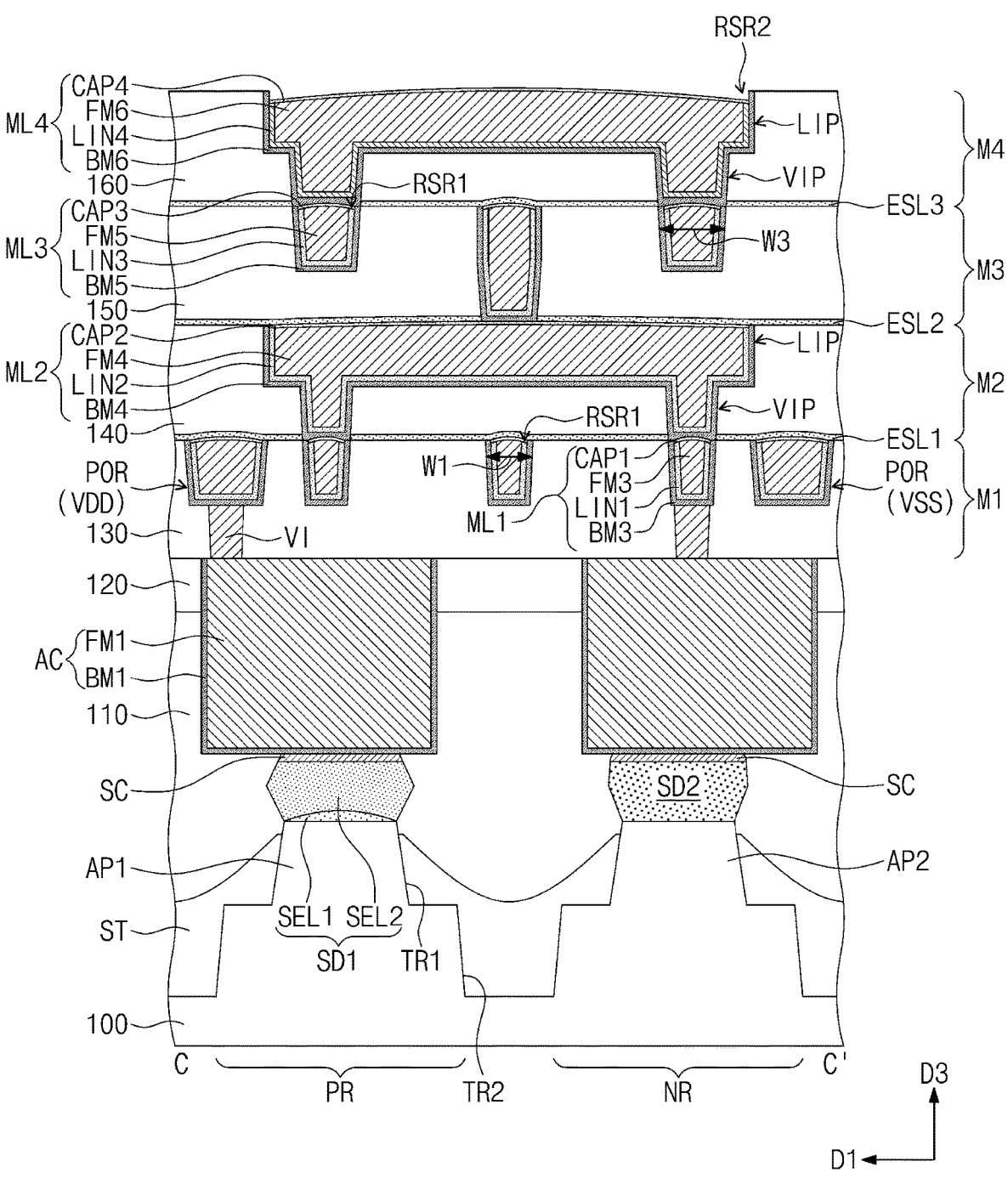

FIGS. 17A and 17B are cross-sectional views taken along the lines A-A' and C-C' of FIG. 1, respectively, to illustrate a semiconductor device according to some embodiments. In the embodiments, the descriptions to the same components and features as in the above embodiments of FIGS. 1, 2A to 2D, 3A and 3B will be omitted and differences between the embodiments and the above embodiments of FIGS. 1, 2A to 2D, 3A and 3B will be mainly described for the purpose of ease and convenience in explanation.

Referring to FIGS. 1, 17A and 17B, each of the second liner LIN2 and the third liner LIN3 may include the ruthenium cobalt (RuCo) compound. An upper portion of the fourth conductive pattern FM4 and an upper portion of the second liner LIN2 may be recessed to form the first recess region RSR1. An upper portion of the fifth conductive pattern FM5 and an upper portion of the third liner LIN3 may be recessed to form the first recess region RSR1. The second recess region RSR2 may be deeper than the first recess region RSR1.

Figure 18A:
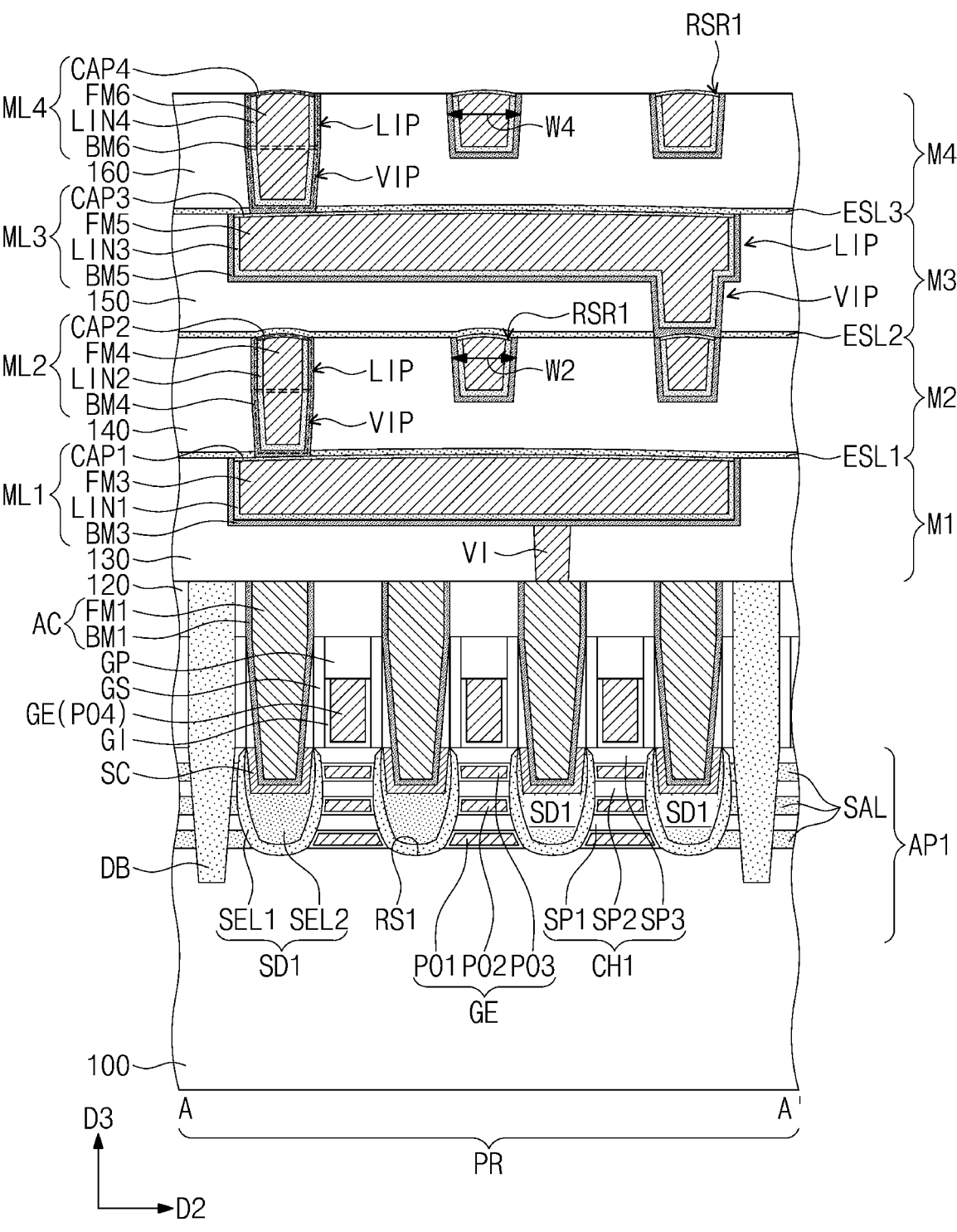
FIGS. 18A and 18B are cross-sectional views taken along the lines A-A' and C-C' of FIG. 1, respectively, to illustrate a semiconductor device according to some embodiments.
Figure 18B:
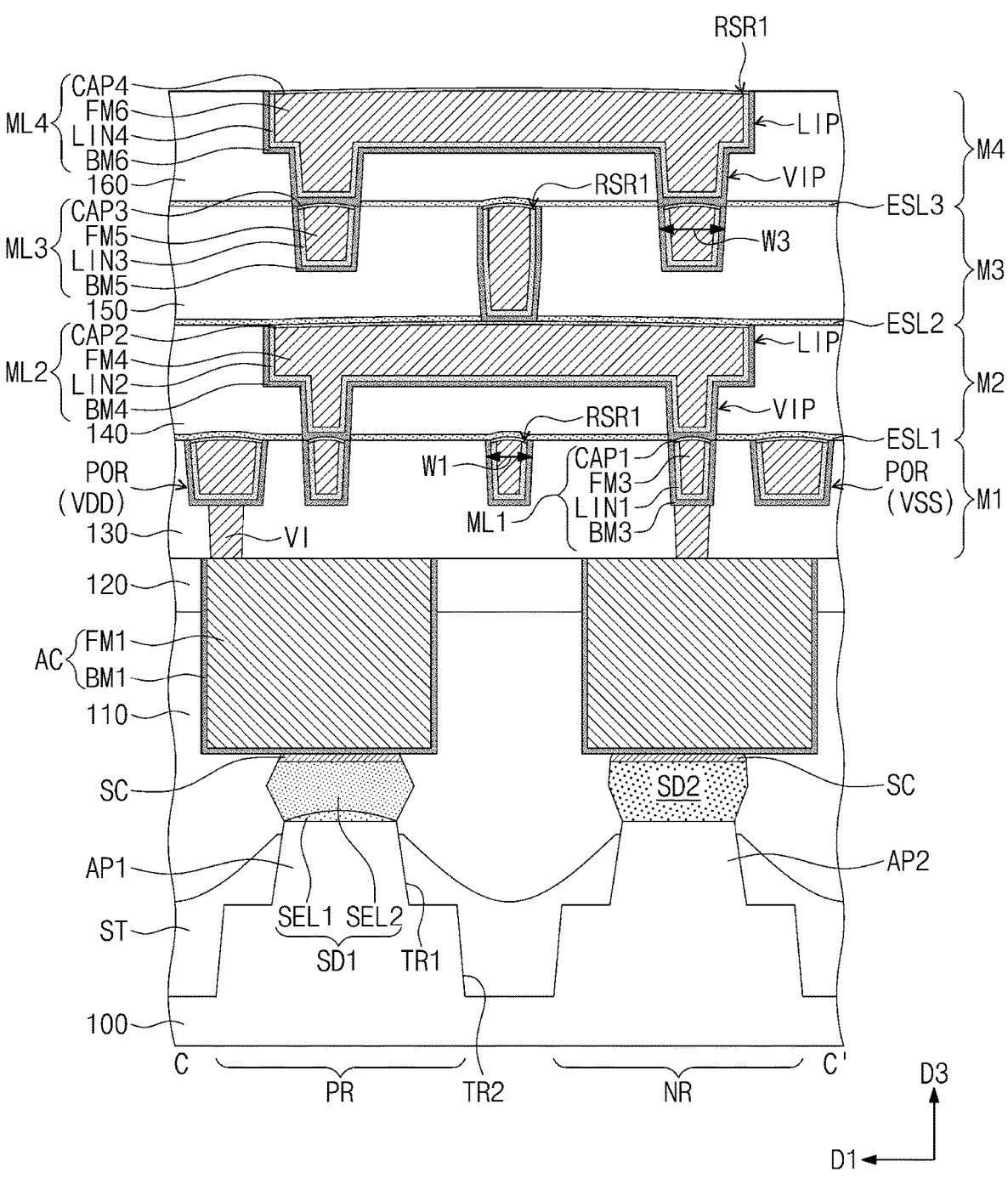

FIGS. 18A and 18B are cross-sectional views taken along the lines A-A' and C-C' of FIG. 1, respectively, to illustrate a semiconductor device according to some embodiments. In the embodiments, the descriptions to the same components and features as in the above embodiments of FIGS. 1, 2A to 2D, 3A and 3B will be omitted and differences between the embodiments and the above embodiments of FIGS. 1, 2A to 2D, 3A and 3B will be mainly described for the purpose of ease and convenience in explanation.

Referring to FIGS. 1, 18A and 18B, each of the second liner LIN2, the third liner LIN3 and the fourth liner LIN4 may include the ruthenium cobalt (RuCo) compound. An upper portion of the fourth conductive pattern FM4 and an upper portion of the second liner LIN2 may be recessed to form the first recess region RSR1. An upper portion of the fifth conductive pattern FM5 and an upper portion of the third liner LIN3 may be recessed to form the first recess region RSR1. An upper portion of the sixth conductive pattern FM6 and an upper portion of the fourth liner LIN4 may be recessed to form the first recess region RSR1.

Figure 19A:
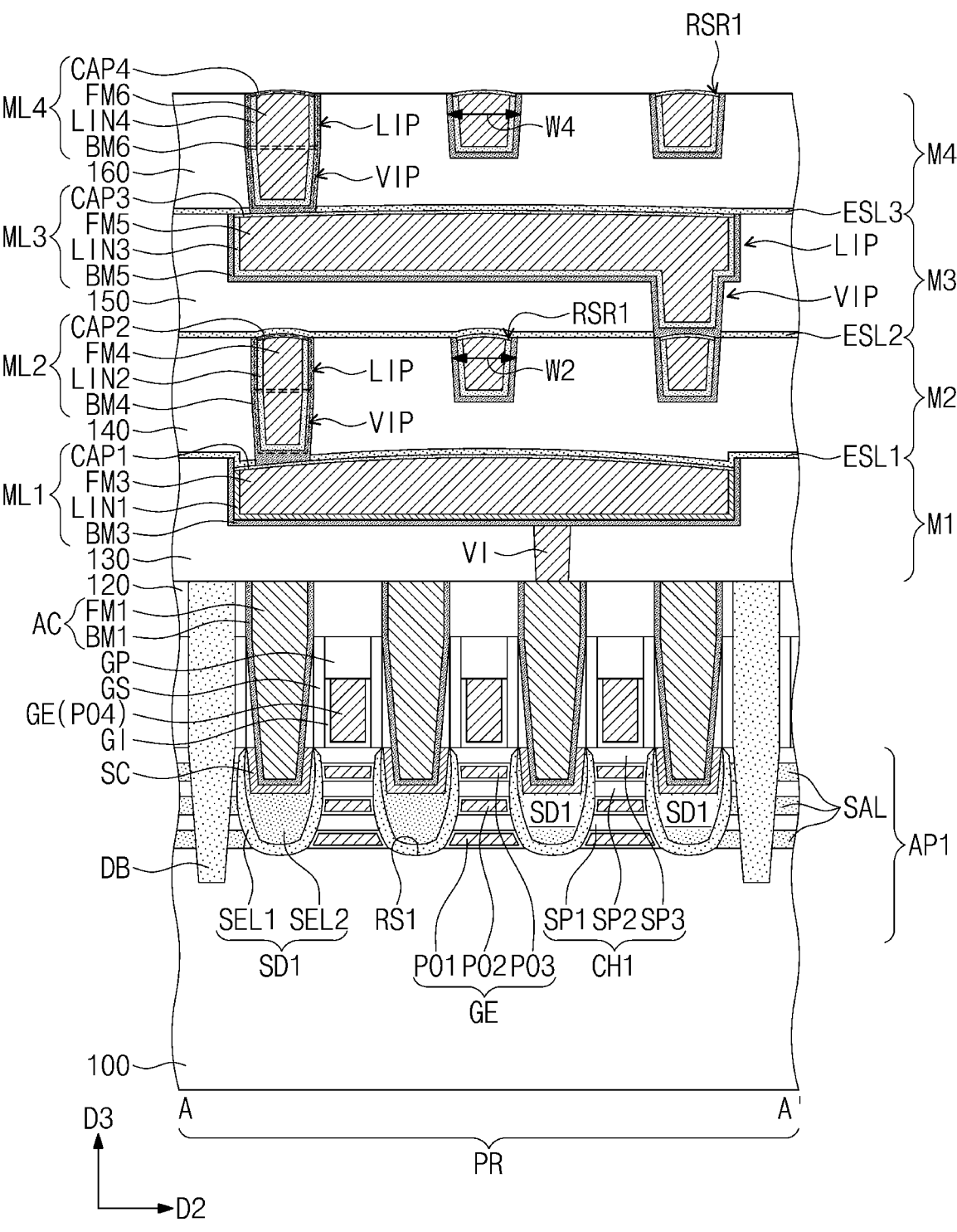
FIGS. 19A and 19B are cross-sectional views taken along the lines A-A' and C-C' of FIG. 1, respectively, to illustrate a semiconductor device according to some embodiments.
Figure 19B:
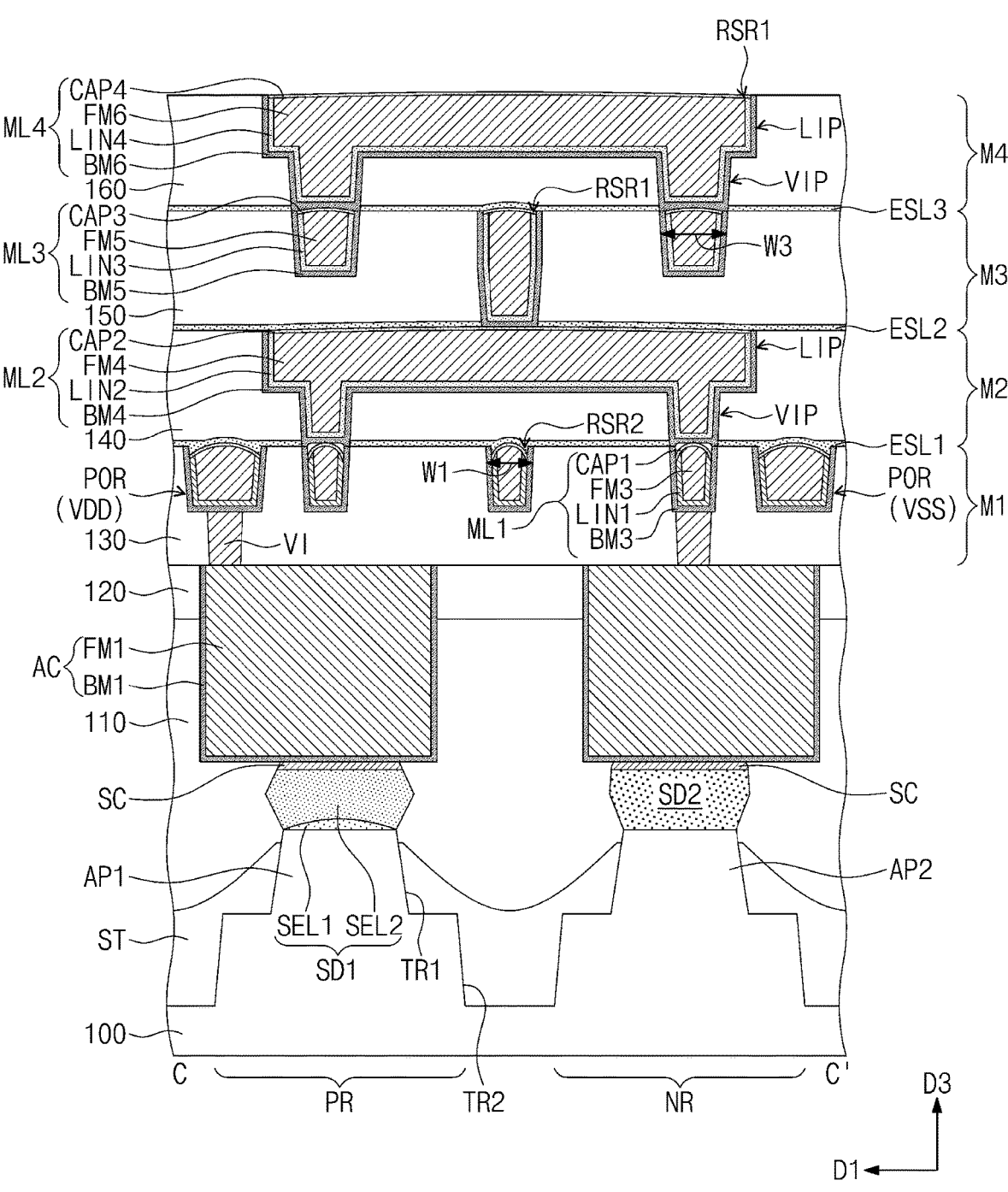

FIGS. 19A and 19B are cross-sectional views taken along the lines A-A' and C-C' of FIG. 1, respectively, to illustrate a semiconductor device according to some embodiments. In the embodiments, the descriptions to the same components and features as in the above embodiments of FIGS. 1, 2A to 2D, 3A and 3B will be omitted and differences between the embodiments and the above embodiments of FIGS. 1, 2A to 2D, 3A and 3B will be mainly described for the purpose of ease and convenience in explanation.

Referring to FIGS. 1, 19A and 19B, the first liner LIN1 may include cobalt (Co). Each of the second liner LIN2, the third liner LIN3 and the fourth liner LIN4 may include the ruthenium cobalt (RuCo) compound. An upper portion of the third conductive pattern FM3 and an upper portion of the first liner LIN1 may be recessed to form the second recess region RSR2. An upper portion of the fourth conductive pattern FM4 and an upper portion of the second liner LIN2 may be recessed to define the first recess region RSR1. An upper portion of the fifth conductive pattern FM5 and an upper portion of the third liner LIN3 may be recessed to form the first recess region RSR1. An upper portion of the sixth conductive pattern FM6 and an upper portion of the fourth liner LIN4 may be recessed to form the first recess region RSR1. The second recess region RSR2 may be deeper than the first recess region RSR1.

Figure 20A:
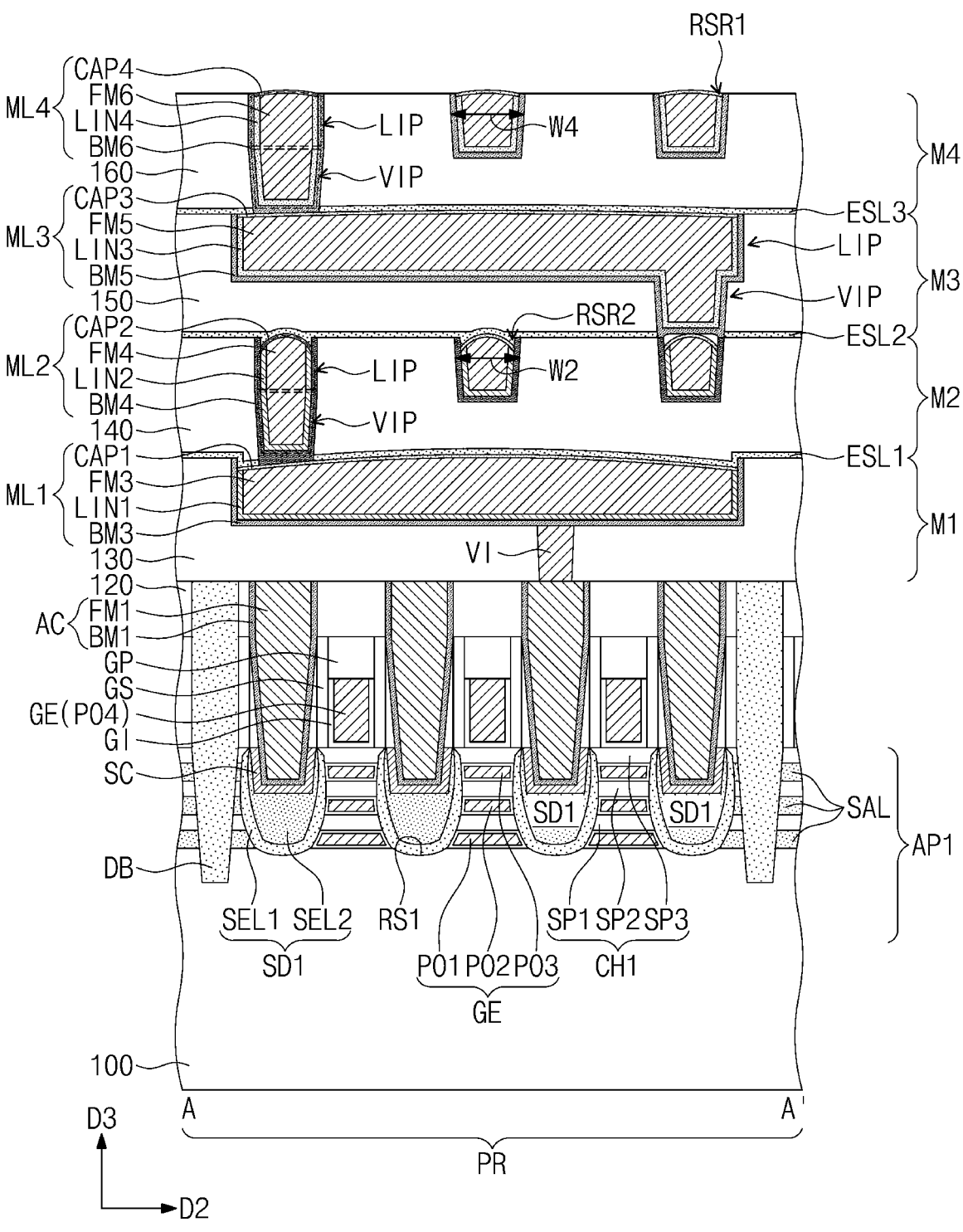
FIGS. 20A and 20B are cross-sectional views taken along the lines A-A' and C-C' of FIG. 1, respectively, to illustrate a semiconductor device according to some embodiments.
Figure 20B:
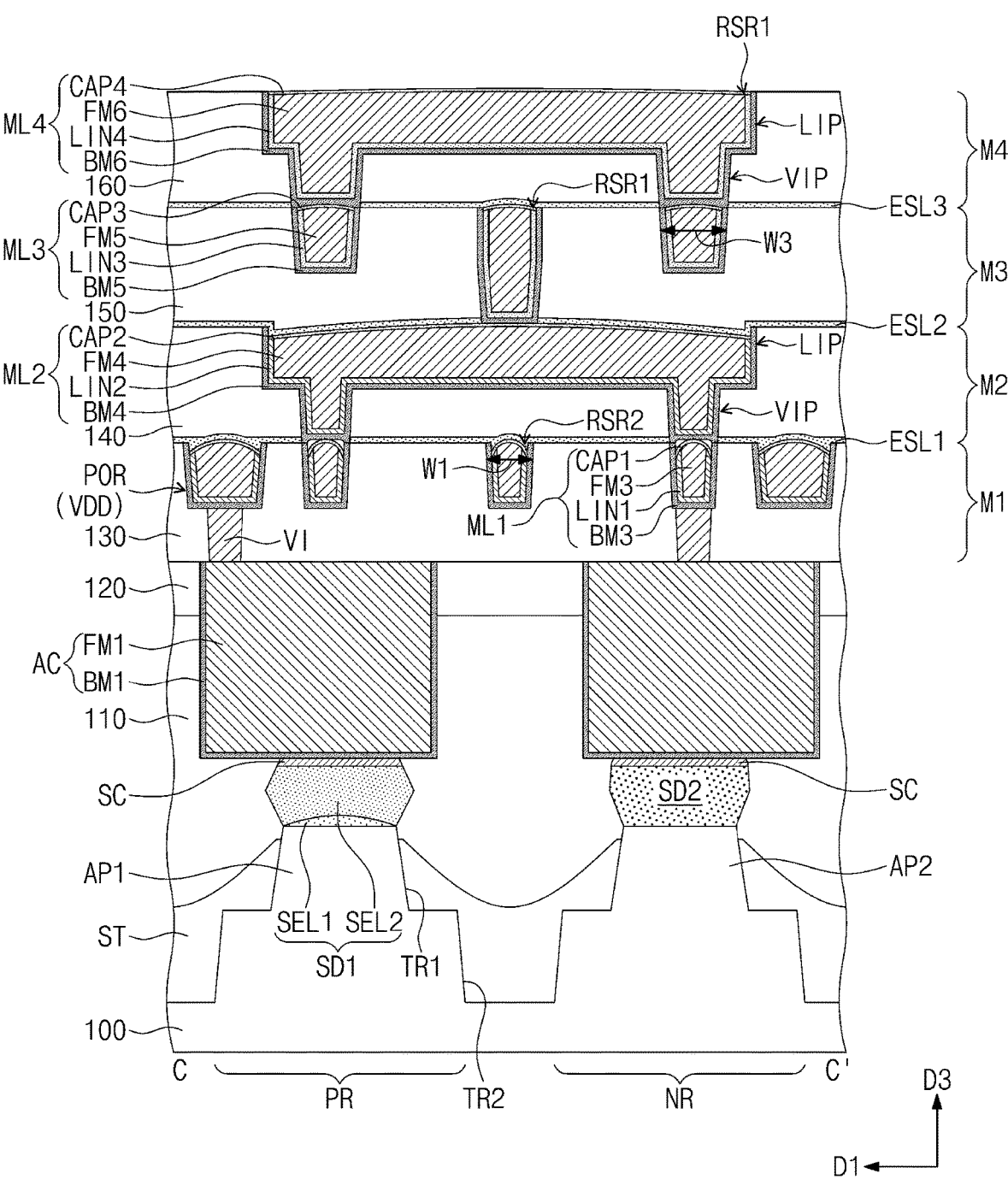

FIGS. 20A and 20B are cross-sectional views taken along the lines A-A' and C-C' of FIG. 1, respectively, to illustrate a semiconductor device according to some embodiments. In the embodiments, the descriptions to the same components and features as in the above embodiments of FIGS. 1, 2A to 2D, 3A and 3B will be omitted and differences between the embodiments and the above embodiments of FIGS. 1, 2A to 2D, 3A and 3B will be mainly described for the purpose of ease and convenience in explanation.

Referring to FIGS. 1, 20A and 20B, each of the first liner LIN1 and the second liner LIN2 may include cobalt (Co). Each of the third liner LIN3 and the fourth liner LIN4 may include the ruthenium cobalt (RuCo) compound. An upper portion of the third conductive pattern FM3 and an upper portion of the first liner LIN1 may be recessed to form the second recess region RSR2. An upper portion of the fourth conductive pattern FM4 and an upper portion of the second liner LIN2 may be recessed to form the second recess region RSR2. An upper portion of the fifth conductive pattern FM5 and an upper portion of the third liner LIN3 may be recessed to form the first recess region RSR1. An upper portion of the sixth conductive pattern FM6 and an upper portion of the fourth liner LIN4 may be recessed to form the first recess region RSR1. The second recess region RSR2 may be deeper than the first recess region RSR1.

Figure 21A:
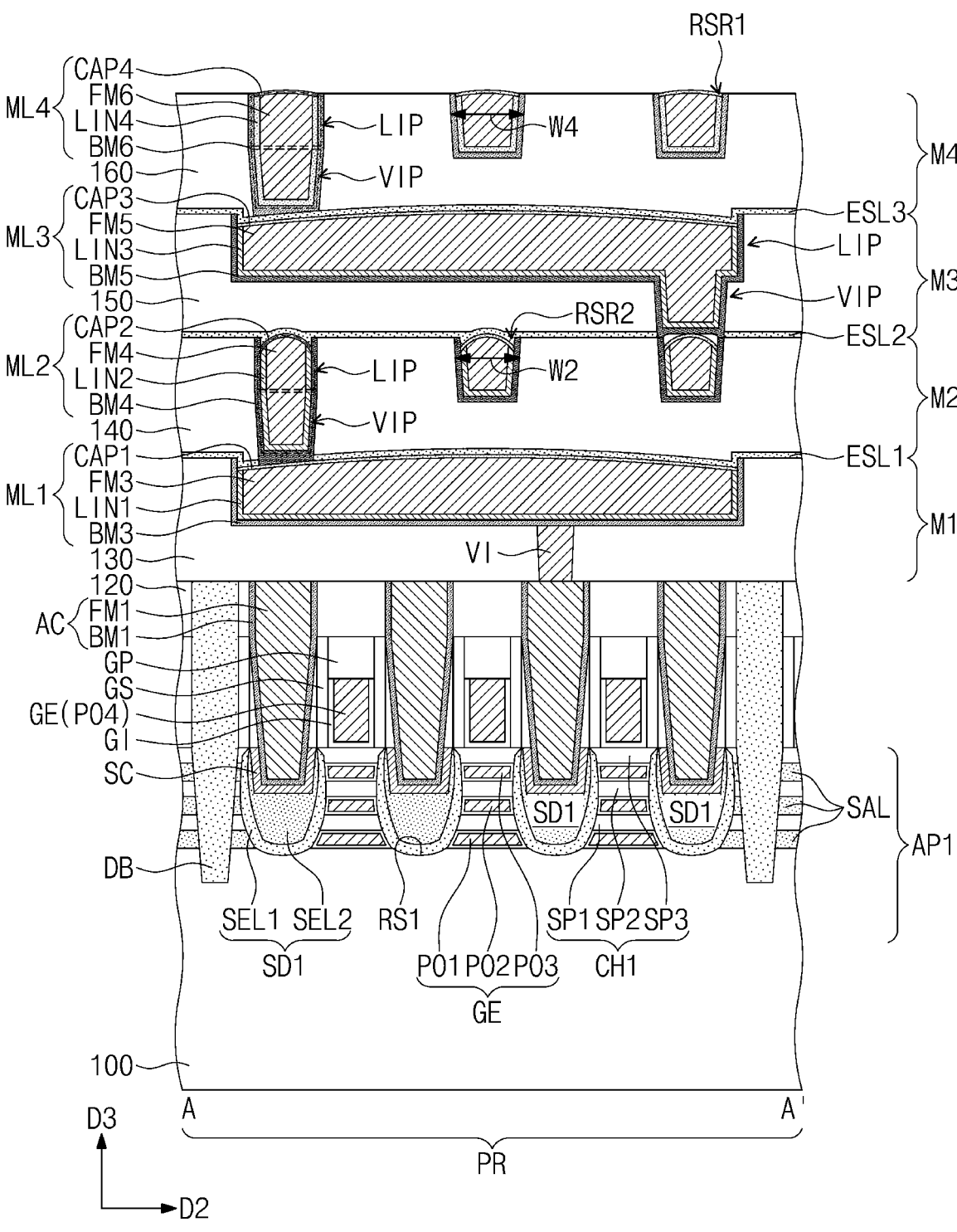
FIGS. 21A and 21B are cross-sectional views taken along the lines A-A' and C-C' of FIG. 1, respectively, to illustrate a semiconductor device according to some embodiments.
Figure 21B:
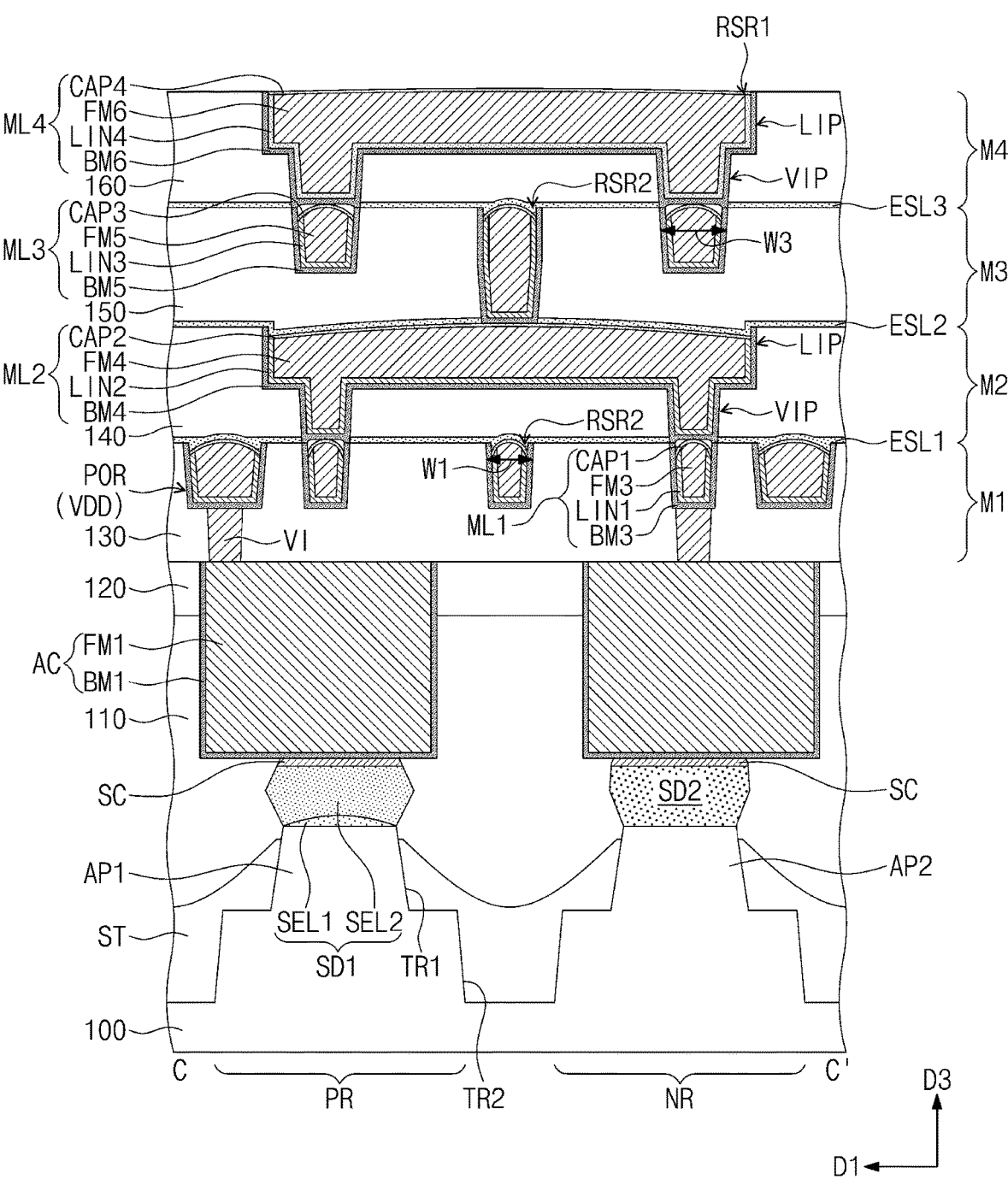

FIGS. 21A and 21B are cross-sectional views taken along the lines A-A' and C-C' of FIG. 1, respectively, to illustrate a semiconductor device according to some embodiments. In the embodiments, the descriptions to the same components and features as in the above embodiments of FIGS. 1, 2A to 2D, 3A and 3B will be omitted and differences between the embodiments and the above embodiments of FIGS. 1, 2A to 2D, 3A and 3B will be mainly described for the purpose of ease and convenience in explanation.

Referring to FIGS. 1, 21A and 21B, each of the first liner LIN1, the second liner LIN2 and the third liner LIN3 may include cobalt (Co). The fourth liner LIN4 may include the ruthenium cobalt (RuCo) compound. An upper portion of the third conductive pattern FM3 and an upper portion of the first liner LIN1 may be recessed to form the second recess region RSR2. An upper portion of the fourth conductive pattern FM4 and an upper portion of the second liner LIN2 may be recessed to form the second recess region RSR2. An upper portion of the fifth conductive pattern FM5 and an upper portion of the third liner LIN3 may be recessed to form the second recess region RSR2. An upper portion of the sixth conductive pattern FM6 and an upper portion of the fourth liner LIN4 may be recessed to form the first recess region RSR1. The second recess region RSR2 may be deeper than the first recess region RSR1.

Referring to FIGS. 16A to 21B, the liner including cobalt and the liner including the ruthenium cobalt compound may be selectively formed in the metal layers.

According to embodiments, the liner of the interconnection line may include the ruthenium cobalt compound. The liner may include the ruthenium element having better ability to prevent migration of a metal material (in particular, copper) than cobalt, and thus filling properties of the conductive pattern formed on the liner may be improved.

The liner including the ruthenium cobalt compound may be formed to have a thickness thinner than that of a liner including cobalt. Thus, a volume of the conductive pattern formed on the liner may be relatively increased.

In addition, the amount of ruthenium recessed in the planarization process may be less than the amount of cobalt recessed in the planarization process. Thus, the amount of the conductive pattern recessed in the planarization process may also be smaller in the case in which the liner including the ruthenium cobalt compound is used. Accordingly, the volume of the conductive pattern may be relatively increased to reduce a resistance of the interconnection line. Furthermore, since the depth of the recess region formed by the recessing of the conductive pattern and the liner is reduced, a void may not be formed between the interconnection lines. Thus, a delamination phenomenon between the interconnection lines may be prevented, and an electrical resistance between the interconnection lines may be reduced. As a result, electrical characteristics of the semiconductor device may be improved.

While embodiments have been described with reference to the figures, it will be understood by those of ordinary skill in the art that various changes in form and details may be made therein without departing from the spirit and scope as defined by the following claims and their equivalents.

What is claimed is:

1. A semiconductor device comprising:
a substrate comprising an active region;
transistors on the substrate;
a first interlayer insulating layer and a second interlayer insulating layer sequentially on the transistors;
a first interconnection line in an upper portion of the first interlayer insulating layer; and
a second interconnection line in the second interlayer insulating layer and electrically connected to the first interconnection line,
wherein the first interconnection line comprises:
a first barrier pattern;
a first liner on the first barrier pattern; and
a first conductive pattern on the first liner,
wherein the second interconnection line comprises:
a second barrier pattern;
a second liner on the second barrier pattern; and
a second conductive pattern on the second liner,
wherein the first liner includes a ruthenium cobalt (RuCo) compound, and the second liner includes cobalt (Co), and
wherein a first height between an uppermost point of a top surface of the first conductive pattern and a lowermost point of a portion of a top surface of the first liner, that is continuous with the top surface of the first conductive pattern, is less than a second height between an uppermost point of a top surface of the second conductive pattern and a lowermost point of a portion of a top surface of the second liner that is continuous with the top surface of the second conductive pattern, and
wherein the top surface of the first conductive pattern, the portion of the top surface of the first liner, the top surface of the second conductive pattern, and the portion of the top surface of the second liner are curved.

2. The semiconductor device of claim 1, wherein each of the transistors further comprises:
an active pattern on the active region,
a channel pattern on the active pattern, the channel pattern comprising semiconductor patterns stacked and spaced apart from each other; and
a gate electrode intersecting the channel pattern,
wherein the gate electrode is adjacent to each of the semiconductor patterns.

3. The semiconductor device of claim 1, wherein a ratio of the first height to a height of the first interconnection line ranges from 1% to 5%, and
wherein a ratio of the second height to a height of the second interconnection line ranges from 10% to 20%.

4. The semiconductor device of claim 1, wherein a first angle between a first central line crossing a center of the first interconnection line and a straight line connecting the uppermost point of the top surface of the first conductive pattern and the lowermost point of the top surface of the first liner is greater than a second angle between a second central line crossing a center of the second interconnection line and a straight line connecting the uppermost point of the top surface of the second conductive pattern and the lowermost point of the top surface of the second liner.

5. The semiconductor device of claim 1, wherein the first conductive pattern comprises first grains,
wherein the second conductive pattern comprises second grains, and
wherein an average size of the first grains is greater than an average size of the second grains.

6. The semiconductor device of claim 1, wherein the first interconnection line further comprises a first capping pattern on the top surface of the first conductive pattern and the top surface of the first liner, and
wherein the first capping pattern has a curved shape.

7. The semiconductor device of claim 1, wherein the second interconnection line comprises:
a line portion extending in a first direction in an upper portion of the second interlayer insulating layer; and
a via portion extending from the line portion toward the first interconnection line.

8. The semiconductor device of claim 7, wherein a width of the via portion in the first direction is greater than a width of the first interconnection line in the first direction.

9. The semiconductor device of claim 1, wherein a curvature of the top surface of the first conductive pattern is less than a curvature of the top surface of the second conductive pattern.

10. The semiconductor device of claim 1, further comprising:
a third interlayer insulating layer between the first interlayer insulating layer and the second interlayer insulating layer; and
a third interconnection line in the third interlayer insulating layer and electrically connected to the first interconnection line,
wherein the third interconnection line comprises:
a third barrier pattern;
a third liner on the third barrier pattern; and
a third conductive pattern on the third liner, and
wherein the third liner includes a ruthenium cobalt compound.

11. A semiconductor device comprising:
a substrate;
transistors on the substrate;
a first interlayer insulating layer on the transistors; and
a first metal layer in the first interlayer insulating layer,
wherein the first metal layer comprises a first interconnection line in an upper portion of the first interlayer insulating layer,
wherein the first interconnection line comprises:
a first barrier pattern;
a first liner on an inner surface of the first barrier pattern;
a first conductive pattern on the first liner; and
a first capping pattern on a top surface of the first conductive pattern and on a top surface of the first liner,
wherein the first liner includes a ruthenium cobalt (RuCo) compound,
wherein the top surface of the first liner is at a lower level than a top surface of the first barrier pattern, and
wherein a ratio of a first height between an uppermost point of the top surface of the first conductive pattern and a lowermost point of the top surface of the first liner to a height of the first interconnection line ranges from 1% to 5%.

12. The semiconductor device of claim 11, further comprising:

a second interlayer insulating layer on the first interlayer insulating layer; and a second interconnection line in the second interlayer insulating layer and electrically connected to the first interconnection line, wherein the second interconnection line comprises:

a second barrier pattern;

a second liner on the second barrier pattern; and a second conductive pattern on the second liner.

13. The semiconductor device of claim 12, wherein the first height is less than a second height between an uppermost point of a top surface of the second conductive pattern and a lowermost point of a top surface of the second liner, and wherein the second liner includes cobalt.

14. The semiconductor device of claim 12, wherein the second liner includes a ruthenium cobalt compound.

15. The semiconductor device of claim 11, wherein the first metal layer further comprises a power interconnection line in an upper portion of the first interlayer insulating layer and spaced apart from the first interconnection line.

16. A semiconductor device comprising:

a substrate comprising an active region;

a device isolation layer forming an active pattern on the active region;

a source pattern and a drain pattern on the active pattern;

a channel pattern connected to the source pattern and the drain pattern on the active pattern, the channel pattern comprising a first semiconductor pattern, a second semiconductor pattern and a third semiconductor pattern sequentially stacked and spaced apart from each other;

a gate electrode intersecting the channel pattern and extending in a first direction;

a gate insulating layer between the channel pattern and the gate electrode;

a gate spacer on a sidewall of the gate electrode;

a gate capping pattern on a top surface of the gate electrode;

a first interlayer insulating layer on the gate capping pattern;

an active contact penetrating the first interlayer insulating layer and connected to the source pattern and the drain pattern;

a gate contact penetrating the first interlayer insulating layer and the gate capping pattern and connected to the gate electrode;

a second interlayer insulating layer on the first interlayer insulating layer;

a first metal layer provided in the second interlayer insulating layer, the first metal layer comprising a first interconnection line electrically connected to at least one of the active contact or the gate contact;

a third interlayer insulating layer on the second interlayer insulating layer; and a second metal layer in the third interlayer insulating layer, wherein the second metal layer comprises a second interconnection line electrically connected to the first metal layer, wherein the first interconnection line comprises:

a first barrier pattern;

a first liner on the first barrier pattern; and a first conductive pattern on the first liner, wherein the second interconnection line comprises:

a second barrier pattern;

a second liner on the second barrier pattern; and a second conductive pattern on the second liner, wherein the first liner includes a ruthenium cobalt (RuCo) compound, and the second liner includes cobalt (Co), and wherein a first height between an uppermost point of a top surface of the first conductive pattern and a lowermost point of a top surface of the first liner is less than a second height between an uppermost point of a top surface of the second conductive pattern and a lowermost point of a top surface of the second liner.

17. The semiconductor device of claim 16, further comprising:

a fourth interlayer insulating layer on the third interlayer insulating layer;

a third metal layer in the fourth interlayer insulating layer, the third metal layer comprising a third interconnection line electrically connected to the second metal layer;

a fifth interlayer insulating layer on the fourth interlayer insulating layer; and a fourth metal layer in the fifth interlayer insulating layer, wherein the fourth metal layer comprises a fourth interconnection line electrically connected to the third metal layer, wherein the third interconnection line comprises:

a third barrier pattern;

a third liner on the third barrier pattern; and a third conductive pattern on the third liner, and wherein the fourth interconnection line comprises:

a fourth barrier pattern;

a fourth liner on the fourth barrier pattern; and a fourth conductive pattern on the fourth liner.

18. The semiconductor device of claim 17, wherein each of the third liner and the fourth liner includes cobalt.

19. The semiconductor device of claim 16, wherein a width of the second interconnection line in the first direction is greater than a width of the first interconnection line in a second direction intersecting the first direction.

20. The semiconductor device of claim 16, further comprising:

an etch stop layer between the second interlayer insulating layer and the third interlayer insulating layer.

* * * * *